United States Patent
Hosek et al.

(10) Patent No.: US 10,580,682 B2
(45) Date of Patent: Mar. 3, 2020

(54) MATERIAL-HANDLING ROBOT WITH MULTIPLE END-EFFECTORS

(71) Applicant: Persimmon Technologies, Corp., Wakefield, MA (US)

(72) Inventors: Martin Hosek, Lowell, MA (US); Scott Wilkas, Lexington, MA (US); Jacob Lipcon, Arlington, MA (US)

(73) Assignee: Persimmon Technologies, Corp., Wakefield, MA (US)

( * ) Notice: Subject to any disclaimer, the term of this patent is extended or adjusted under 35 U.S.C. 154(b) by 0 days.

(21) Appl. No.: 15/897,374

(22) Filed: Feb. 15, 2018

(65) Prior Publication Data

US 2018/0233397 A1    Aug. 16, 2018

Related U.S. Application Data

(60) Provisional application No. 62/459,135, filed on Feb. 15, 2017.

(51) Int. Cl.

| | |
|---|---|
| *H01L 21/67* | (2006.01) |
| *H01L 21/687* | (2006.01) |
| *B25J 9/04* | (2006.01) |
| *B25J 11/00* | (2006.01) |
| *B25J 17/02* | (2006.01) |
| *B25J 9/10* | (2006.01) |
| *H01L 21/677* | (2006.01) |

(Continued)

(52) U.S. Cl.
CPC ...... *H01L 21/68707* (2013.01); *B25J 9/0021* (2013.01); *B25J 9/0084* (2013.01); *B25J 9/042* (2013.01); *B25J 9/043* (2013.01); *B25J 9/046* (2013.01); *B25J 9/104* (2013.01); *B25J 9/1664* (2013.01); *B25J 11/0095* (2013.01); *B25J 17/02* (2013.01); *H01L 21/67742* (2013.01); *H01L 21/67766* (2013.01); *Y10S 901/02* (2013.01); *Y10S 901/15* (2013.01); *Y10S 901/16* (2013.01); *Y10S 901/19* (2013.01); *Y10S 901/29* (2013.01); *Y10S 901/30* (2013.01)

(58) Field of Classification Search
CPC .......................... H01L 21/68707; B25J 9/043
See application file for complete search history.

(56) References Cited

U.S. PATENT DOCUMENTS

| | | |
|---|---|---|
| 6,547,510 B1 | 4/2003 | Beaulieu |
| 6,643,563 B2 | 11/2003 | Hosek et al. ............... 700/245 |
| 9,149,936 B2 | 10/2015 | Hosek et al. |

(Continued)

FOREIGN PATENT DOCUMENTS

WO   WO-2016127160 A1   8/2016

*Primary Examiner* — Ronald P Jarrett
(74) *Attorney, Agent, or Firm* — Harrington & Smith

(57) ABSTRACT

An apparatus including a robot drive having motors and coaxial drive shafts connected to the motors; and a robot arm connected to the robot drive. The robot arm includes two upper arms, a first set of forearms connected to a first one of the upper arms, a second set of forearms connected to a second one of the upper arms and end effectors connected to respective ones of the forearms. The first and second upper arms are connected to respective first and second ones of the coaxial drive shafts. The first set of the forearms is mounted on the first upper arm and connected to a third one of the coaxial drive shafts by respective first and second drive belt assemblies. The second set of the forearms is mounted to the second upper arm and connected to a fourth one of the coaxial drive shafts by respective third and fourth drive belt assemblies.

20 Claims, 54 Drawing Sheets

(51) Int. Cl.
  *B25J 9/00* (2006.01)
  *B25J 9/16* (2006.01)

(56) References Cited

U.S. PATENT DOCUMENTS

| | | |
|---|---|---|
| 2001/0033788 A1 | 10/2001 | Pietrantonio |
| 2003/0223853 A1 | 12/2003 | Caveney et al. |
| 2016/0064263 A1 | 3/2016 | Hosek et al. |
| 2016/0167229 A1 | 6/2016 | Hosek |
| 2017/0028546 A1 | 2/2017 | Wilkas et al. |

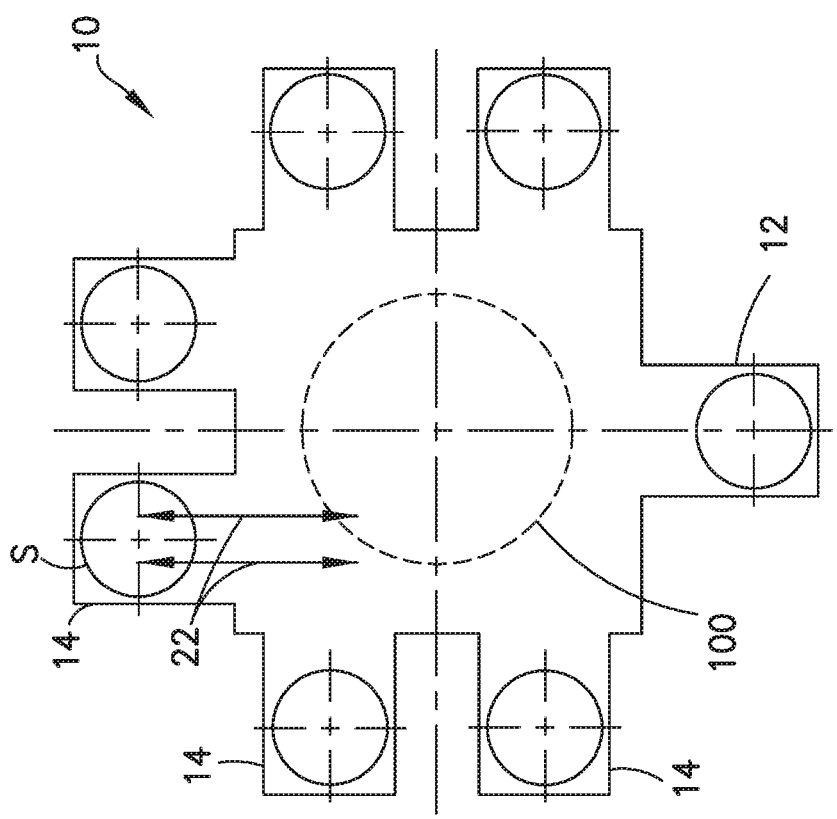
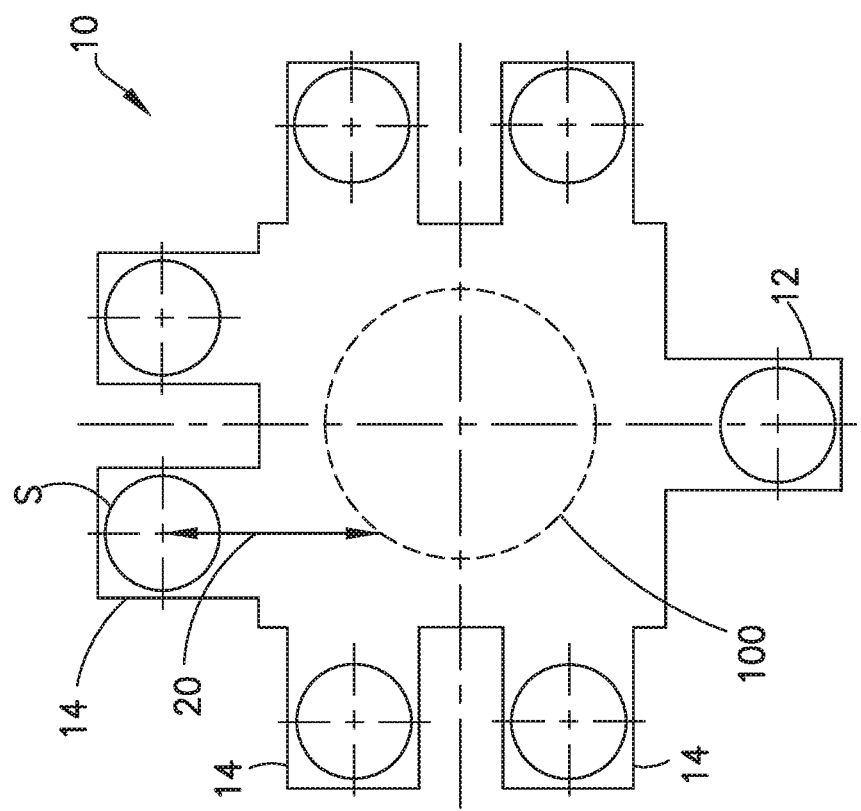

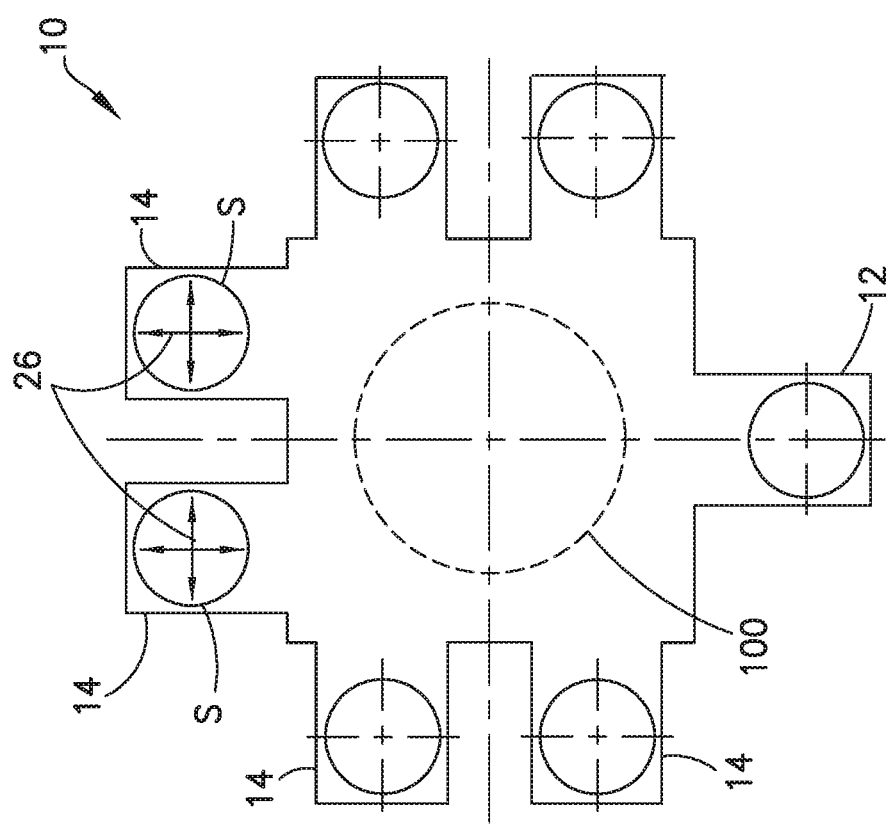
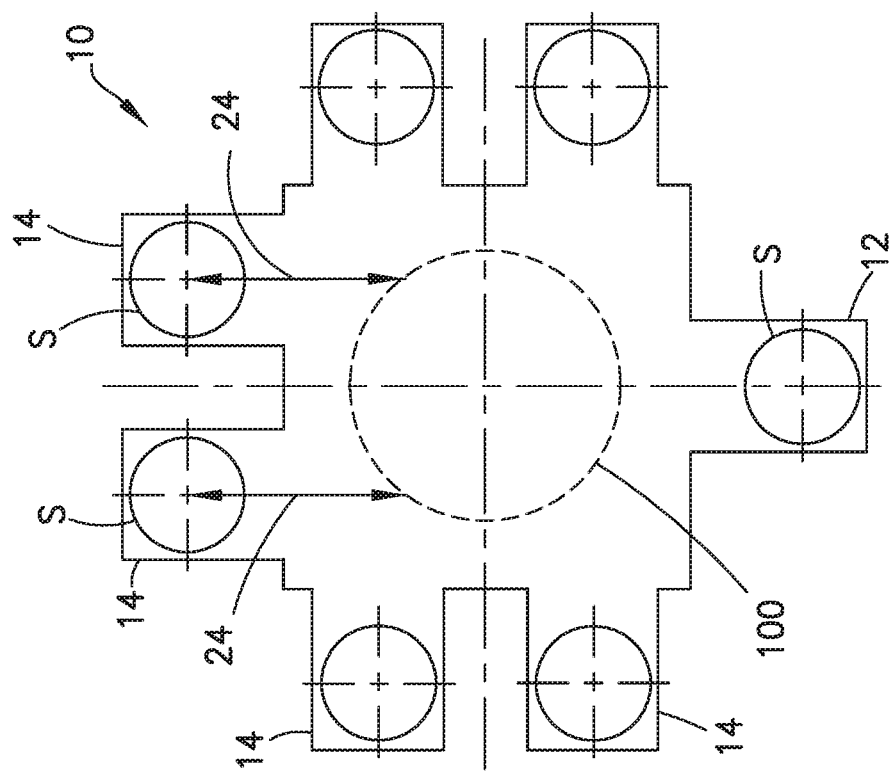

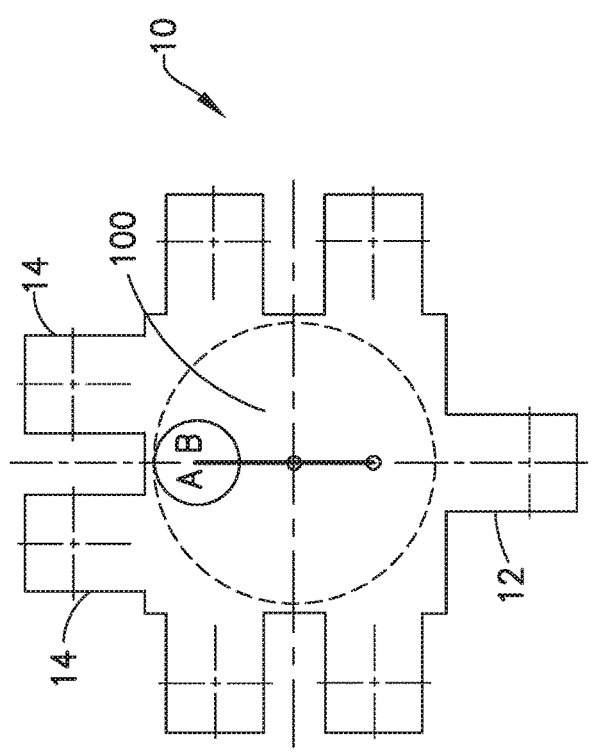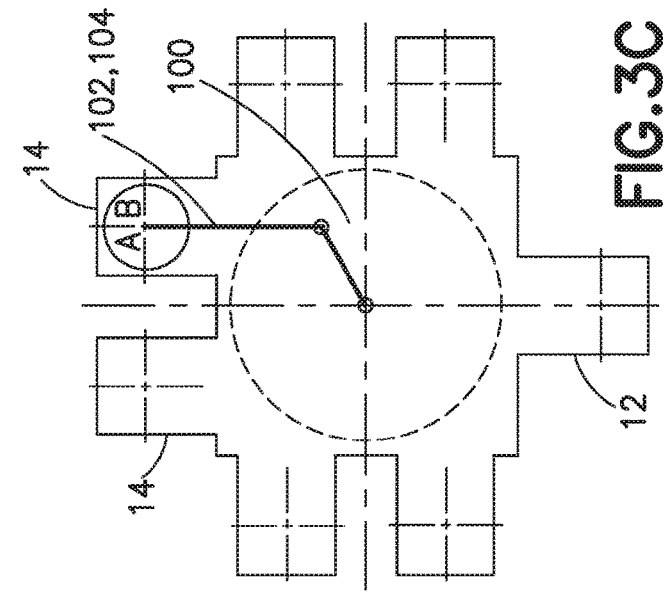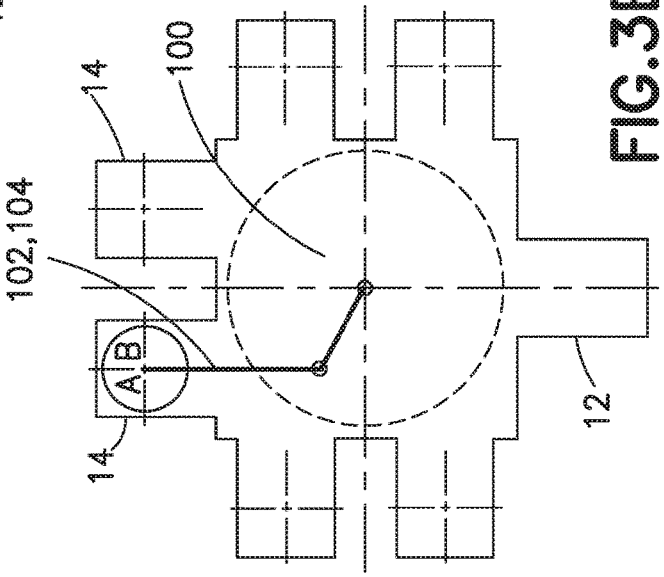

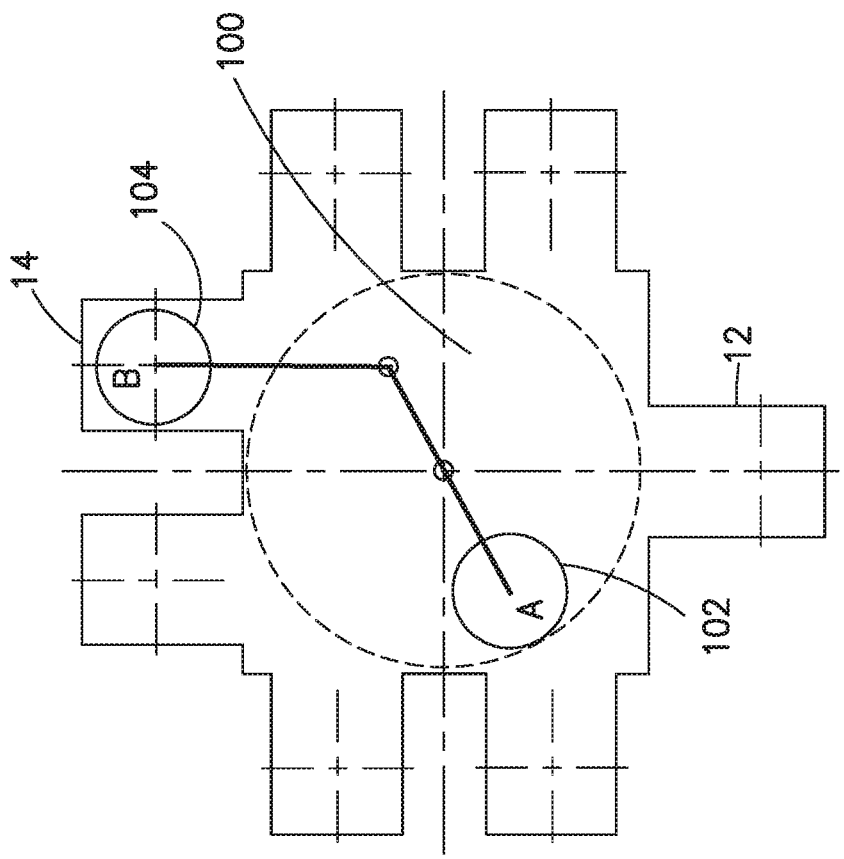
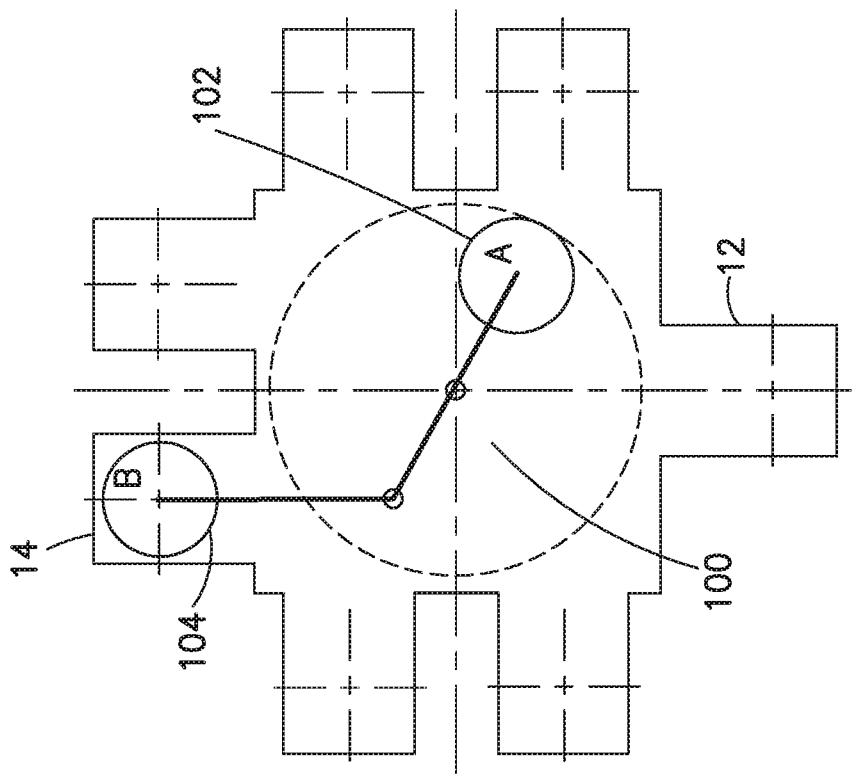
FIG. 3G
FIG. 3F

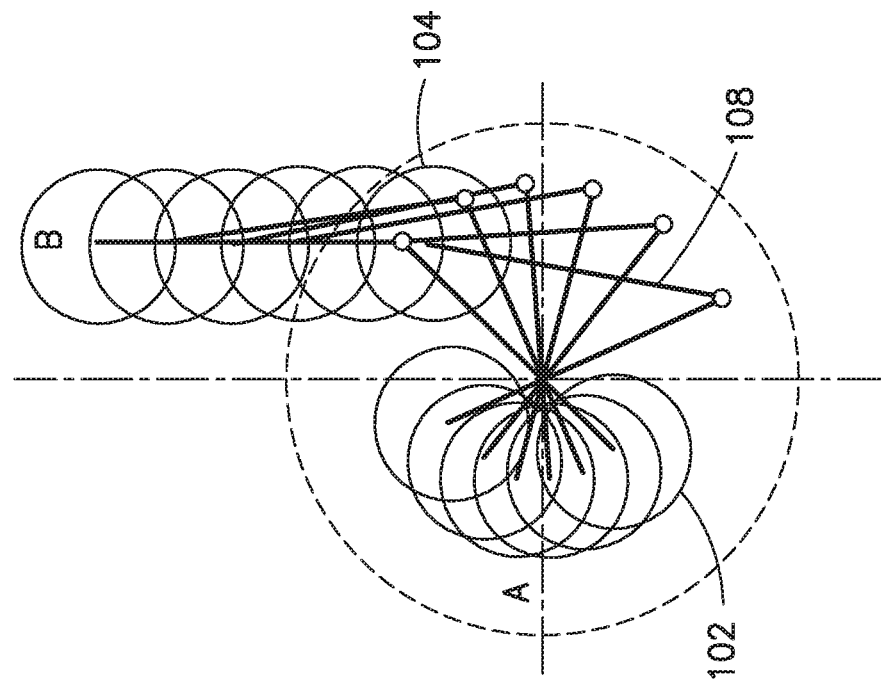
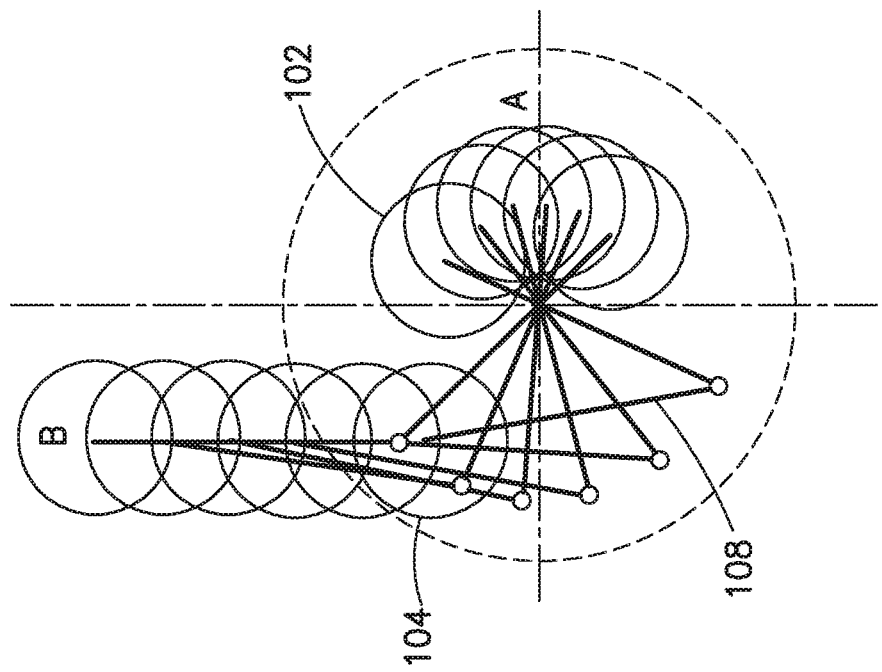

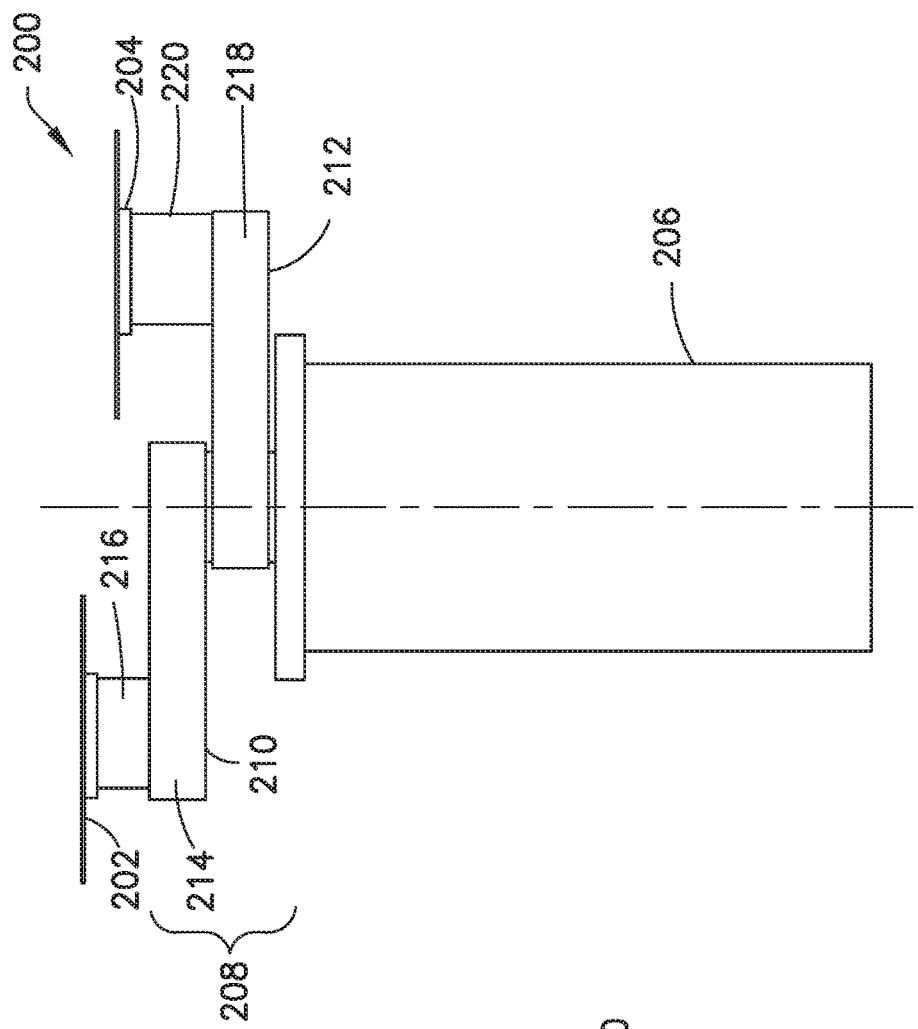
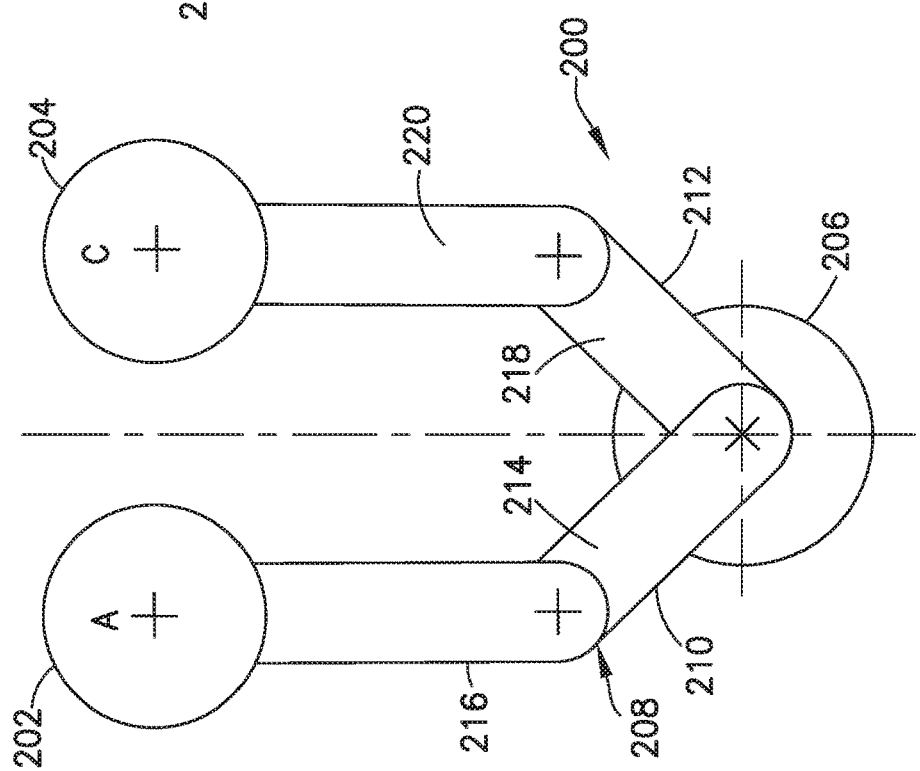
FIG. 4B
FIG. 4A

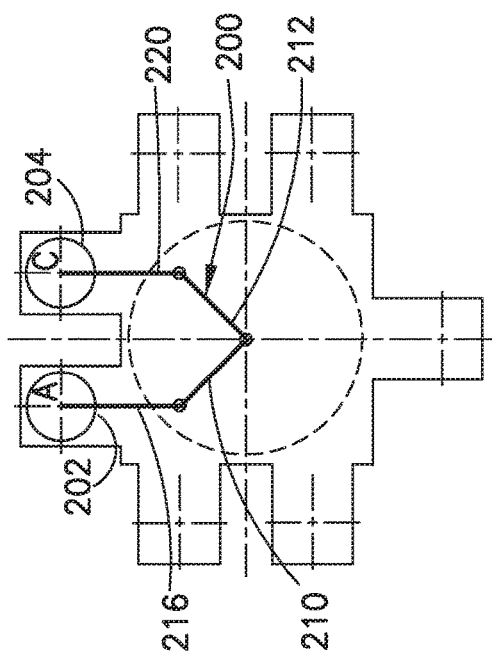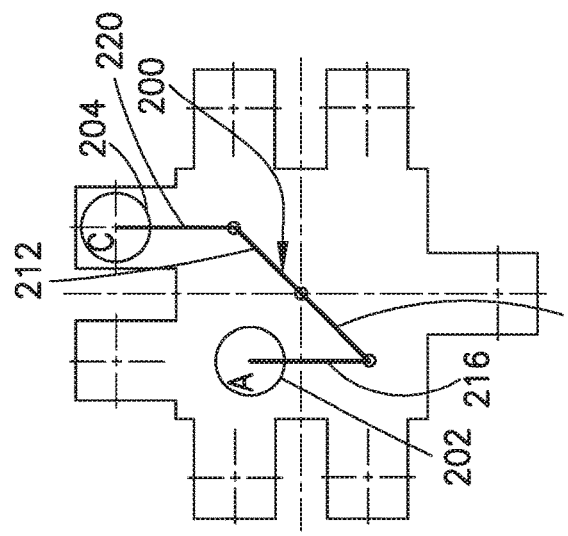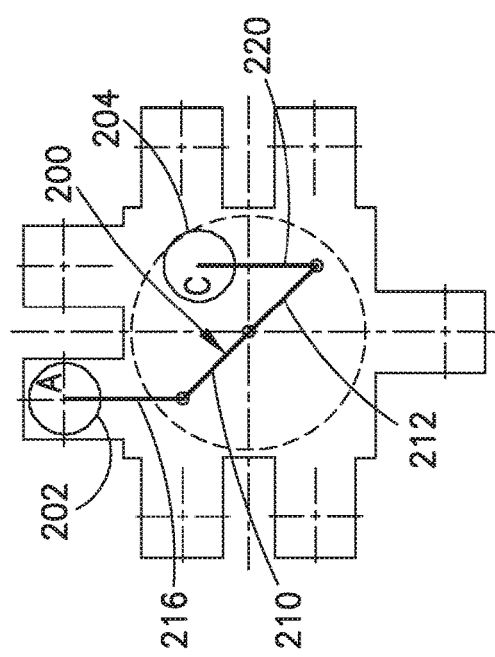

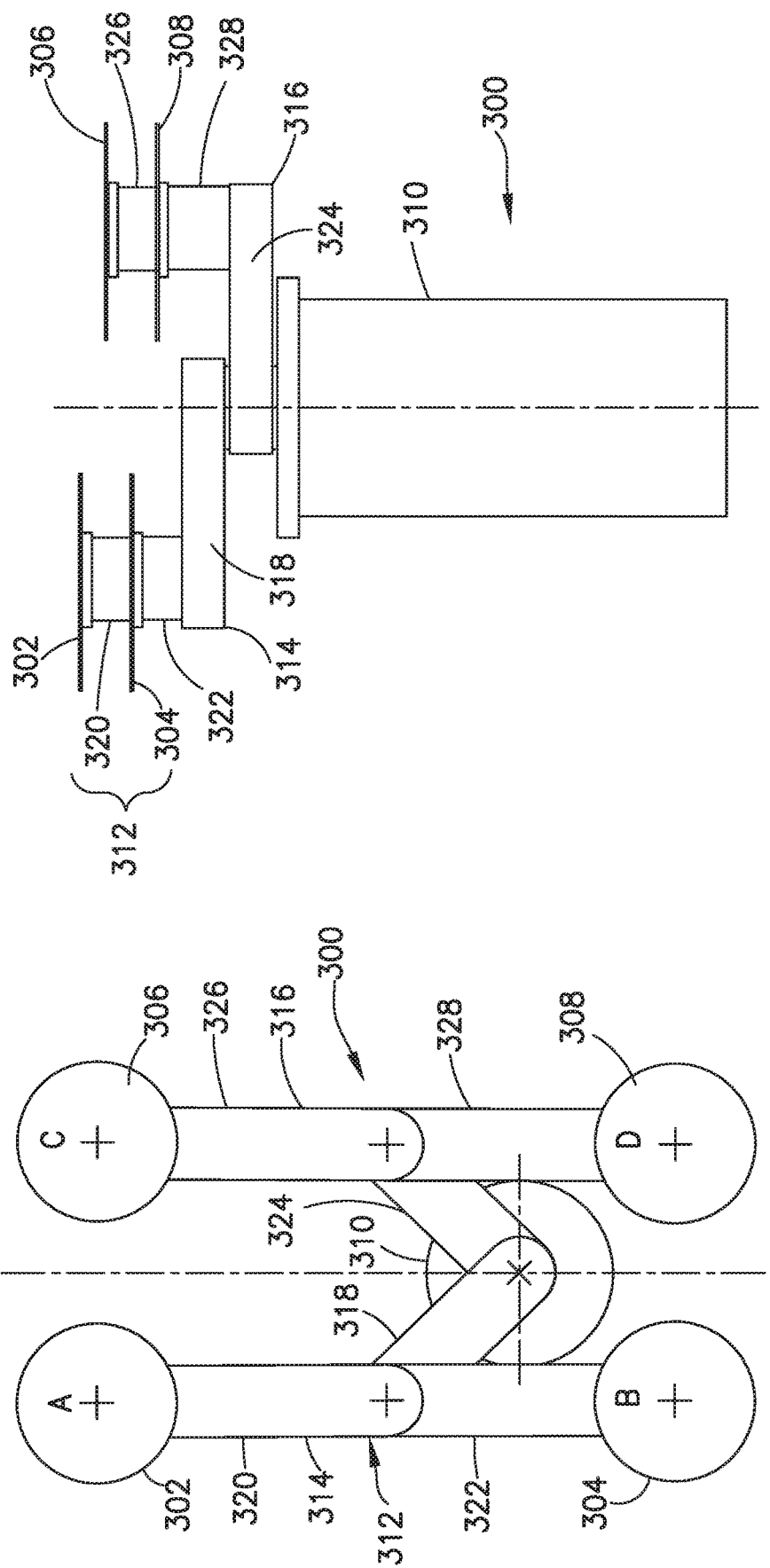

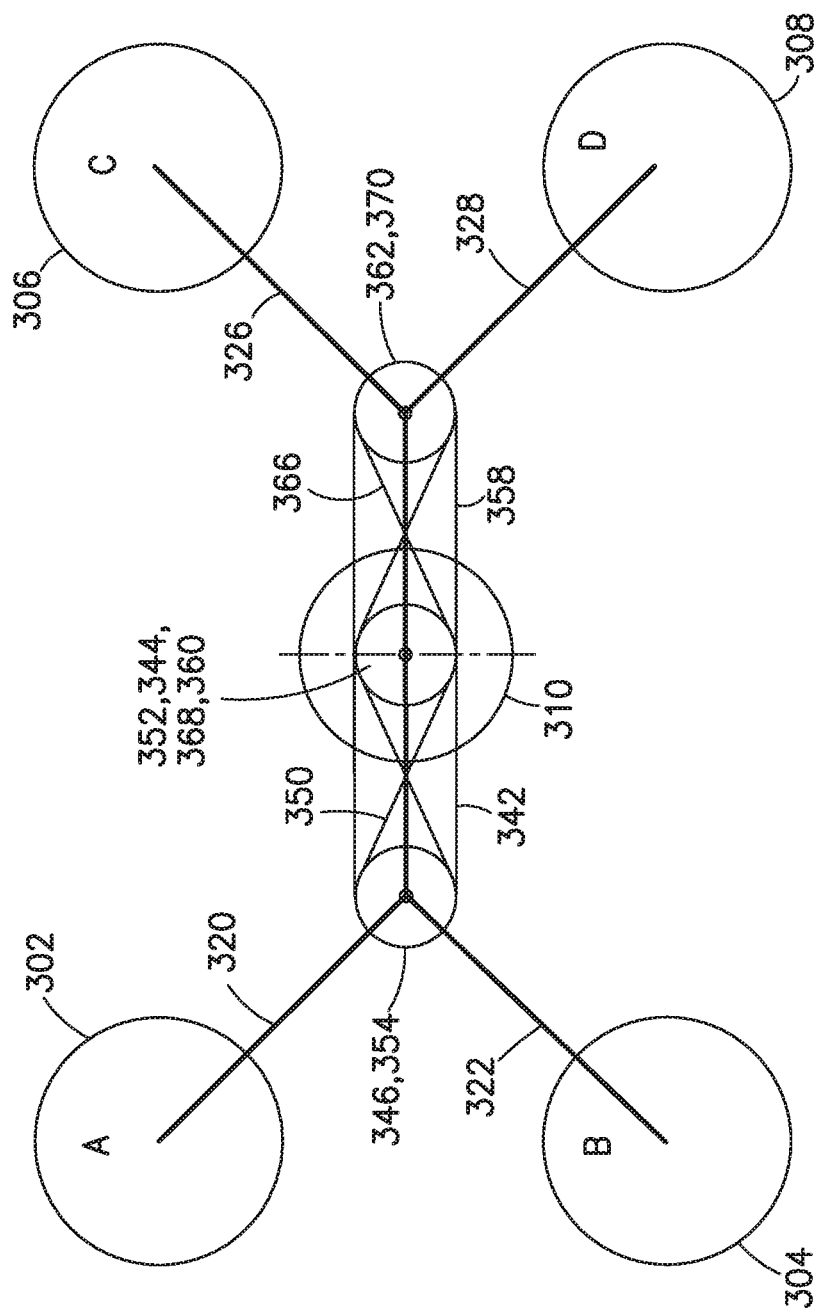

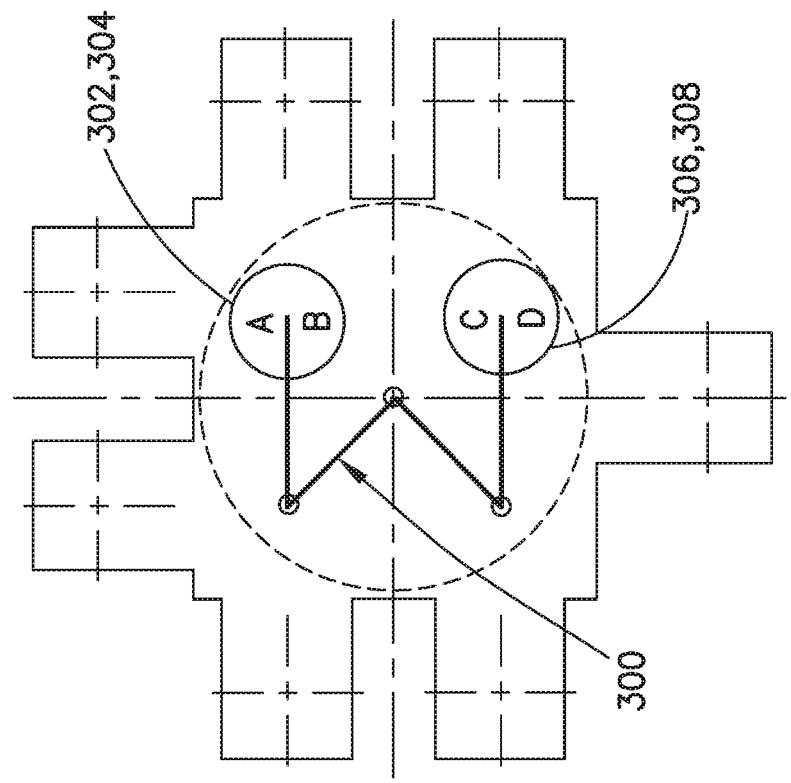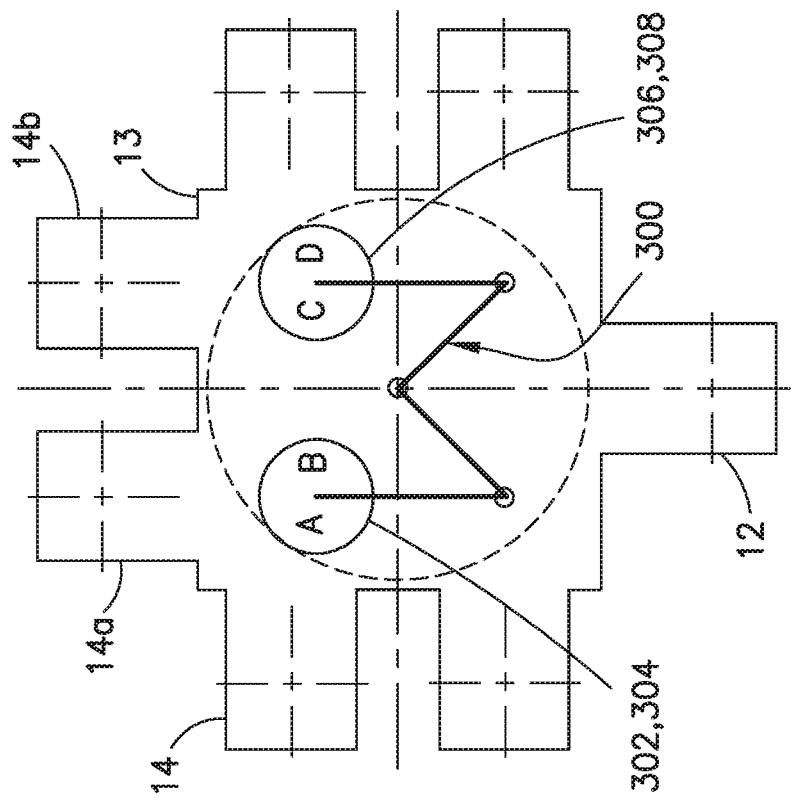
FIG. 7B
FIG. 7A

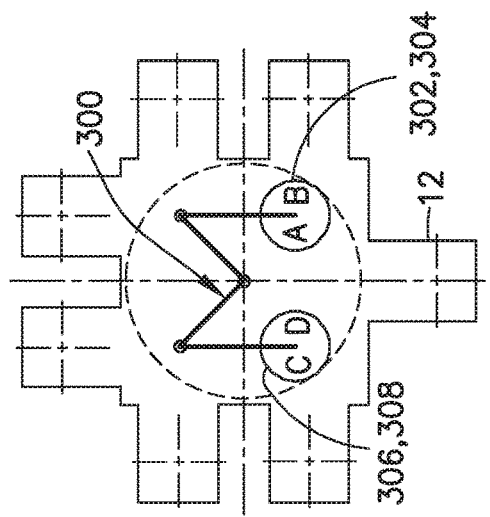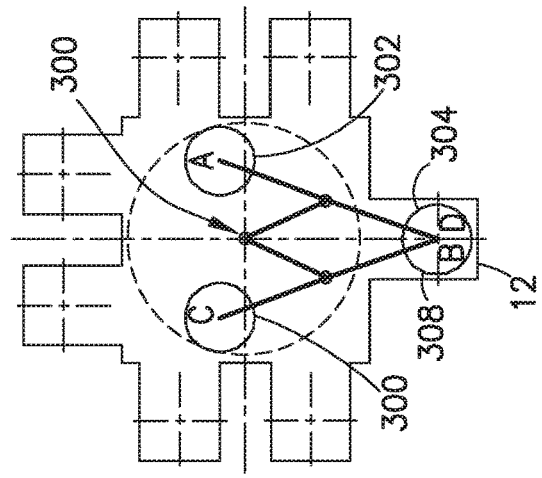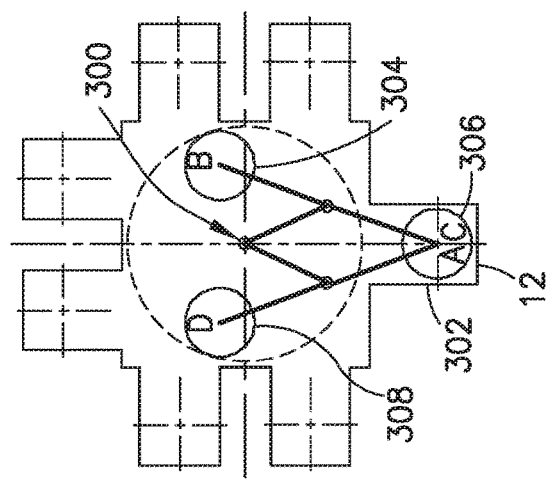

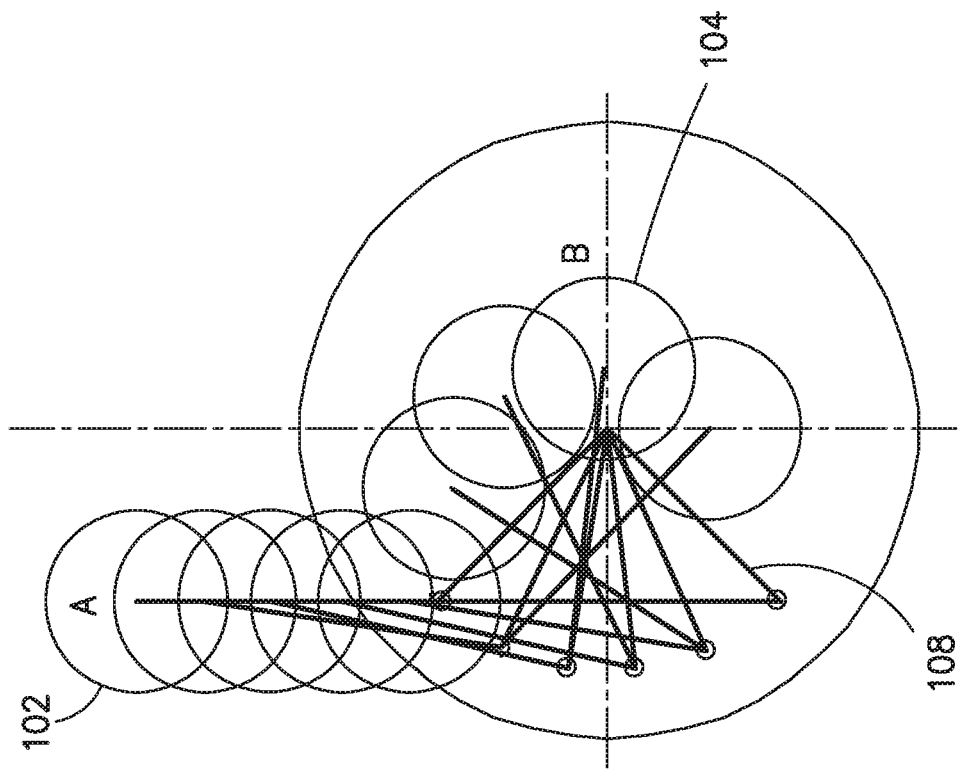
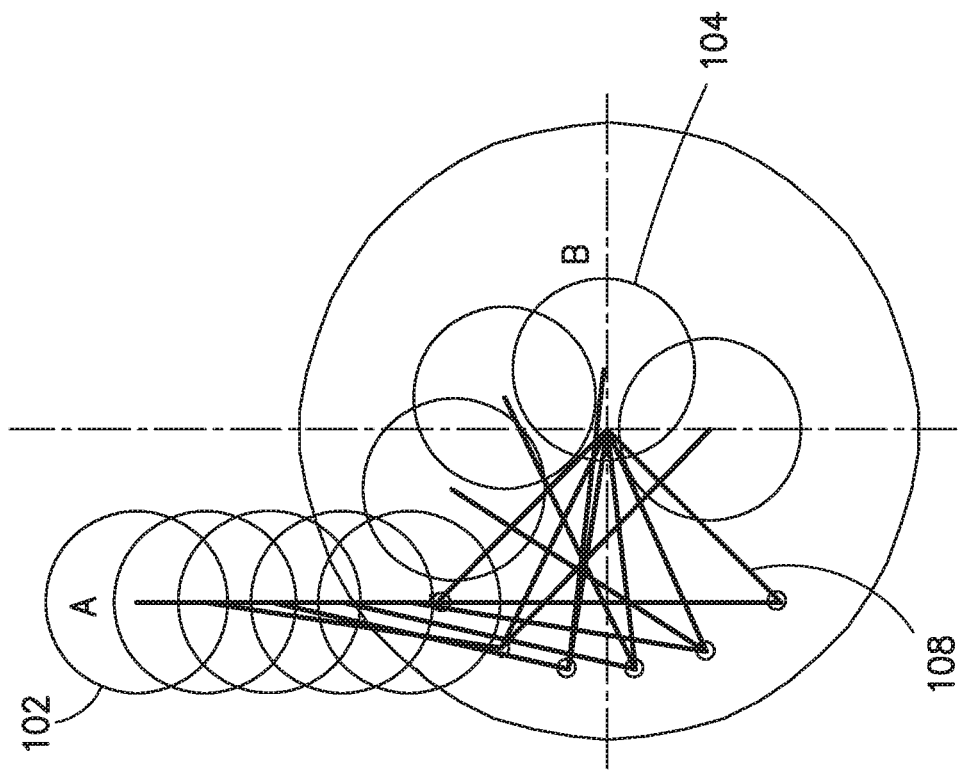
FIG. 12A
FIG. 12B

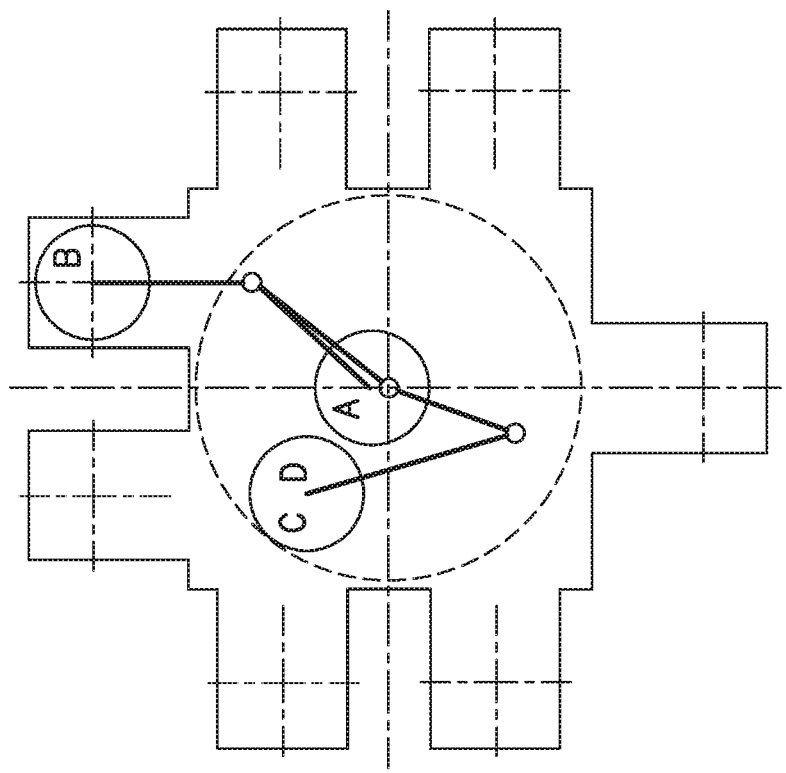
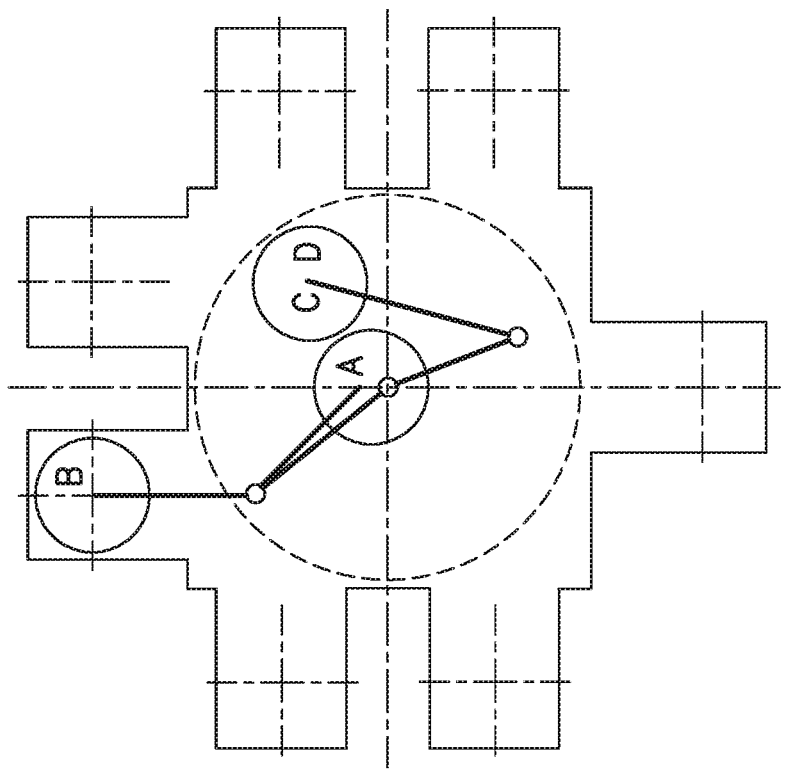

MATERIAL-HANDLING ROBOT WITH MULTIPLE END-EFFECTORS

CROSS REFERENCE TO RELATED APPLICATION

This application claims priority under 35 USC 119(e) to provisional patent application No. 62/459,135 filed Feb. 15, 2017 which is hereby incorporated by reference in its entirety.

BACKGROUND

Technical Field

The exemplary and non-limiting embodiments relate generally to a material handling robot and, more particularly, to a material-handling robot having multiple end-effectors.

Brief Description of Prior Developments

Material-handling robots, such as for applications in semiconductor wafer processing systems for example, are known. Some examples may be found in the following U.S. patents and patent publications (which are hereby incorporated by reference in their entireties): U.S. Pat. No. 9,149,936 which discloses how non-circular pulleys may be calculated; U.S. Patent Publication No. US 2016/0167229 A1; and U.S. Patent Publication No. US 2017/0028546 A1.

SUMMARY

The following summary is merely intended to be exemplary. The summary is not intended to limit the scope of the claims.

In accordance with one aspect, an example is provided in an apparatus comprising a robot drive comprising motors and coaxial drive shafts connected to the motors; a robot arm connected to the robot drive, where the robot arm comprises two upper arms, a first set of forearms connected to a first one of the upper arms, a second set of forearms connected to a second one of the upper arms and end effectors connected to respective ones of the forearms, where the first and second upper arms are connected to respective first and second ones of the coaxial drive shafts, where the first set of the forearms is mounted on the first upper arm and connected to a third one of the coaxial drive shafts by respective first and second drive belt assemblies, where the second set of the forearms is mounted to the second upper arm and connected to a fourth one of the coaxial drive shafts by respective third and fourth drive belt assemblies.

In accordance with another aspect, an example method comprises connecting a first upper arm to a first coaxial drive shaft of a robot drive; connecting a second upper arm to a second coaxial drive shaft of the robot drive; connecting a first set of forearms to the first upper arm, where a first drive belt arrangement connects a first one of the forearms of the first set of forearms to a third coaxial drive shaft of the robot drive, and where a second drive belt arrangement connects a second one of the forearms of the first set of forearms to the third coaxial drive shaft of the robot drive; connecting a second set of forearms to the second upper arm, where a third drive belt arrangement connects a first one of the forearms of the second set of forearms to a fourth coaxial drive shaft of the robot drive, and where a fourth drive belt arrangement connects a second one of the forearms of the second set of forearms to the fourth coaxial drive shaft of the robot drive; and connecting respective end effectors to the forearms.

In accordance with another aspect, an example method comprises rotating a first coaxial drive shaft of a robot drive about a first axis in a first direction to rotate a first upper arm of a robot arm about the first axis; rotating a second coaxial drive shaft of the robot drive about the first axis, while the first coaxial drive shaft is being rotated, to move a first drive belt arrangement and a second drive belt arrangement and thereby rotate first and second forearms on the first upper arm; rotating a third coaxial drive shaft of the robot drive about the first axis in a second direction to rotate a second upper arm of a robot arm about the first axis; and rotating a forth coaxial drive shaft of the robot drive about the first axis to move a third drive belt arrangement and a fourth drive belt arrangement and thereby rotate third and fourth forearms on the second upper arm.

In accordance with another aspect, an example method may comprises rotating a first coaxial drive shaft of a robot drive about a first axis in a first direction to rotate at least one upper arm of a robot arm about the first axis; rotating a second coaxial drive shaft of the robot drive about the first axis, while the first coaxial drive shaft is being rotated, to move at least a first drive belt arrangement to rotate a first forearm on the at least one upper arm and extend a first end effector on the first forearm from a retracted position towards an extended position; and rotating a third coaxial drive shaft of the robot drive about the first axis in a second direction to move at least a second drive belt arrangement to rotate a second forearm on the at least one upper arm and retain a-second end effector on the second forearm at a retracted position while the first end effector is moved from the retracted position towards the extended position.

In accordance with another aspect, an example method comprises, based upon a desired path of a reference point from a start position of the reference point to an end position of the reference point, where the reference point is on an end effector on a robot arm, determine an included angle that corresponds to the start position and that corresponds to the end position, where the robot arm is connected to a robot drive having motors for moving the robot arm; calculating a trajectory in radial coordinates of the reference point on the end effector at least partially based upon the included angles; calculating corresponding angular coordinates of the reference point on the end effector, based on the calculated radial coordinates, so that the reference point on the end effector follows the desired path between the start position and the end position; using a modified formulation of inverse kinematics, converting the radial and angular coordinates of the reference point on the end effector supplemented with the included angles of the trajectory and corresponding angular velocity and acceleration of the end effector into desired joint positions, velocities, and accelerations to form motion setpoints for the robot arm; and controlling the motors of the robot drive to move the robot arm based upon the motion setpoints.

In accordance with another aspect, an example method comprises determining by a controller a path of a reference point on an end effector of a robot arm between a start position and an end position of the reference point, where the robot arm is connected to a robot drive having motors for moving the robot arm, and where the controller comprises at least one processor and at least one non-transitory memory having computer code; the controller selecting a movement control mode from a plurality of different movement control modes, where the different movement control modes comprise: determining that the path between the start position and the end position intersects a kinematic singularity of the robot arm, and not executing a move of the robot arm with the path, determining that the path between the start position and the end position passes outside a predetermined threshold distance from the kinematic singularity of the robot arm, and using a Cartesian trajectory generation scheme to move the robot arm, and determining that the path between the start position and the end position passes within the predetermined threshold distance from the kinematic singularity of the robot arm, determine an included angle that corresponds to the start position and that corresponds to the end position, calculate the start position and the end position in terms of joint coordinates, calculate a trajectory from the start position to the end position in radial coordinates at least partially based upon the included angles, calculate a corresponding angular coordinate of the reference point so that the reference point follows the path in Cartesian space between the start position and the end position; and the controller controlling movement of the motors of the robot arm based upon the selected control mode.

In accordance with another aspect, an example embodiment may be provided in an apparatus comprising at least one processor; and at least one non-transitory memory including computer program code, the at least one memory and the computer program code configured to, with the at least one processor, cause the apparatus to: determine by the at least one processor and the computer program code a path of a reference point on an end effector of a robot arm between a start position of the reference point and an end position of the reference point with trajectory, where the robot arm is connected to a robot drive having motors for moving the robot arm; select by the at least one processor and the computer program code a movement control mode from a plurality of different movement control modes, where the plurality of different movement control modes comprises: determining that the path between the start position and the end position intersects a kinematic singularity of the robot arm and not executing a move of the robot arm with the path, determining that the path between the start position and the end position passes outside a predetermined threshold distance from the kinematic singularity of the robot arm, and using a Cartesian trajectory generation scheme to move the robot arm, and determining that the path between the start position and the end position passes within the predetermined threshold distance from the kinematic singularity of the robot arm, determine an included angle that corresponds to the start position and that corresponds to the end position, and calculate the start position and the end position in terms of joint coordinates, calculate the trajectory of the reference point in radial coordinates at least partially based upon the included angles, calculate a corresponding angular coordinates of the reference point on the end effector so that the reference point follows the path in Cartesian space between the start position and the end position of the move.

BRIEF DESCRIPTION OF THE DRAWINGS

The foregoing aspects and other features are explained in the following description, taken in connection with the accompanying drawings, wherein:

FIGS. 1A-1F illustrate examples of substrate movements in a substrate processing apparatus comprising features as described herein.

DETAILED DESCRIPTION OF EMBODIMENTS

Figure 1B:
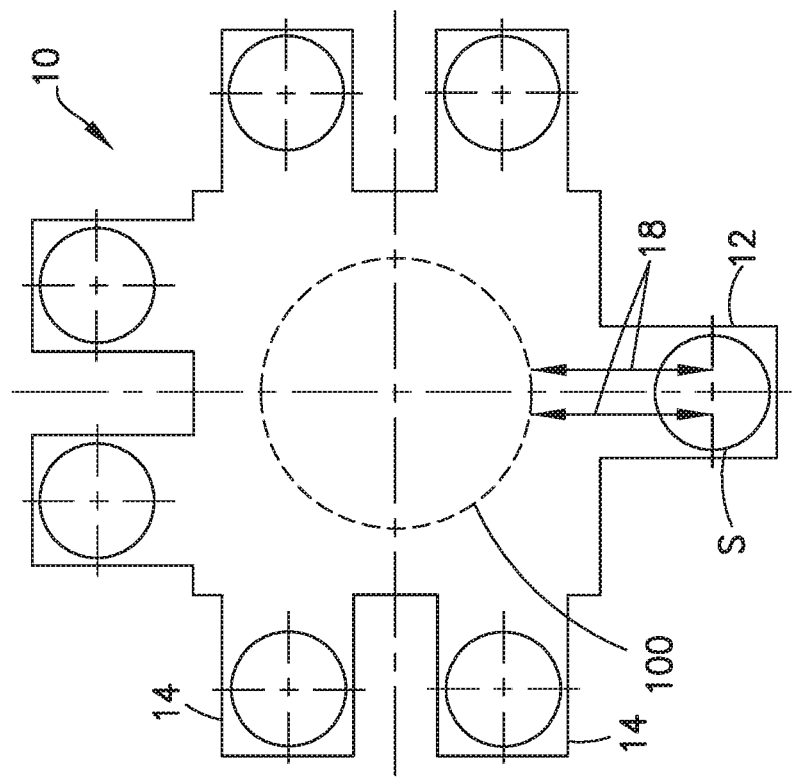

Referring to FIGS. 1A-1F, there is schematic views of a semiconductor wafer processing system 10 incorporating features of an example embodiment. Although the features will be described with reference to the example embodiments shown in the drawings, it should be understood that features can be embodied in many alternate forms of embodiments. In addition, any suitable size, shape or type of elements or materials could be used.

Features as described herein may be used with a material-handling robot with multiple end-effectors suitable for applications in semiconductor wafer processing systems.

Figure 1A:
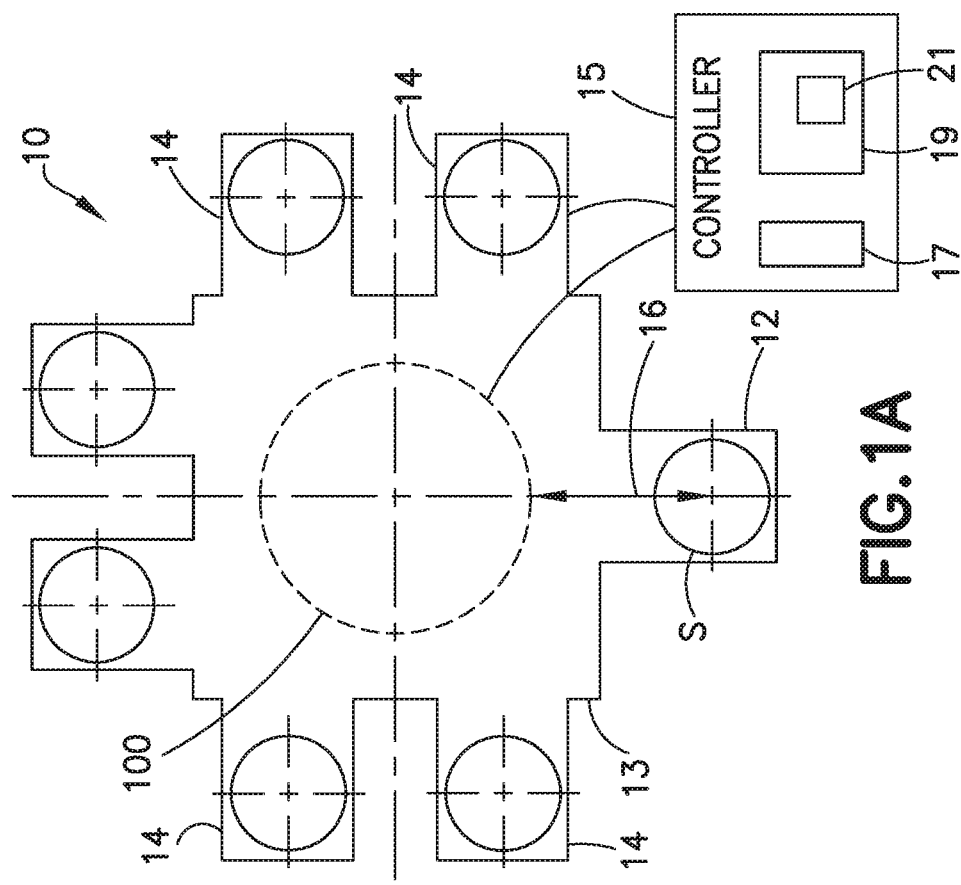

The example Semiconductor wafer processing system 10 may comprise, for example, one or more radial stations 12 and one or more offset stations 14. A robot 100 may be provided to move one or more substrates S between or among the stations 12, 14 or other modules/stations (not shown) connected to an environment chamber 13. The environment chamber 13 may provide a vacuum environment for example, and has the robot 100 extends through a bottom wall of the chamber 13 into the environment defined, at least partially, by the chamber 13. The robot 100 and stations 12, 14 are connected to at least one controller 15 comprising at least one processor 17 and at least one memory 19 comprising software 21 to control operations of the system 10. The system 10 may provide, for example, the following wafer-handling operations:

(a) Pick/place 16 a single wafer or substrate S from/to a single radial station 12, as illustrated diagrammatically in FIG. 1A;
(b) Pick/place 18 simultaneously a pair of wafers or substrates S from/to a pair of stacked radial stations 12, as is illustrated diagrammatically in FIG. 1B;
(c) Pick/place 20 a single wafer or substrates S from/to a single offset station 14, as illustrated diagrammatically in FIG. 1C;
(d) Pick/place 22 simultaneously a pair of wafers from/to a pair of stacked offset stations 14, as is illustrated diagrammatically in FIG. 1D;
(e) Pick/place 24 simultaneously a pair of wafers or substrates S from/to a pair of side-by-side offset stations 14, as illustrated diagrammatically in FIG. 1E;
(f) Adjust independently placement positions 26 when placing a pair of wafers or substrates S to a pair of side-by-side offset stations 14, as illustrated diagrammatically in FIG. 1F;
(g) Exchange quickly a wafer or substrate S in a single radial station 12 for another wafer (rapid exchange operation in a single radial station);
(h) Exchange quickly a pair of wafers or substrates S in a pair of stacked radial stations 12 for another pair of wafers (rapid exchange operation in a pair of stacked radial stations);
(i) Exchange quickly a wafer or substrate S in a single offset station 14 for another wafer (rapid exchange operation in a single offset station);
(j) Exchange quickly a pair of wafers or substrates S in a pair of side-by-side offset stations 14 for another pair of wafers (rapid exchange operation in a pair of side-by-side offset stations).

Figure 9B:
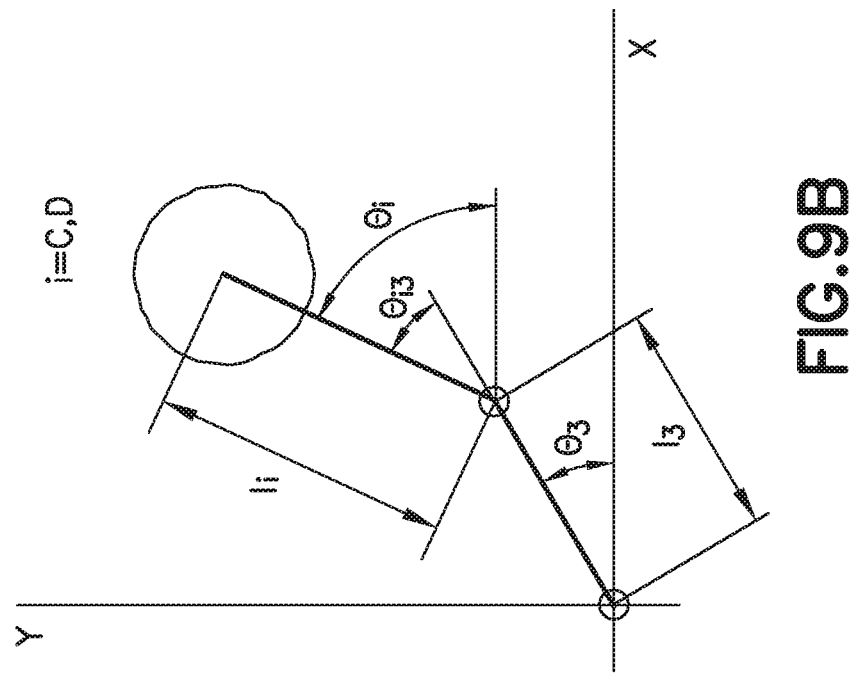
FIGS. 9A-9B illustrate example nomenclature for lengths and angles between links of a robot arm.
Figure 9A:
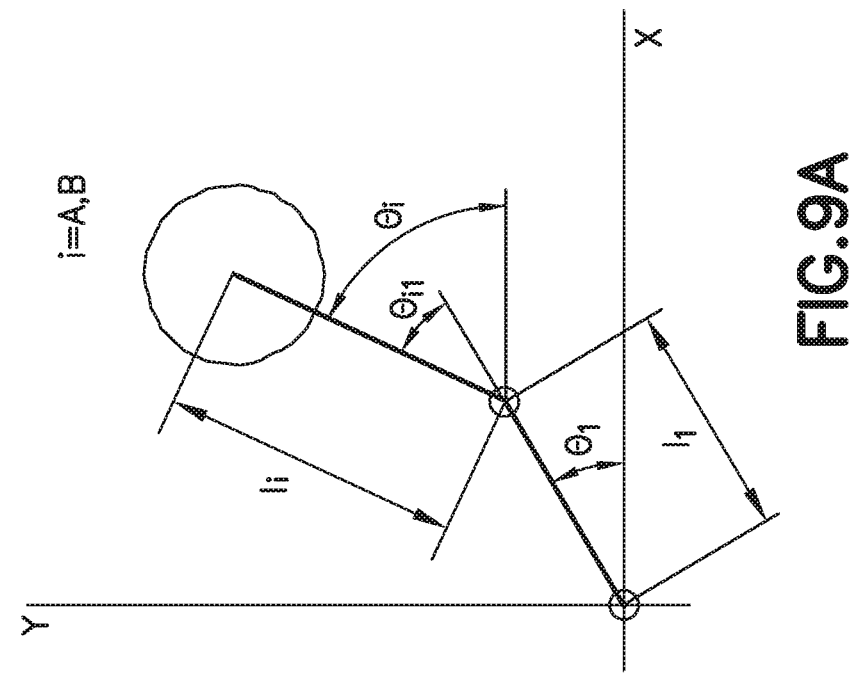

Various embodiments of the robot with multiple end-effectors according to the present invention are intended to address various combinations of the above requirements. The nomenclature used throughout the document is summarized in Table 1 below. Refer also to FIGS. 9A-9B for illustration of the key parameters.

TABLE 1

Nomenclature

| | |
|---|---|
| $l_1$ - joint-to-joint length of (left) upper arm driven by shaft T1 | (m) |
| $l_3$ - joint-to-joint length of right upper arm driven by shaft T3 | (m) |
| $l_i$ - length of forearm with end-effector i measured from elbow joint to wafer center, i = A, B, C, D | (m) |
| $n_i$ - transmission ratio associated with end-effector i, i = A, B, C, D | |

TABLE 1-continued

Nomenclature

| | |
|---|---|
| t - time | (s) |
| $x_i$ - x-coordinate of end-effector i, i = A, B, C, D | (m) |
| $y_i$ - y-coordinate of end-effector i, i = A, B, C, D | (m) |
| $\Delta\theta_1(t)$ - change in orientation left upper arm driven by shaft T1 | (deg) |
| $\Delta\theta_2(t)$ - change in orientation of pulley(s) driven by shaft T2 | (deg) |
| $\Delta\theta_3(t)$ - change in orientation of right upper arm driven by shaft T3 | (deg) |
| $\Delta\theta_4(t)$ - change in orientation of pulley(s) driven by shaft T4 | (deg) |
| $\Delta\theta_i(t)$ - change in orientation of end-effector i, i = A, B, C, D | (deg) |
| $\Delta\theta_{i1}(t)$ - relative orientation of end-effector i with respect to left upper arm driven by shaft T1, i = A, B | (deg) |
| $\Delta\theta_{i3}(t)$ - relative orientation of end-effector i with respect to right upper arm driven by shaft T3, i = C, D | (deg) |
| $\theta_1(t)$ - orientation of left upper arm driven by shaft T1 | (deg) |
| $\theta_{10}$ - initial orientation of left upper arm driven by shaft T1 | (deg) |
| $\theta_{1ext}$ - orientation of left upper arm driven by shaft T1 when left linkage extended | (deg) |
| $\theta_{1ret}$ - orientation of left upper arm driven by shaft T1 when left linkage retracted | (deg) |
| $\theta_2(t)$ - orientation of pulley driven by shaft T2 | (deg) |
| $\theta_{20}$ - initial orientation of pulley driven by shaft T2 | (deg) |
| $\theta_{2exti}$ - orientation of pulley driven by shaft T2 when end-effector j extended, i = A, B | (deg) |
| $\theta_{2ret}$ - orientation of pulley driven by shaft T2 when left linkage retracted | (deg) |
| $\theta_3(t)$ - orientation of right upper arm driven by shaft T3 | (deg) |
| $\theta_{30}$ - initial orientation of right upper arm driven by shaft T3 | (deg) |
| $\theta_{3ext}$ - orientation of right upper arm driven by shaft T3 when right linkage extended | (deg) |
| $\theta_{3ret}$ - orientation of right upper arm driven by shaft T3 when right linkage retracted | (deg) |
| $\theta_4(t)$ - orientation of pulley driven by shaft T4 | (deg) |
| $\theta_{40}$ - initial orientation of pulley driven by shaft T4 | (deg) |
| $\theta_{4exti}$ - orientation of pulley driven by shaft T4 when end-effector j extended, i = C, D | (deg) |
| $\theta_{4ret}$ - orientation of pulley driven by shaft T4 when left linkage retracted | (deg) |
| $\theta_i(t)$ - orientation of end-effector i, i = A, B, C, D | (deg) |
| $\theta_{i0}$ - initial orientation of end-effector i, i = A, B, C, D | (deg) |
| $\theta_{iextj}$ - orientation of end-effector i when end-effector j extended, i = A, B, j = A, B or i = C, D, j = C, D | (deg) |
| $\theta_{iret}$ - orientation of end-effector i when corresponding linkage retracted, i = A, B, C, D | (deg) |

Figure 2B:
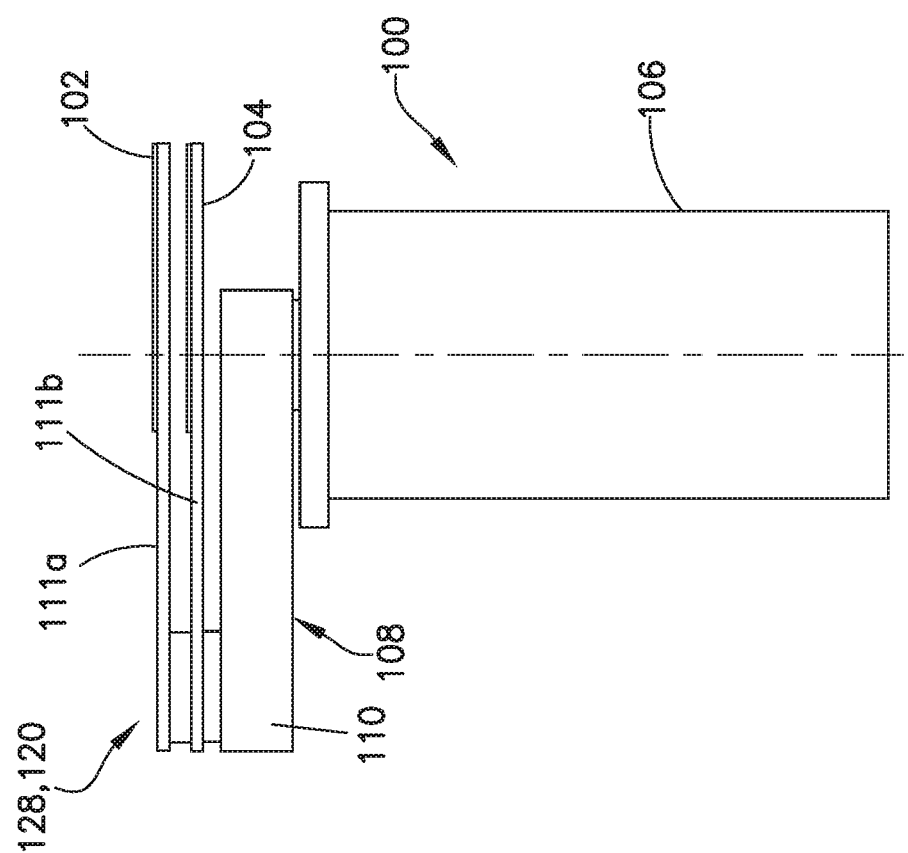
FIG. 2B is a side view of the robot illustrated in FIG. 2A, FIGS. 2C-2D are schematic views illustrating some of the components of the robot shown in FIGS. 2A-2B, FIGS. 3A-3K illustrate examples of substrate movements in a substrate processing apparatus comprising features as described herein.
Figure 2A:
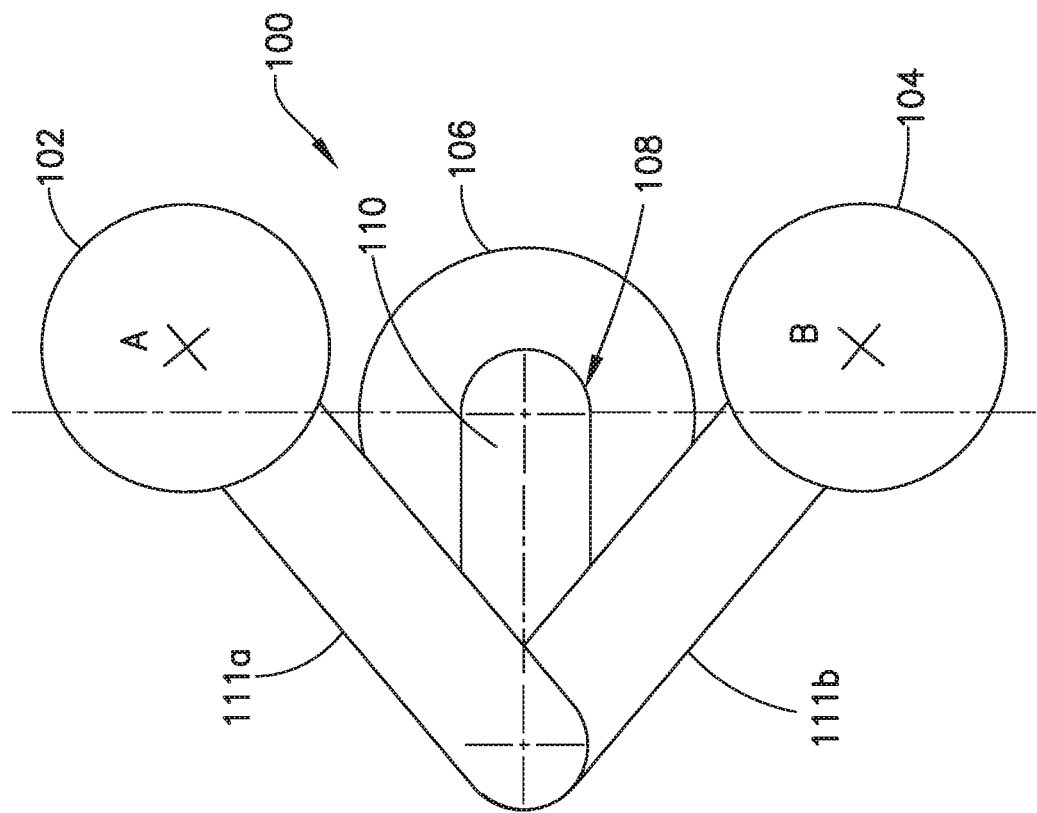
FIG. 2A is a top view of a robot in the substrate processing apparatus shown in FIGS. 1A-1F.
Figure 2D:
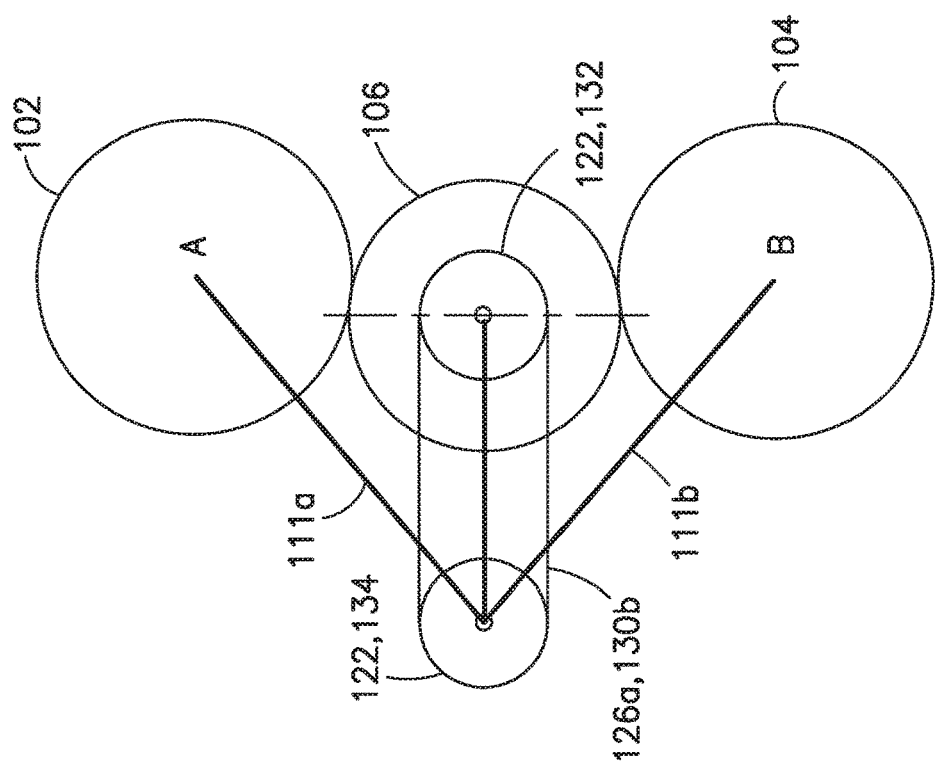
Figure 2C:
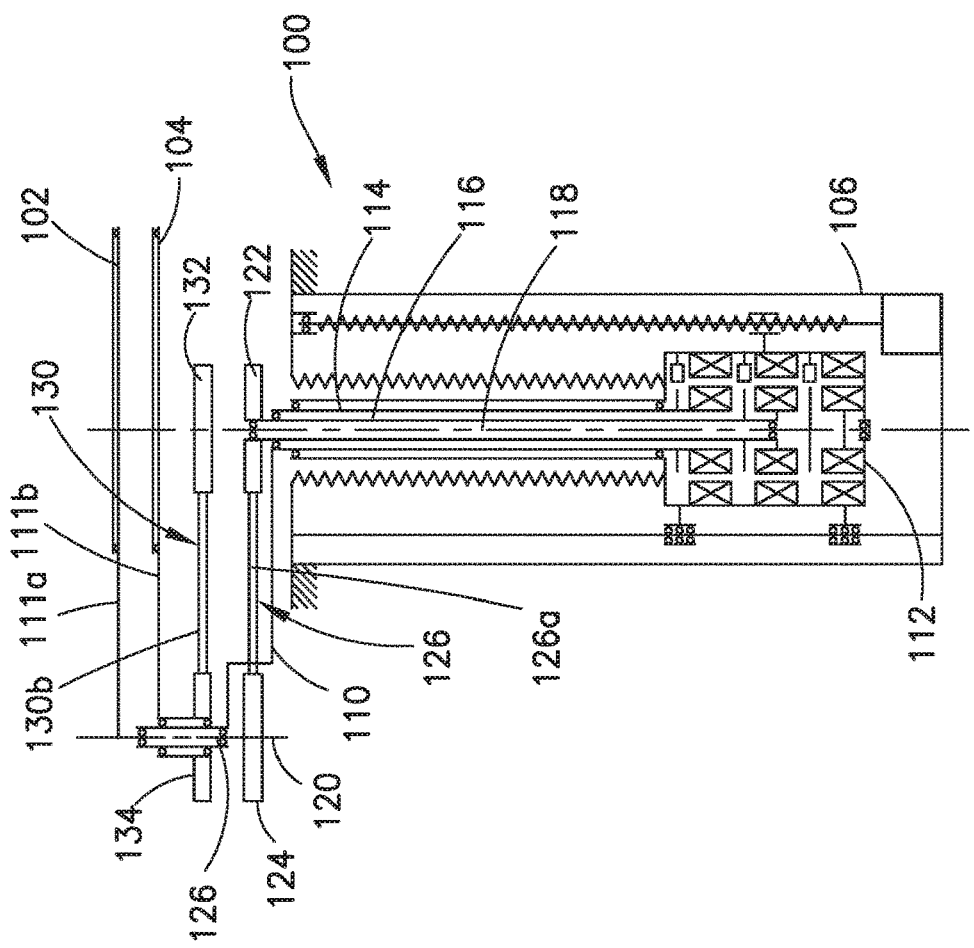

Referring also to FIGS. 2A-2C, in one example embodiment the robot 100 may comprise two end-effectors 102, 104. In the figure, FIG. 2A shows a top view of the robot 100 and FIG. 2B depicts a side view of the robot 100. In this example the robot 100 comprises a robot drive 106 unit and a robot arm 108. The end effectors 102, 104 comprise respective areas A, B for supporting one of the substrates S thereon. Please note that at various locations in this description and in the drawings the end effectors are sometimes referenced by the letters A, B or A-D for example corresponding to the areas for supporting the substrates thereon.

An example internal arrangement of the robot 100 is depicted diagrammatically in FIGS. 2C-2D. The robot arm 108, in this example, comprises an upper arm 110, an upper forearm 111a connected to the end effector 102 which forms an upper end-effector in this example, and a lower forearm 111b connected to the end effector 104 which forms with a lower end-effector in this example. The robot arm 108 may be driven by the robot drive unit 106. In this example the robot drive unit 106 comprises a three-axis spindle 112 with three coaxial shafts, e.g., an outer T1 shaft 114, a T2 shaft 116 and an inner T3 shaft 118.

The upper arm 110 of the robot arm 108 may be attached directly to the T1 shaft 114. The upper forearm 111a may be coupled to the upper arm 110 via a rotary joint 120 (elbow joint), and actuated by the T2 shaft 116 using a belt arrangement 126. The belt arrangement may comprise a shoulder pulley 122, which may be attached to the T2 shaft 116, elbow pulley 124, which may be attached to the upper forearm 111a, and a band, belt or cable 126a, which may transmit motion between the two pulleys 122, 124. The belt arrangement may feature a constant or variable transmission ratio. As an example, a variable transmission ratio may be implemented using non-circular pulleys.

Similarly, the lower forearm 111b may be coupled to the upper arm 110 via a rotary joint (elbow joint) 128, and its orientation may be controlled by the T3 shaft 118 using another band, belt or cable arrangement 130. The belt arrangement may comprise a shoulder pulley B 132, which may be attached to the T3 shaft, an elbow pulley B 134, which may be attached to the forearm B, and a band, belt or cable 130b, which may transmit motion between the two pulleys 132, 134. Again, the belt arrangement may feature a constant or variable transmission ratio, for example, implemented through the use of non-circular pulleys.

Figure 3E:
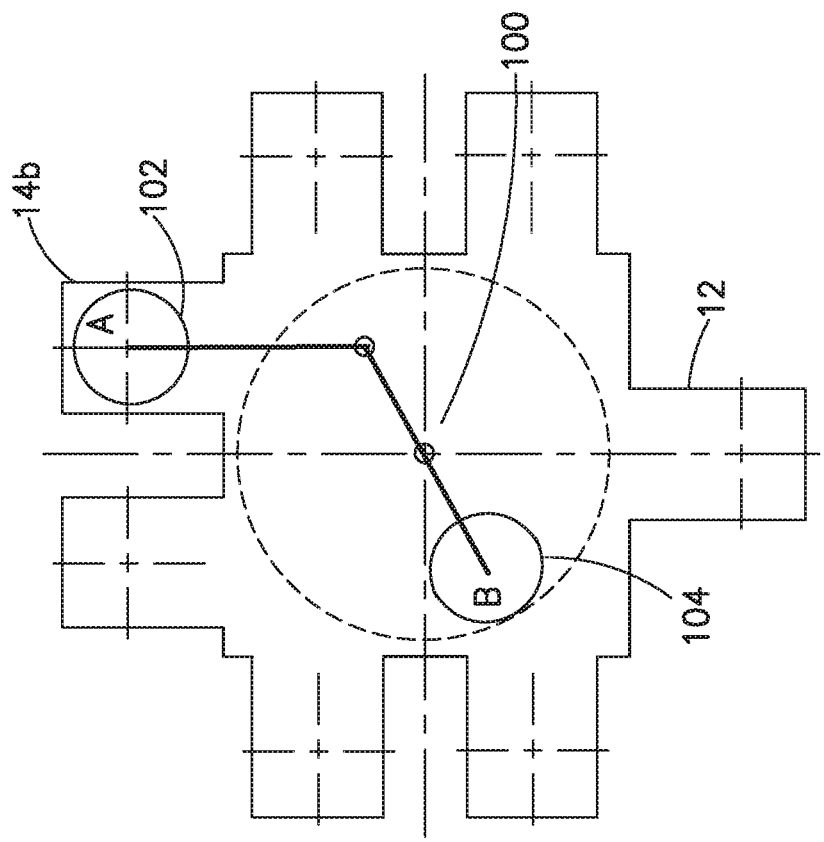
Figure 3D:
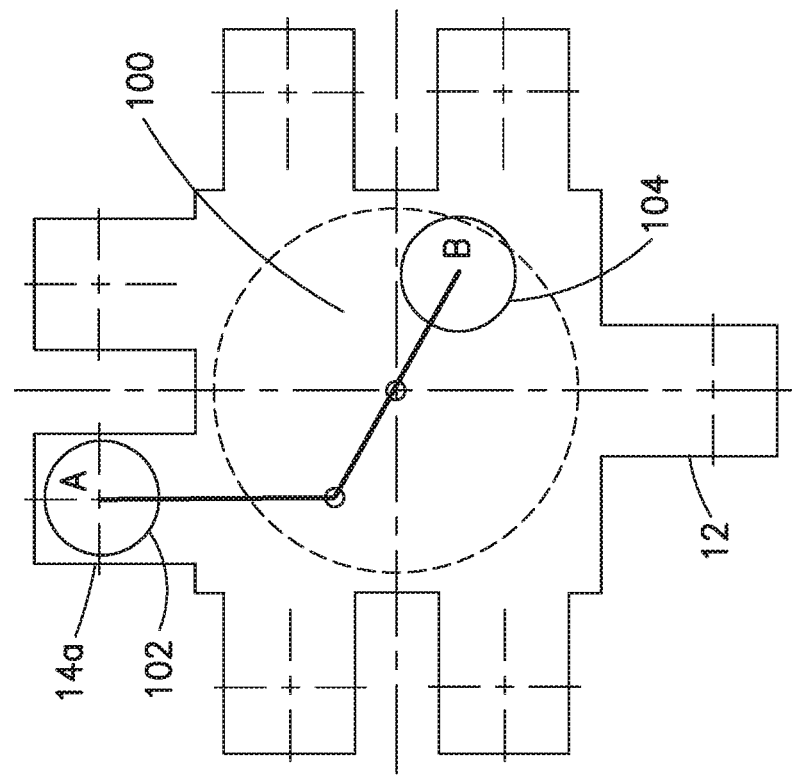
Figure 3I:
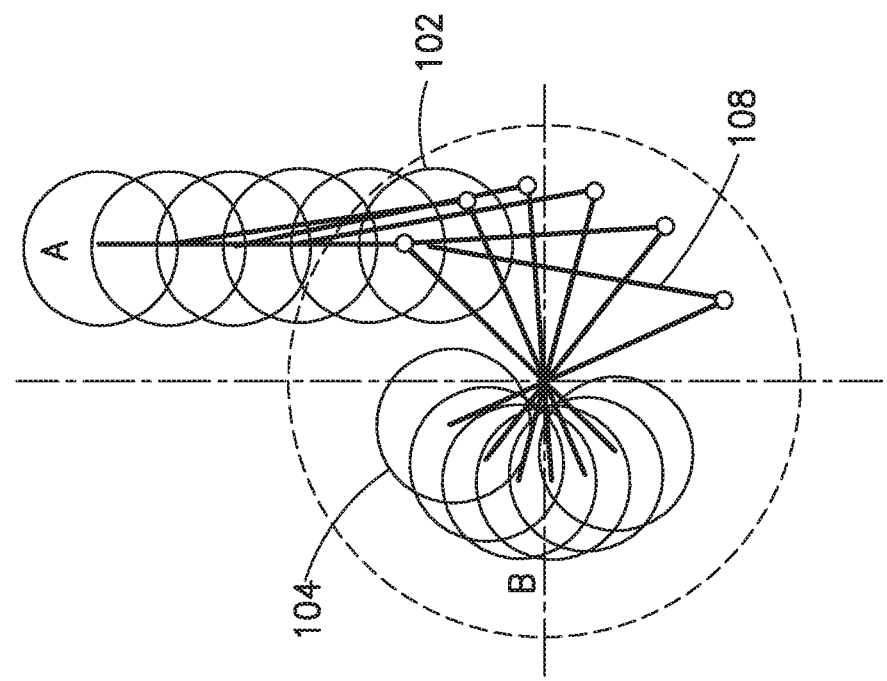
Figure 3H:
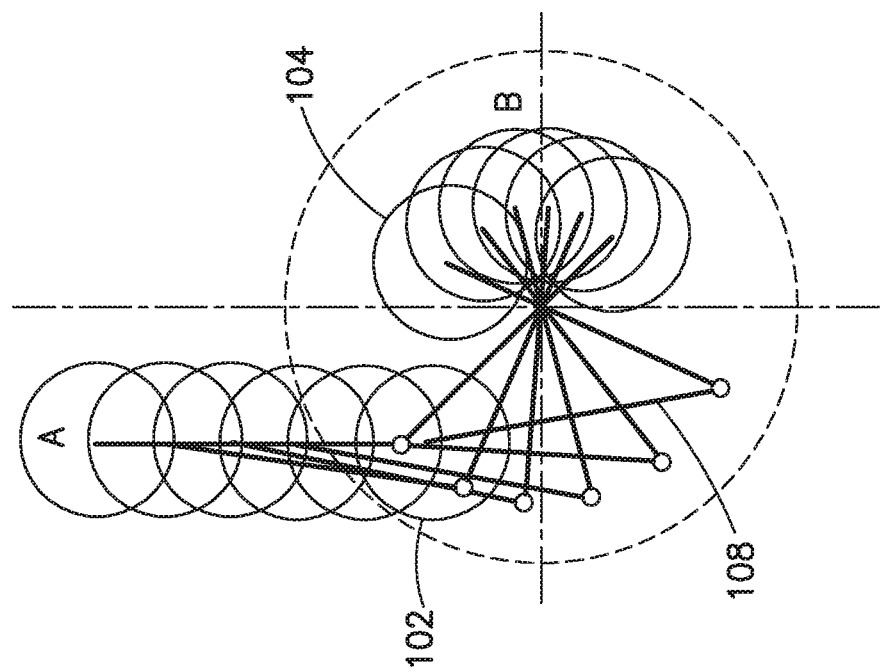

The T1, T2 and T3 shafts of the robot drive unit 106 may be rotated so that the upper end-effector 102 and lower end-effector 104 can access individually or simultaneously various offset and radial stations 12, 14, as illustrated diagrammatically in FIGS. 3A-3G. Illustrations of example phased motions are shown in FIGS. 3H-3K. In FIG. 3H the arm 108 moves the end effector 102 (A) from a partially unfolded retracted position, e.g., in front of a station, to an extended position, e.g., in the station 14a as shown in FIG. 3D. The other end-effector 104 (B), i.e., the end-effector that is not performing a move, may conveniently remain folded on top of the upper arm 110, thus desirably limiting its motion. In FIG. 3I the arm 108 moves the end effector 102 (A) from a partially unfolded retracted position, e.g., in front of a station, to an extended position, e.g., in the station 14b as shown in FIG. 3E. The other end-effector 104 (B), i.e., the end-effector that is not performing a move, may conveniently remain folded on top of the upper arm 110, thus desirably limiting its motion. In FIG. 3J the arm 108 moves the end effector 104 (B) from a partially unfolded retracted position, e.g., in front of a station, to an extended position, e.g., in the station 14a as shown in FIG. 3F. The other end-effector 102 (A), i.e., the end-effector that is not performing a move, may conveniently remain folded on top of the upper arm 110, thus desirably limiting its motion. In FIG. 3G the arm 108 moves the end effector 104 (B) from a partially unfolded retracted position, e.g., in front of a station, to an extended position, e.g., in the station 14b as shown in FIG. 3G. The other end-effector 102 (A), i.e., the end-effector that is not performing a move, may conveniently remain folded on top of the upper arm 110, thus desirably limiting its motion.

When fully retracted, the upper forearm 111a and lower forearm 111b are oriented 180 degrees from the angle of the upper arm 110 as shown in FIG. 3A. In this "folded" pose, the swing diameter is minimized, which is ideal for rotation motions between different stations. The radius of the wafer center with respect to the robot center in this folded position defines a circular region inside of which it is not physically possible to position the payload center. This circular locus of payload positions represents a kinematic singularity—the inverse kinematics calculations in the vicinity of this region are poorly conditioned (see Equations (22) to (29) for example details of inverse kinematics). Prior art trajectory generation would calculate a one-dimensional trajectory profile in a normalized path variable, then apply this to the line segment connecting the start and end positions, mapping the path variable to intermediate points within that segment based a Cartesian coordinate space. Applying this technique to planned paths that bring the payload away from (extend move) or back to (retract move) this singularity will generally produce commanded angular velocities and accelerations that are too high and not actually achievable by the robot.

To address this technical challenge in the present embodiment, a joint space trajectory generation algorithm may be included. Given the start and end positions for a commanded move, the joint space trajectory generation algorithm may execute the following protocol:

Check that the straight-line path between the end points does not intersect the singularity. If an intersection is predicted, then do not execute the move. As an example, the check may utilize the following method.

a. The move may be defined as a straight-line segment connecting the start point $P_1$ to the end point $P_2$ and the corresponding vector $V_p = P_2 - P_1$.

b. The singularity may be defined as an infinite cylinder with an axis along the vector $V_c$ (nominally defined as the "Z" axis) that intersects a point at the robot center $P_c$ and has a radius of $r_c = 1_A - 1_1$ for end-effector A or $r_c = 1_B - 1_1$ for end effector B.

c. Define an additional vector $V_a = P_1 - P_c$.

d. Solve the quadratic equation defined by the coefficients:

$$a = (V_p \times V_c) \cdot (V_p \times V_c)$$

$$b = 2 \cdot (V_p \times V_c) \cdot (V_a \times V_c)$$

$$c = (V_a \times V_c) \cdot (V_a \times V_c) - (r_c^2) \cdot (V_c \cdot V_c)$$

e. If there are any real roots in the range [0,1], then the line segment intersects the cylinder at the point $$P_{intersect} = P_1 + k_{root} \cdot (P_2 - P_1)$$

Check if the straight line path between the end points passes within some threshold distance from the singularity. If the move does not approach near the singularity at any point, then employ a standard Cartesian trajectory generation scheme. As an example, the check may utilize the following method.

a. Find the point on the line closest to the axis of the cylinder.

$$V_{acp} = V_c \times (V_p \times V_c)$$

$$P_{nearest} = P_1 - \frac{V_p \cdot (V_a \cdot V_{acp})}{(V_p \cdot V_{acp})}$$

b. Check if the found point is within the line segment between $P_1$ and $P_2$ and replace it with one of those end points if necessary.

c. Calculate the distance from the surface of the cylinder to the nearest point on the segment.

$$distance = |V_a + (V_a \cdot V_c) \cdot V_c| - r_c$$

d. If the minimum distance is less than a predefined value, then the joint space trajectory generation algorithm may be used.

If the planned path is close to the singularity, calculate the start and end positions of the move in terms of joint coordinates, for instance, included angle $\theta_{A1}(t)$ or the difference of $\theta_1(t) - \theta_2(t)$ may be used if end-effector A is being commanded, or $\theta_{B1}(t)$ or $\theta_1(t) - \theta_3(t)$ may be used if end-effector B is being commanded.

Calculate a one dimensional trajectory profile in a normalized path variable, and then apply this, to the desired path expressed in terms of included angle from the start point to the end point. Motion constraints used to generate the trajectory may be expressed in terms of limits on the joint velocities and accelerations.

The joint space trajectory may be evaluated in a selected grid of points to determine if it violates any of the motion constraints expressed in Cartesian coordinates (e.g. the maximum linear velocity and acceleration of the payload). This test employs direct (forward) kinematics formulae only, so it works regardless of the proximity of the singularity. Refer to Equations (12) to (16) for a direct kinematics formulae for example. In the case where a Cartesian motion constraint is violated, calculate a time scale factor to slow the motion enough to meet all constraints. As an example, the following may be utilized in step (5).

a. At each point checked, the Cartesian velocity and acceleration constraints are:

$$\text{velocity} = \sqrt{\dot{x}^2 \dot{y}^2} \leq \text{velocity}_{limit}$$

$$\text{acceleration} = \sqrt{\ddot{x}^2 \ddot{y}^2} \leq \text{acceleration}_{limit}$$

b. If either of the constraints is violated at any point, a scale factor is calculated:

$$\text{scale} = \max\left(\frac{\text{velocity}_{maximum}}{\text{velocity}_{limit}}, \frac{\sqrt{\text{acceleration}_{maximum}}}{\sqrt{\text{acceleration}_{limit}}}\right)$$

c. The scale factor, which will be greater than or equal to 1, is applied to the trajectory as follows:

$$\text{time} = \text{scale} * \text{time}_{previous}$$

$$\text{velocity} = \frac{\text{velocity}_{previous}}{\text{scale}}$$

$$\text{acceleration} = \frac{\text{acceleration}_{previous}}{\text{scale}^2}$$

$$\text{jerk} = \frac{\text{jerk}_{previous}}{\text{scale}^3}$$

Given the joint space trajectory in the included angle, the corresponding trajectory in the radial coordinate can be calculated directly. For any value of included angle, there is a corresponding radial extension of the payload center. As an example, the following approach may be utilized for this step.

a. Consider, for example Equations (12) to (16) for direct kinematics with end effector A. If the included angle Om(t) is known, one can make a simplifying assumption that $\theta_1(t)=\theta_{A1}(t)$ and $\theta_A(t)=0$ for the purpose of calculating the radial extension.

b. The sign of the included angle indicates the handedness of the linkage (i.e., whether the elbow joint is to the left or right of the line connecting the shoulder joint to the payload center.)

With the radial coordinate determined, calculate the corresponding angular coordinate of the payload center so that the path of the payload center follows a straight line in Cartesian space between the start and end point of the move. As an example, the following method may be used.

Given the move path, which may be a straight line in Cartesian space between the points $P_1$ and $P_2$, and given some radial position, velocity and acceleration calculated from the trajectory's included angle, angular speed and angular acceleration, find the corresponding rotational angle, angular speed, and angular acceleration so that the payload center is maintained in the move path.

Using a modified formulation of the inverse kinematics, convert the desired payload center expressed in cylindrical coordinates supplemented with the desired included angle and its corresponding angular velocity and acceleration into the desired joint positions, velocities, and accelerations. These become the motion setpoints for the robot. The original problem of calculating the inverse kinematics near the singularity is solved because the trajectory is shaped to limit the joint velocities and accelerations and the algorithm uses the knowledge of the desired included angle to bypass the problematic parts of the calculation.

The other end-effector, i.e., the end-effector that is not performing a move, may conveniently remain folded on top of the upper arm, thus desirably limiting its motion.

Figure 11A:
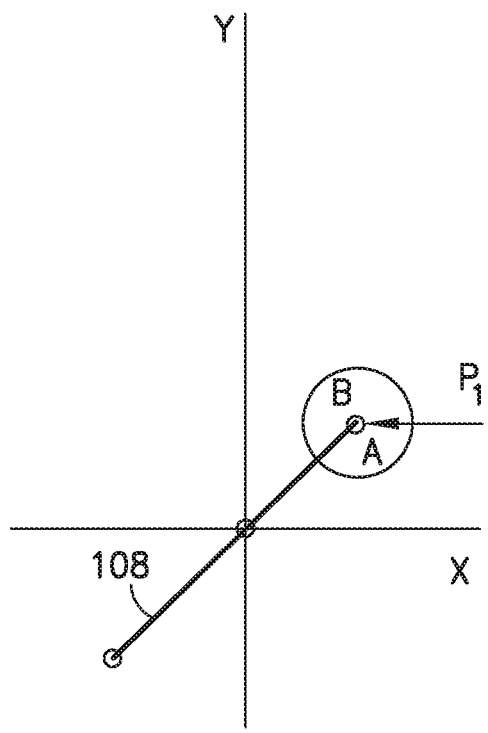
FIGS. 11A-11C illustrate movements of a straight-line path of an end effector A from an initial position to a final position.
Figure 11B:
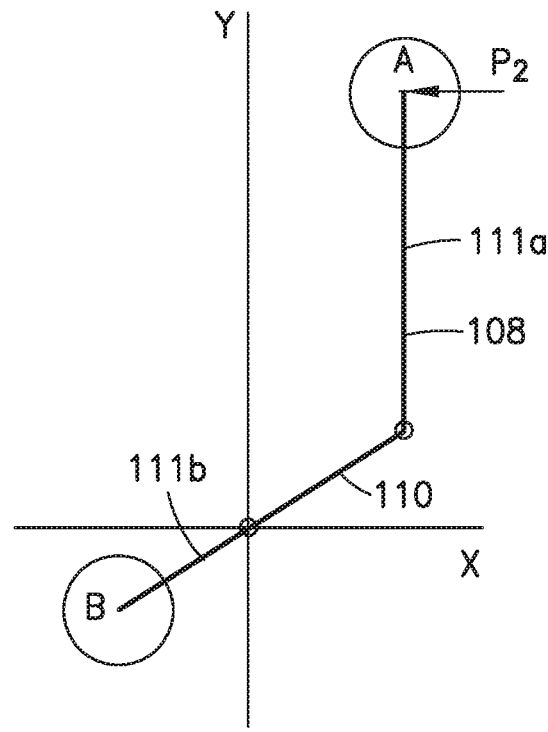
Figure 11C:
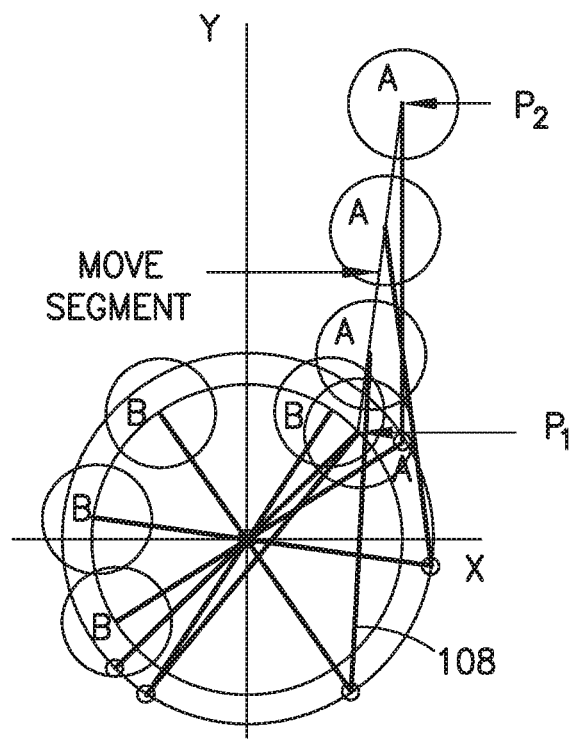
Figure 11D:
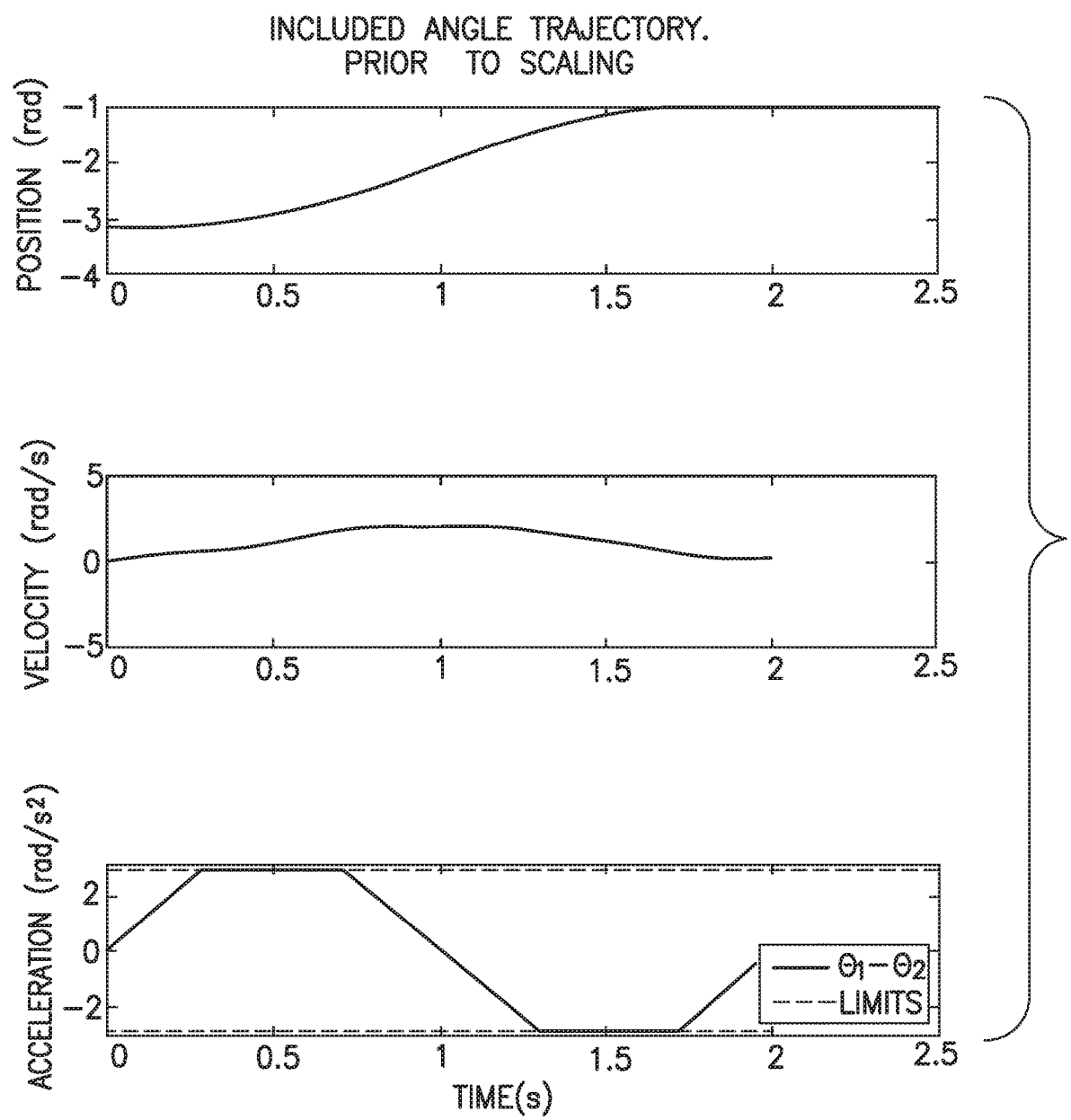
FIGS. 11D-11F illustrate joint trajectory (acceleration, velocity and position for the move illustrated in FIGS. 11A-11C over time, FIGS. 12A-12B illustrate some examples of movement of the end effectors relative to one another as an example robot arm moves with different transmission ratios, respectively, to extend one of the end effectors, FIGS. 13A-13B are schematic illustrations similar to FIGS. 6C-6D of an alternate example embodiment of a robot, FIGS. 14A-14B are schematic illustrations similar to FIGS. 6C-6D of an alternate example embodiment of a robot, FIGS. 15A-15B are schematic illustrations similar to FIGS. 6C-6D of an alternate example embodiment of a robot, FIGS. 16A-16B are schematic illustrations similar to FIGS. 6C-6D of an alternate example embodiment of a robot.
Figure 11E:
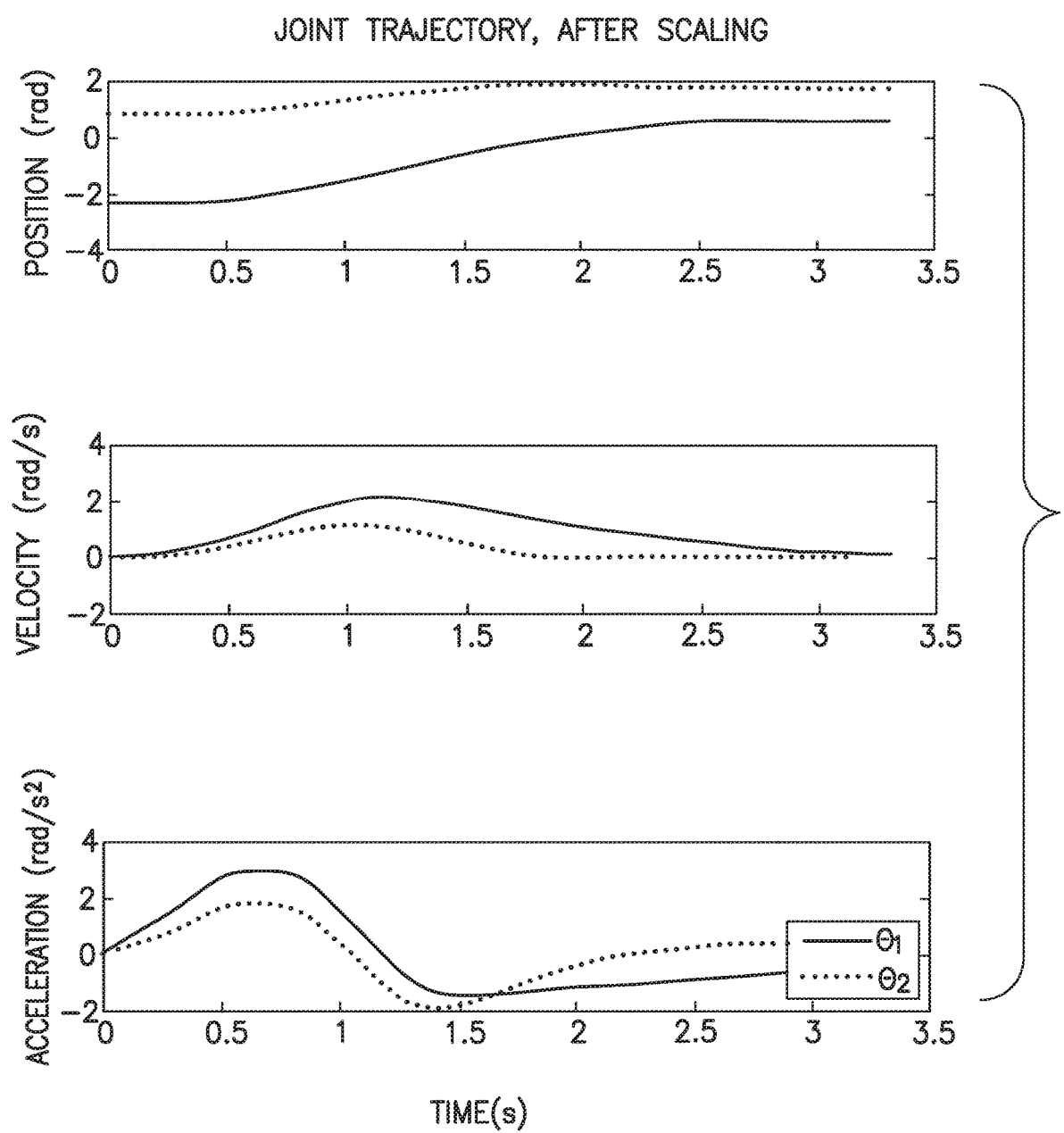
Figure 11F:
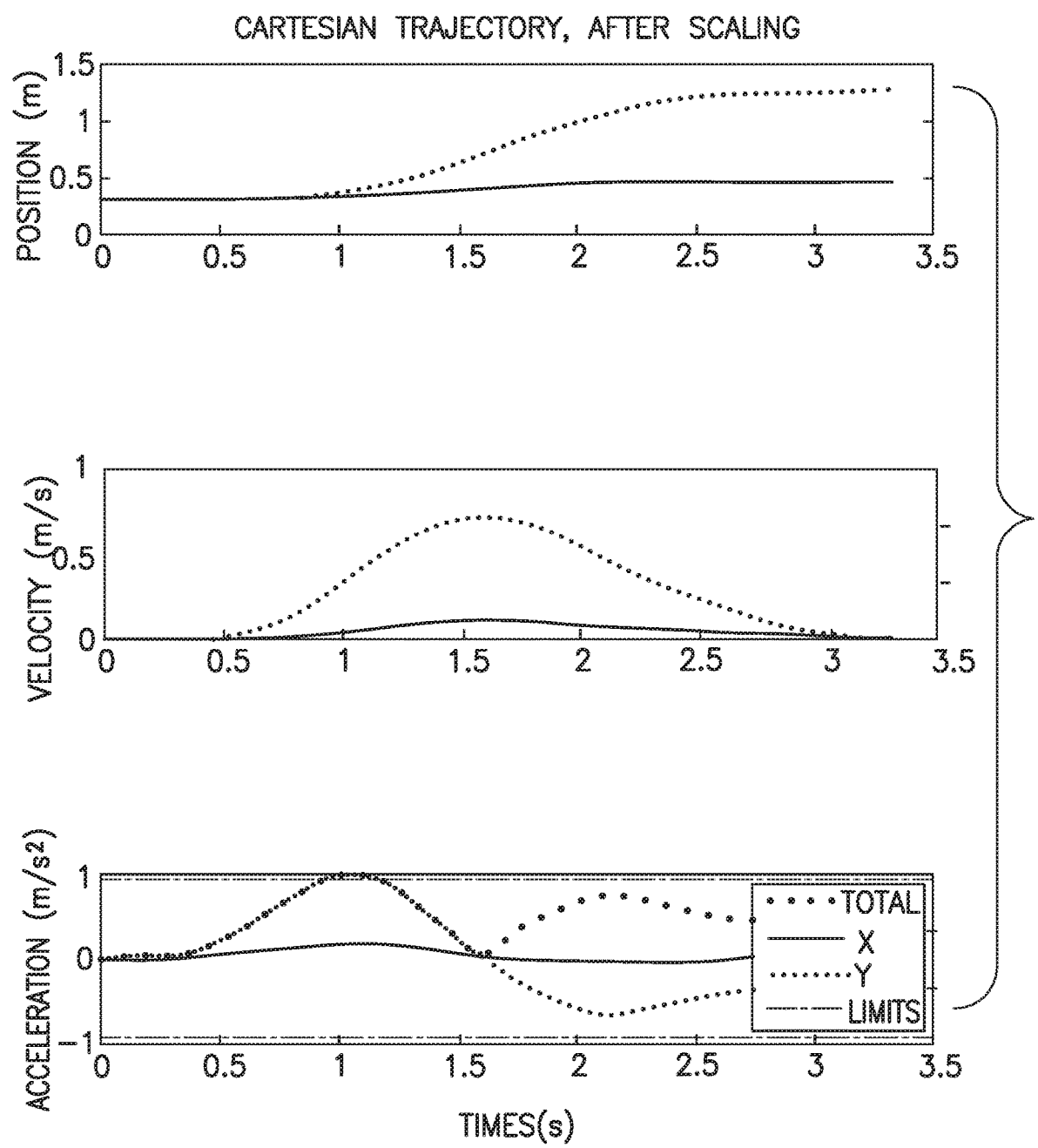

Referring also to FIGS. 11A-11C, an example is shown of a move that starts at the singularity and extends to a station on a straight-line path. This description is made with reference to the robot shown in FIG. 2A-2D, but is equally applicable to at least a portion of at least some of the other robots described herein. FIG. 11A shows the initial position, FIG. 11B shows the final extended position, and FIG. 11C shows the path from the initial position to the final position with some of the intermediate arm positions highlighted. In this example, FIG. 11A shows a starting point where the robot arm has both the end effectors A, B are retracted, and FIG. 11B shows an end point where the robot arm has been moved to move the first end effector A to an extended position, but has retained the second end effector B in a retracted position. FIG. 11C shows a series of snap-shots in time of the motion of the robot arm and end effectors between the positions shown in FIGS. 11A and 11B. In this example, FIG. 11C also shows the movement segment of the first end effector A from its retracted position to its extended position where the movement segment is a straight line into one of the offset stations. In this example, as seen in FIG. 11C, the joint of the forearms with the upper arm merely follows a circular path about the center axis of the robot drive, and the payload center of the second end effector (and a substrate on the second end effector) also merely follows a circular path about the center axis of the robot drive. The trajectory calculated in terms of the included angle, in this particular example defined as $\theta_1(t)-\theta_2(t)$, is shown in FIG. 11D; in this particular example, jerk and acceleration limits have been applied as seen in the acceleration plot. The corresponding scaled trajectory in terms of the drive shaft angles is shown in FIGS. 11E, and the corresponding scaled trajectory in terms of the Cartesian coordinates is shown in FIG. 11F; the acceleration plot shows that the scaling has been applied so that the total acceleration, i.e., the vector sum of the x- and y-components, does not exceed a given limit (dashed line). Consequently, the motion complies with constraints in both joint space (i.e., included angle space) and Cartesian space.

The original problem of calculating the inverse kinematics near the singularity has been solved because the trajectory is shaped to limit the joint velocities and accelerations and the calculation uses the knowledge of the desired included angle to bypass the problematic parts of the calculation.

Multiple move segments can be calculated and executed in sequence. Move segments may be blended together to decrease total move time by eliminating stopping at the waypoints. A sequence of move segments may include some calculated using the joint space trajectory generation scheme described above and others calculated by any other method. The number of move segments, the types of the move segments, and the order of move segments types is not subject to any restriction.

As an example of an alternative to the example internal arrangement of FIGS. 2C-2D, the upper arm of the robot arm may be driven by a robot drive unit with a single-axis spindle, and the forearms may be driven by a pair of actuators attached to the upper arm. In particular, one actuator may be configured to drive the upper forearm, and the other actuator may be configured to drive the lower forearm. The actuators may be connected to the forearms directly, similarly to the example configuration of FIGS. 15A-15B, or they may be coupled to the forearms via a band, belt or cable arrangement, similarly to the example configuration of FIGS. 16A-16B.

Figure 4C:
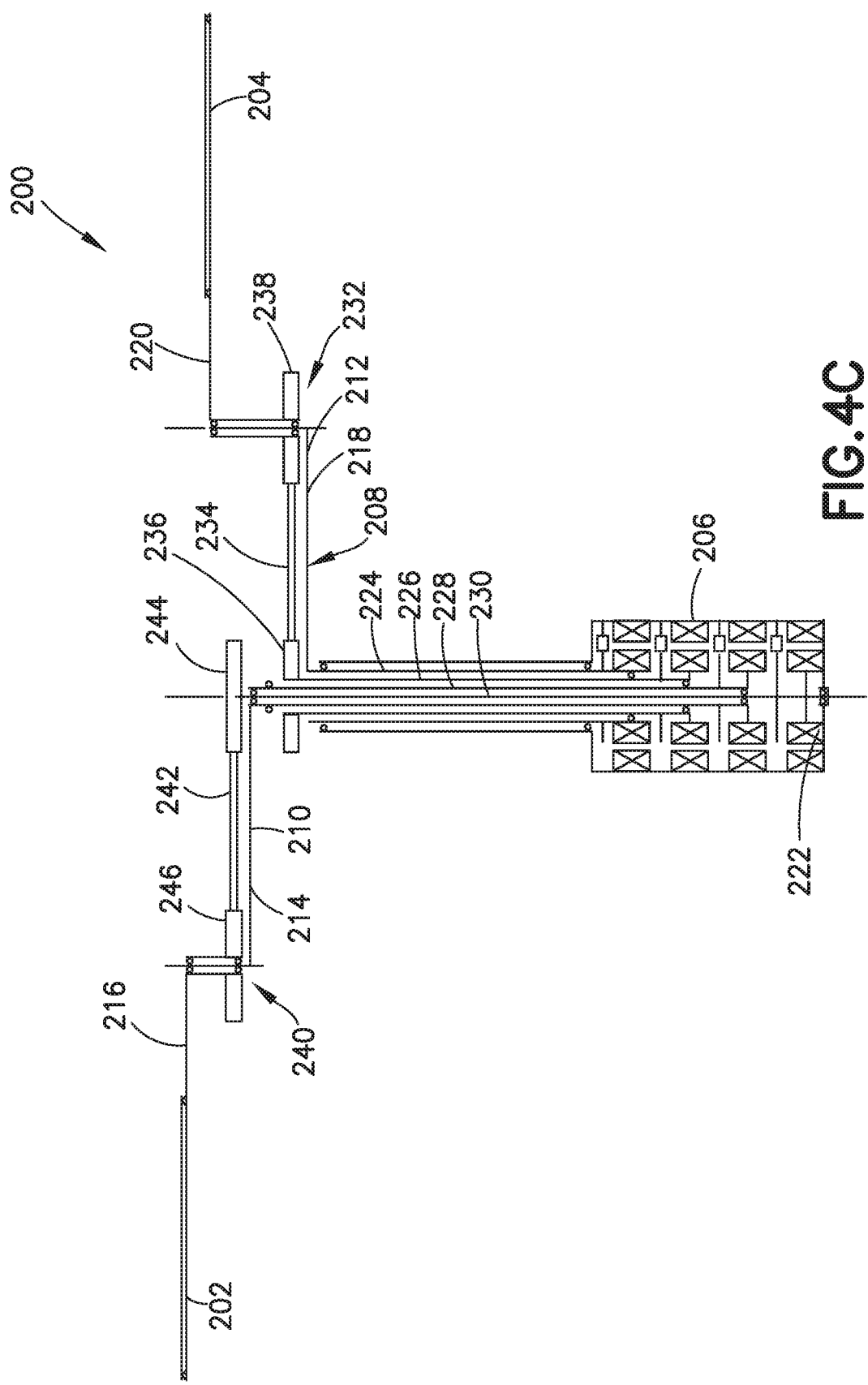
FIG. 4A is a top view of a robot in the substrate processing apparatus shown in FIGS. 3A-3G.
FIG. 4B is a side view of the robot illustrated in FIG. 4A, FIGS. 4C-4D are schematic views illustrating some of the components of the robot shown in FIGS. 4A-4B, FIGS. 5A-5H illustrate examples of substrate movements in a substrate processing apparatus comprising features as described herein.

Another example embodiment of the robot is shown in FIGS. 4A-4C. In this example the robot 200 comprises two end-effectors 202, 204. FIG. 4A shows a top view of the robot 200 and FIG. 4B depicts a side view of the robot 200. The robot 200 comprises a robot drive unit 206 and a robot arm 208. The robot arm 208 features linkages, such as a left linkage 210 and a right linkage 212 for example.

The left linkage 210 may consist of a left upper arm 214 and a left forearm 216 with the left end-effector 202 having the substrate support area A. Similarly, the right linkage 212 may consist of a right upper arm 218 and a right forearm 220 with the right end-effector 204 having the substrate support area C.

Figure 4D:
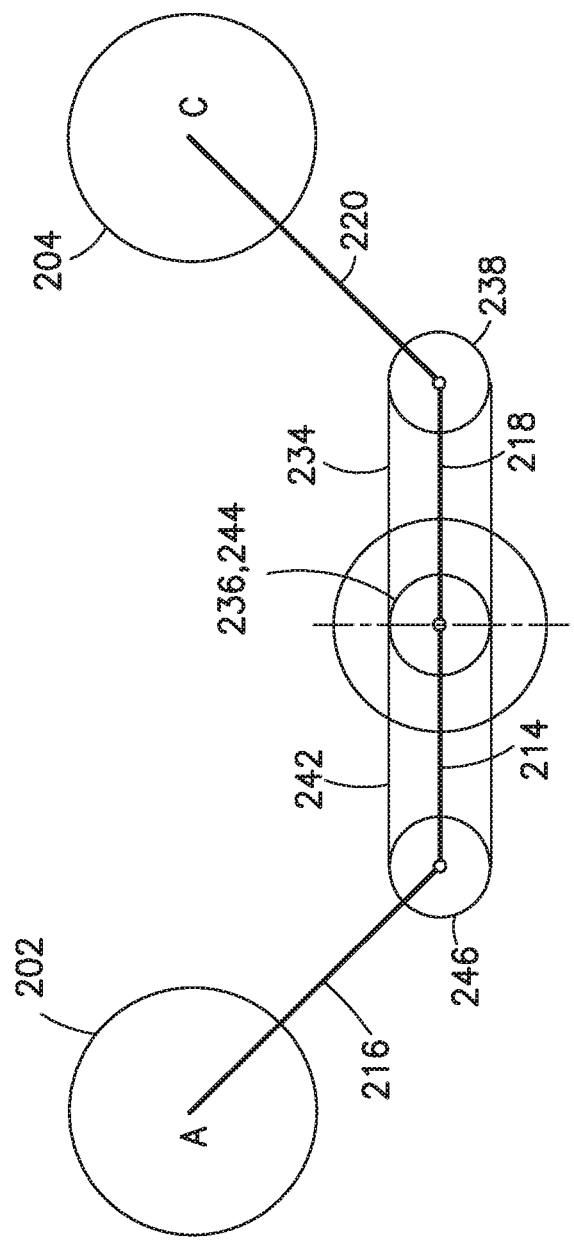
Figure 5B:
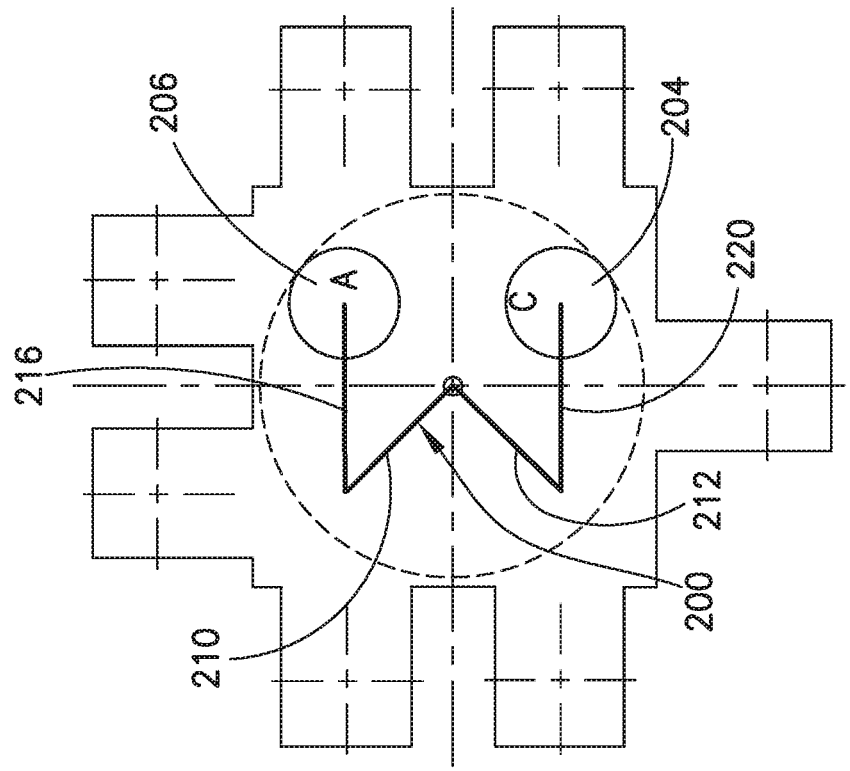
Figure 5A:
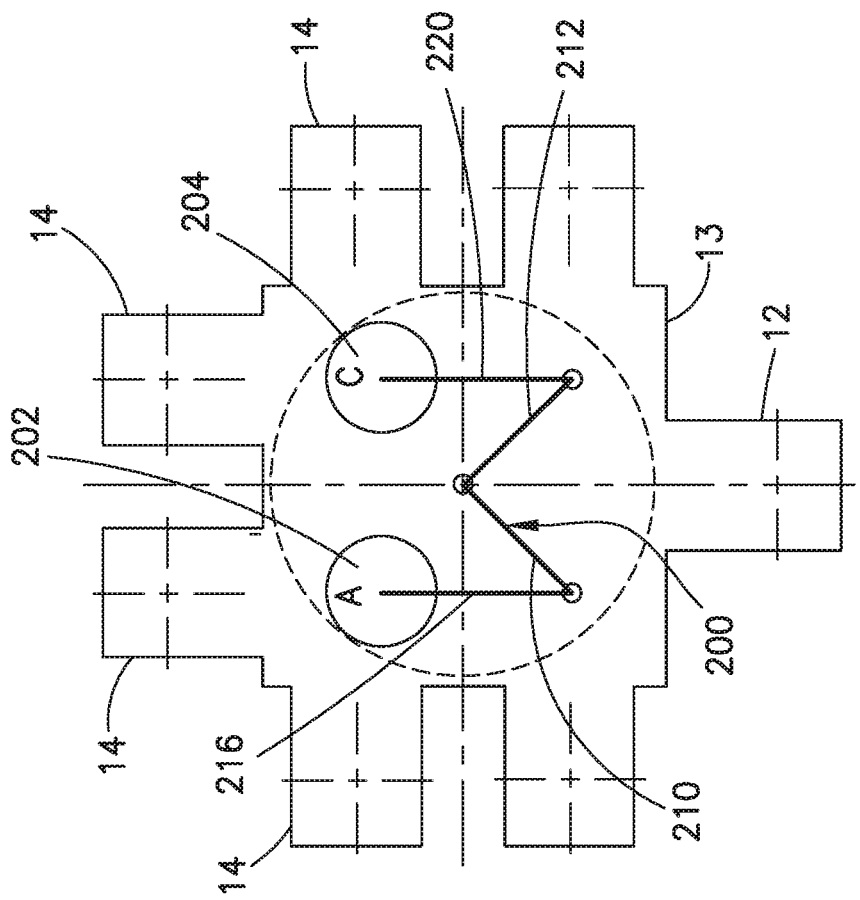
Figure 5F:
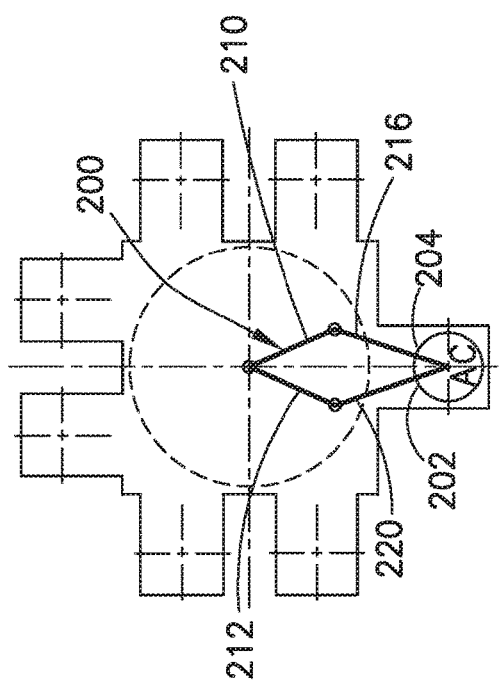
Figure 5H:
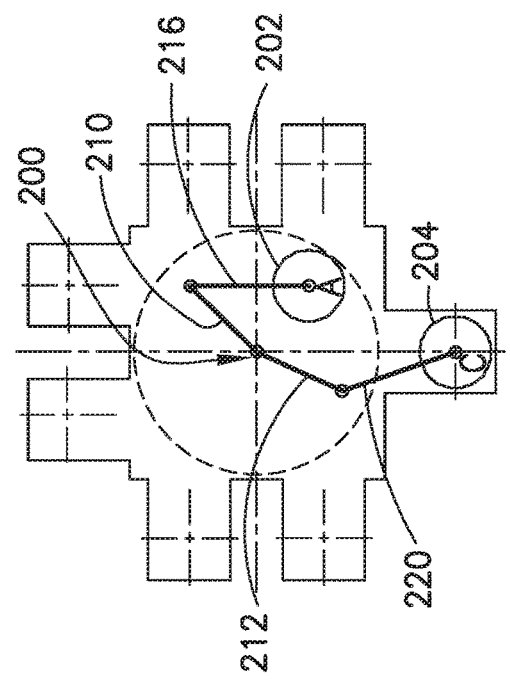
Figure 5G:
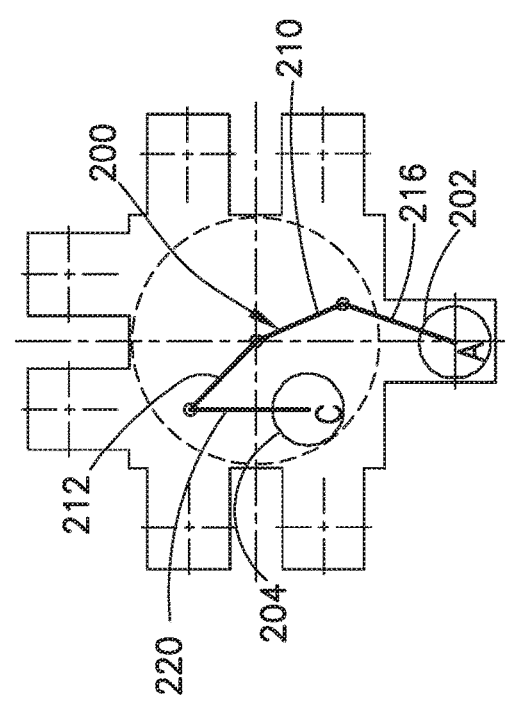

An example internal arrangement of the robot is depicted diagrammatically in FIGS. 4C-4D. The robot arm 208 may be driven by the robot drive unit 206. In this example embodiment, the robot drive unit 206 comprises a four-axis spindle 222 with four coaxial shafts, e.g., an outer T1 shaft 224, a T2 shaft 226, a T3 shaft 228 and an inner T4 shaft 230.

The right upper arm 218 of the robot arm 208 may be attached directly to the T1 shaft 224. The right forearm 220 may be coupled to the right upper arm 218 via a rotary joint (right elbow joint) 232, and actuated by the T2 shaft 226 using a belt arrangement 234. The belt arrangement 234 may comprise a right shoulder pulley 236, which may be attached to the T2 shaft, a right elbow pulley 238, which may be attached to the right forearm 220, and a band, belt or cable, which may transmit motion between the two pulleys 236, 238. The belt arrangement 234 may feature a constant or variable transmission ratio. As an example, the variable transmission ratio may be selected so that the orientation of the right forearm 220 with the right end-effector 204 changes in a predefined manner as a function of the relative position of the right upper arm 218 and the T2 shaft. However, any other suitable arrangement may be used.

Similarly, the left upper arm 214 of the robot arm 208 may be attached directly to the T3 shaft 228. The left forearm 216 may be coupled to the left upper arm 214 via a rotary joint 240 (left elbow joint), and actuated by the T4 shaft using a belt arrangement 242. The belt arrangement 242 may comprise a left shoulder pulley 244, which may be attached to the T4 shaft, a left elbow pulley 246, which may be attached to the left forearm 216, and a band, belt or cable, which may transmit motion between the two pulleys 244, 246. The belt arrangement 242 may feature a constant or variable transmission ratio. As an example, the variable transmission ratio may be selected so that the orientation of the left forearm 216 with the left end-effector 202 changes in a predefined manner as a function of the relative position of the left upper arm 210 and the T4 shaft. However, any other suitable arrangement may be used. Note that although the example embodiment of FIGS. 4A-4C shows end-effectors 202 and 204 vertically offset from each other, the end-effectors may be in the same plane.

The T1, T2, T3 and T4 shafts of the robot drive unit 206 may be rotated so that the left end-effector 202 and right end-effector 204 can access individually or simultaneously various offset and radial stations 12, 14, as illustrated diagrammatically in FIGS. 5A-5H. In another example embodiment, the robot may feature four end-effectors, which may operate in stacked and side-by-side arrangements. As an alternative to the example internal arrangement of FIGS. 4C-4D, the upper arms of the robot arm may be driven by a robot drive unit with a two-axis spindle, and the forearms may be driven by a pair of actuators, one actuator attached to each of the two upper arms of the robot arm. In particular, one actuator may be attached to the left upper arm and drive the left forearm, and the other actuator may be attached to the right upper arm and drive the right forearm. The actuators may be connected to the forearms directly, similarly to the example configuration of FIGS. 15A-15B, or they may be coupled to the forearms via a band, belt or cable arrangement, similarly to the example configuration of FIGS. 16A-16B.

Figure 6C:
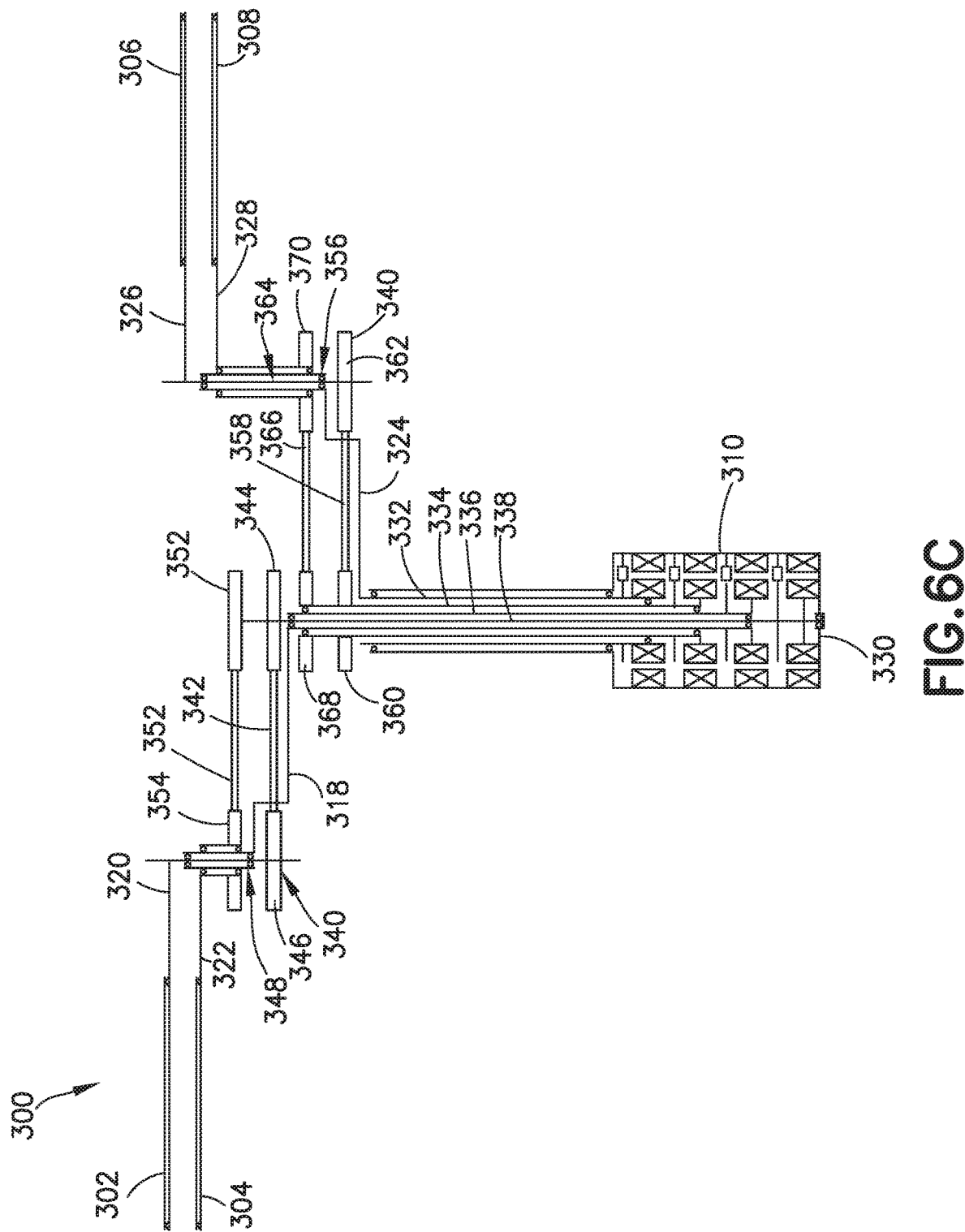
FIG. 6A is a top view of a robot in the substrate processing apparatus shown in FIGS. 5A-5H.
FIG. 6B is a side view of the robot illustrated in FIG. 6A, FIG. 6C-6D are schematic views illustrating some of the components of the robot shown in FIGS. 6A-6B, FIGS. 7A-7H and 8A-8G illustrate examples of substrate movements in a substrate processing apparatus comprising features as described herein.

Referring also to FIGS. 6A-6C, another example embodiment of the robot is shown. In this example embodiment the robot 300 comprises four end-effectors 302, 304, 306, 308. FIG. 6A shows a top view of the robot 300 and FIG. 6B depicts a side view of the robot 300. The robot 300, in this example, comprises a robot drive unit 310 and a robot arm 312. The robot arm 312 may feature linkages such as a left linkage 314 and a right linkage 316 for example.

The left linkage 314 may consist of a left upper arm 318, a left upper forearm 320 with a left upper end-effector 302 having the substrate support area A and a left lower forearm 322 with a left lower end-effector 304 having the substrate support area B. Similarly, the right linkage 316 may consist of a right upper arm 324, a right upper forearm 326 with a right upper end-effector 306 having the substrate support area C and a right lower forearm 328 with a right lower end-effector 308 having the substrate support area D.

An example internal arrangement of the robot 300 is depicted diagrammatically in FIGS. 6C-6D (note that the orientations of the end-effectors with respect to the upper arms in diagram (c) may neither correspond to the configuration shown in FIG. 6A nor represent any practical arrangement; the orientations were selected solely to visualize the internal arrangement of the robot in a clear manner, and the end-effectors may be angularly offset from the depicted orientations as required by the application at hand). . . . The robot arm 312 may be driven by the robot drive unit 310 with a four-axis spindle 330 with four coaxial shafts, e.g., an outer T1 shaft 332, a T2 shaft 334, a T3 shaft 336 and an inner T4 shaft 338.

The left upper arm 318 of the robot arm 312 may be attached directly to the T3 shaft. The left upper forearm 320 may be coupled to the left upper arm 318 via a rotary joint (left elbow joint) 340, and actuated by the T4 shaft using a belt arrangement 342. The belt arrangement 342 may comprise a left shoulder pulley 344, which may be attached to the T2 shaft, a left elbow pulley 346, which may be attached to the left upper forearm 318, and a band, belt or cable, which may transmit motion between the two pulleys 344, 346. The belt arrangement 342 may feature a constant or variable transmission ratio. As an example, the variable transmission ratio may be selected so that the orientation of the left upper forearm 320 with the left upper end-effector 302 changes in a predefined manner as a function of the relative position of the left upper arm 318 and the T4 shaft. However, any other suitable arrangement may be used.

Similarly, the left lower forearm 322 may be coupled to the left upper arm 318 via a rotary joint (left elbow joint) 348, and its orientation may be controlled by the T4 shaft using another band, belt or cable arrangement 350. The belt arrangement 350 may be configured in a crossover configuration, as illustrated in FIG. 6D. It may comprise a shoulder pulley 352, which may be attached to the T4 shaft, a left elbow pulley 354, which may be attached to the left lower forearm 322, and a band, belt or cable, which may transmit motion between the two pulleys 352, 354. The belt arrangement 350 may feature a constant or variable transmission ratio. As an example, the variable transmission ratio may be selected so that the orientation of the left lower forearm 322 with the left end-effector 304 changes in a predefined manner as a function of the relative position of the left upper arm 318 and the T4 shaft. However, any other suitable arrangement may be used.

Referring still to FIG. 6C, the right upper arm 324 of the robot arm 312 may be attached directly to the T1 shaft. The right upper forearm 326 may be coupled to the right upper arm 324 via a rotary joint (right elbow joint) 356, and actuated by the T2 shaft using a belt arrangement 358. The belt arrangement 358 may comprise a shoulder pulley 360, which may be attached to the T2 shaft, a right elbow pulley 362, which may be attached to the right upper forearm 326, and a band, belt or cable, which may transmit motion between the two pulleys 360, 362. The belt arrangement 358 may feature a constant or variable transmission ratio. As an example, the variable transmission ratio may be selected so that the orientation of the right upper forearm 326 with the right end-effector 306 changes in a predefined manner as a function of the relative position of the right upper arm 324 and the T2 shaft. However, any other suitable arrangement may be used.

The right lower forearm 328 may be coupled to the right upper arm 324 via a rotary joint (right elbow joint) 364, and its orientation may be controlled by the T2 shaft using another band, belt or cable arrangement 366. The belt arrangement 366 may be configured in a crossover configuration, as illustrated in FIG. 6D. It may comprise a shoulder pulley 368, which may be attached to the T2 shaft, a right elbow pulley 370, which may be attached to the right lower forearm 328, and a band, belt or cable, which may transmit motion between the two pulleys 368, 370. The belt arrangement 366 may feature a constant or variable transmission ratio. As an example, the variable transmission ratio may be selected so that the orientation of the right lower forearm 328 with the right lower end-effector 308 changes in a predefined manner as a function of the relative position of the right upper arm 324 and the T2 shaft. However, any other suitable arrangement may be used.

Note that although the example embodiment of FIGS. 6A-6C shows end-effectors 302 and 306 vertically offset from each other, the end-effectors may be in the same plane if the geometry of the arm, the transmission ratios of the band drives and/or the sequence of operation of the arm allow the end-effectors to clear each other. The same applies to end-effectors 304 and 308.

Considering an example robot arm where all band drives feature constant transmission ratios, the kinematics of the left linkage in terms of angular orientations of the drive shafts and individual links of the linkage (i.e., the left upper arm, forearm 320 with end-effector 302 and forearm 322 with end-effector 304 maybe described as follows:

$$\theta_i(t)=\theta_{i0}+\Delta\theta_i(t), \; i=302, 304 \; (A, B) \tag{1}$$

where $\theta_i$ is orientation of end-effector i, $\theta_{i0}$ is initial orientation of end-effector i, $\Delta\theta_i$ is change in orientation of end-effector i, and t is time. The change in orientation of end-effector i can be expressed as:

$$\Delta\theta_i(t)=\Delta\theta_{i1}(t)+\Delta\theta^i(t), \; i=302, 304 \; (A, B) \tag{2}$$

where $\Delta\theta_{i1}$ is relative orientation of end-effector i with respect to the left upper arm, and $\Delta\theta_1$ is change in orientation of the left upper arm. The relative orientation of end-effector i with respect to the left upper arm can be written as:

$$\Delta\theta_{i1}(t)=n_i[\Delta\theta_2(t)-\Delta\theta_1(t)] \tag{3}$$

where $n_i$ is the transmission ratio associated with end-effector i, and $\Delta\theta_2$ is change in orientation of drive shaft 332 or 334 (T1 or T2). The transmission ratio $n_i$ may be positive for end-effector 302 (A) and negative for end-effector 304 (B), reflecting the crossover belt configuration. The change in orientation of the left upper arm 318, which is driven by drive shaft 336 (T3), and the change in orientation of drive shaft 332 or 334 (T1 or T2) can be calculated as:

$$\Delta\theta_1(t)=\theta_1(t)-\theta_{10} \tag{4}$$

$$\Delta\theta_2(t)=\theta_2(t)-\theta_{20} \tag{5}$$

where $\theta_{10}$ and $\theta_{20}$ are initial orientations of drive shaft 332 (T1) and drive shaft 334 (T2), respectively. Equations (1) to (5) may be combined to obtain the following expression for orientation of end-effectors 302 (A) and 304 (B) as a function of orientations of drive shafts T1 and T2:

$$\theta_i(t)=\theta_{10}+(1-n_i)\Delta\theta_1(t)+n_i\Delta\theta_2(t), \; i=302, 304 \; (A, B) \tag{6}$$

where $$\Delta\theta_1(t)=\theta_1(t)-\theta_{10} \tag{7}$$

$$\Delta\theta_2(t)=\theta_2(t)-\theta_{20} \tag{8}$$

Similarly, the kinematics of the right linkage in terms of angular orientations of drive shafts 336, 338 (T3 and T4) and individual links of the right linkage (i.e., the right upper arm 324, forearm 326 with end-effector 306 and forearm 328 with end-effector 308 can be described by the following expressions (see Table 1 for nomenclature):

$$\theta_i(t)=\theta_{i0}+(1-n_i)\Delta\theta_3(t)+n_i\Delta\theta_4(t), \; i=306, 308 \; (C, D) \tag{9}$$

where $$\Delta\theta_3(t)=\theta_3(t)-\theta_{30} \tag{10}$$

$$\Delta\theta_4(t)=\theta_4(t)-\theta_{40} \tag{11}$$

In order to illustrate the above kinematic equations, consider an example arm with the transmission ratios of $n_A=1$, $n_B=-1$, $n_C=1$ and $n_D=-1$, and assume that the arm is initially in the retracted position of FIG. 7A, i.e., $\theta_{1ret}=225$ deg, $\theta_{Aret}=90$ deg, $\theta_{Bret}=90$ deg, $\theta_{3ret}=315$ deg, $\theta_{Cret}=90$ deg and $\theta_{Dret}=90$ deg.

Figure 7F:
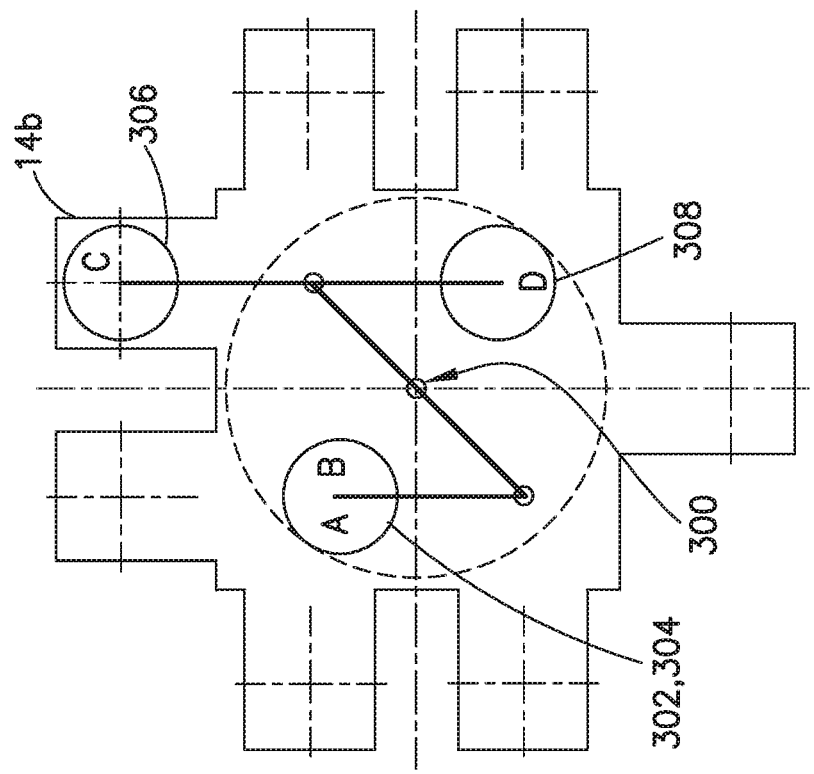
Figure 7E:
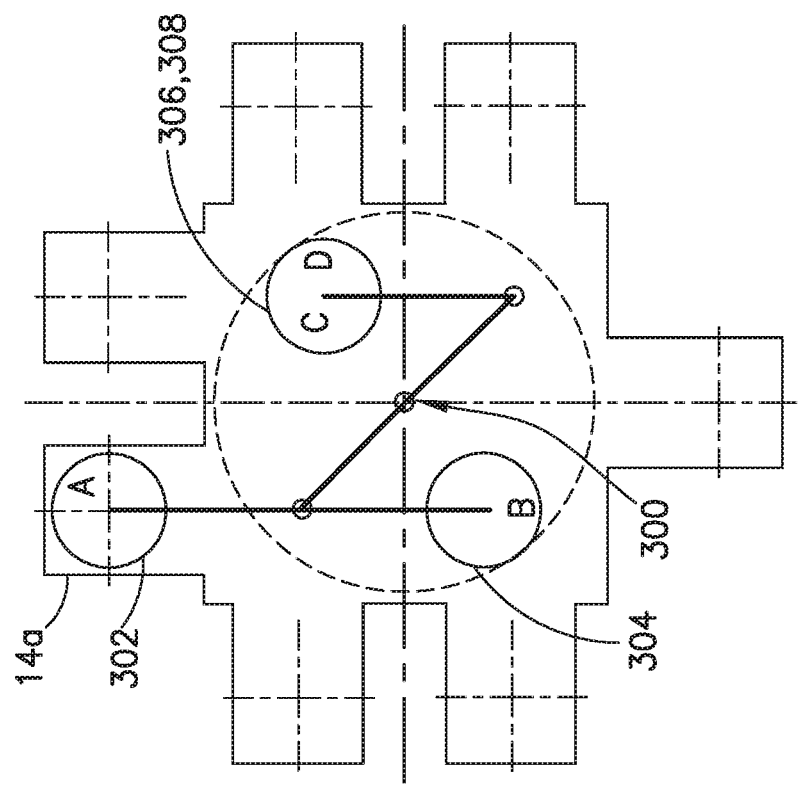

When drive shaft 1 rotates by 90 degrees in the clockwise direction (i.e., $\Delta\theta_1=-90$ deg) and when drive shaft T2 is kept stationary ($\Delta\theta_2=0$ deg), end-effector 302 will extend and reach the final extended position with orientation of $\theta_{AextA}=90$ degrees while end effector 304 will rotate by 180 degrees in the clockwise direction ($\Delta\theta_B=-180$ deg) and reach final orientation of $\theta_{BextA}=270$ deg, as shown in FIG. 7E. Note that in this illustrative example end-effector A may not move from the initial retracted position to the final extended position along a straight line; as explained later, drive shaft T2 will need to be rotated in coordination with drive shaft T1 in order to extend end-effector A along a straight-line path; however, the total rotation of drive shaft T2 between the initial position and the final position will remain zero.

Figure 7D:
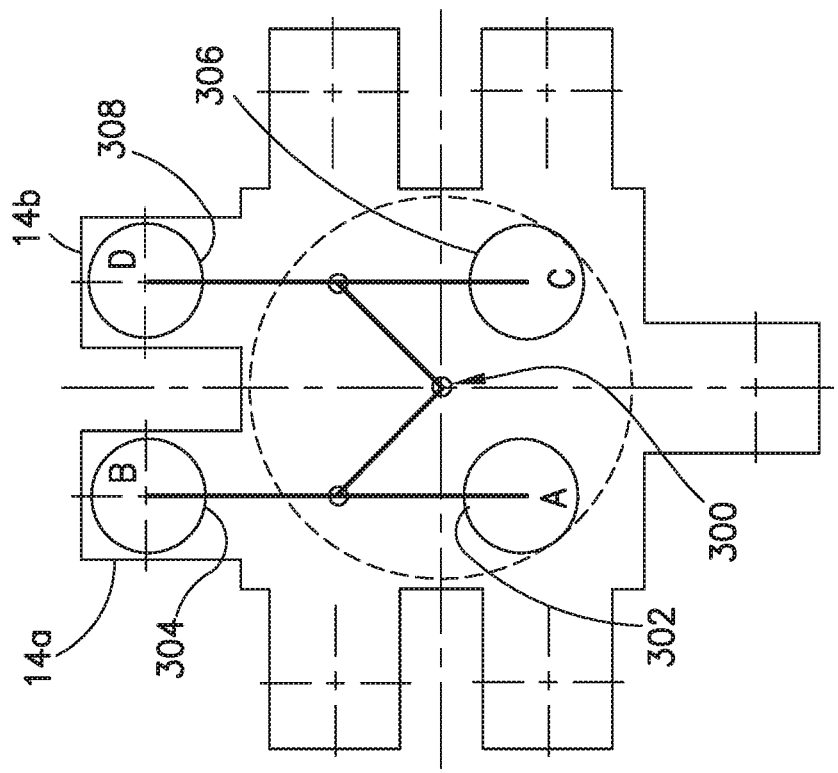
Figure 7C:
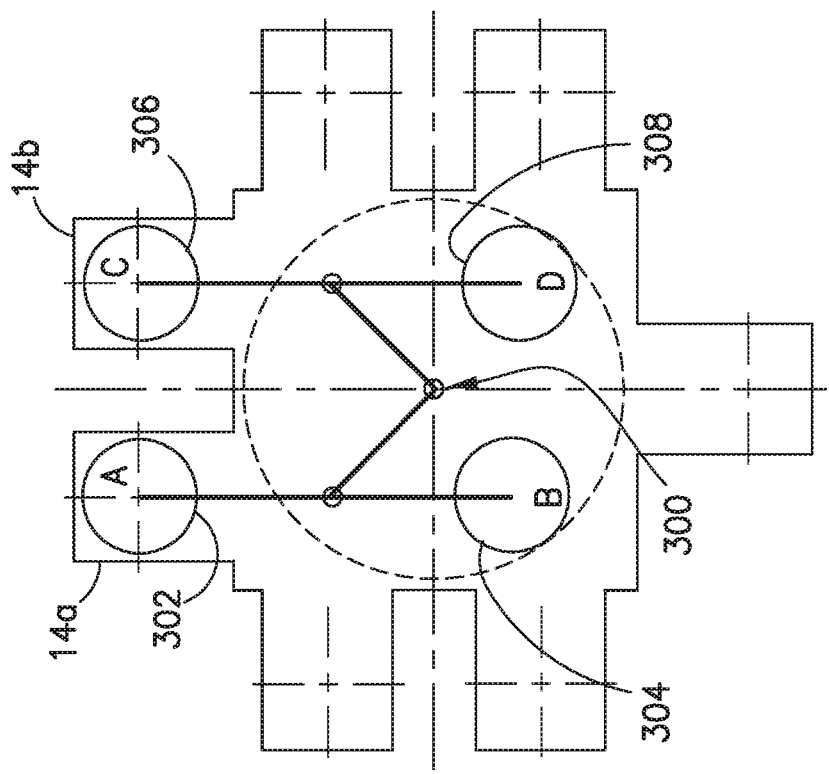
Figure 7H:
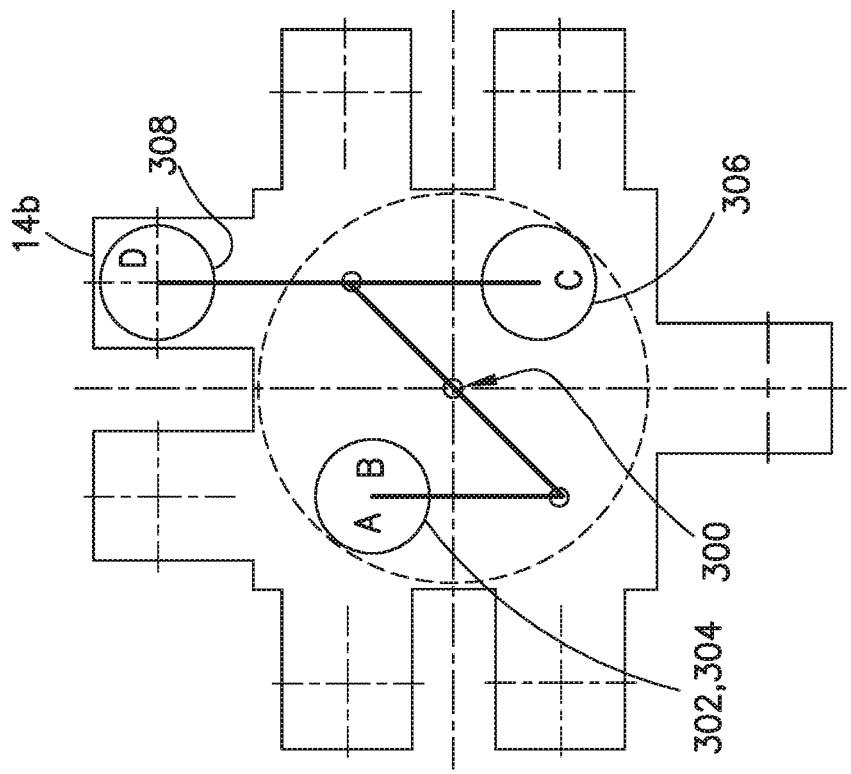
Figure 7G:
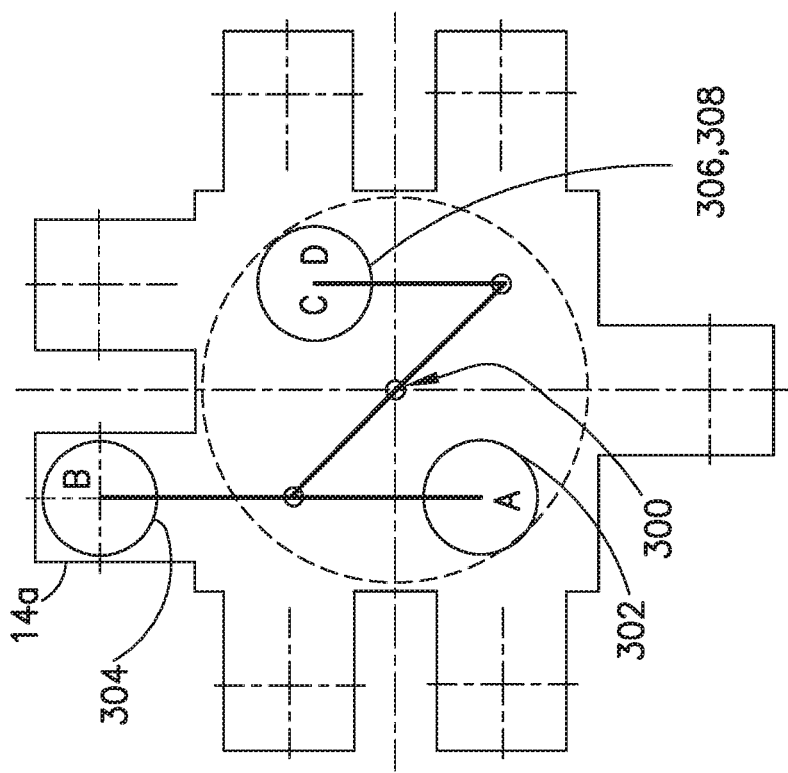

When drive shaft T1 rotates by 90 degrees in the clockwise direction ($\Delta\theta_1=-90$ deg) and when drive shaft T2 rotates by 180 degrees in the same direction ($\Delta\theta_2=-180$ deg), end-effector 304 will extend and reach the final extended position with orientation of $\theta_{BextB}=90$ deg while end effector 302 will rotate by 180 degrees in the clockwise direction ($\Delta\theta_A=-180$ deg) and reach final orientation of $\theta_{AextB}=270$ degrees, as shown in FIG. 7G.

Similarly, when drive shaft T3 rotates by 90 degrees in the counterclockwise direction ($\Delta\theta_3=90$ deg) and when drive shaft T4 is kept stationary ($\Delta\theta_4=0$ deg), end-effector 306 will extend and reach the final extended position with orientation of $\theta_{CextC}=90$ deg while end effector 308 will rotate by 180 degrees in the counterclockwise direction ($\Delta\theta_D=180$ deg) and reach final orientation of $\theta_{DextC}=270$ deg, as shown in FIG. 7F. Note that in this illustrative example end-effector C may not move from the initial retracted position to the final extended position along a straight line; as explained later, drive shaft T4 will need to be rotated in coordination with drive shaft T3 in order to extend end-effector C along a straight-line path; however, the total rotation of drive shaft T4 between the initial position and the final position will remain zero.

Finally, when drive shaft T3 rotates by 90 degrees in the counterclockwise direction ($\Delta\theta_3=90$ deg) and when drive shaft T4 rotates by 180 deg in the clockwise direction ($\Delta\theta_4=180$ deg), end-effector 308 will extend and reach the final extended position with orientation of $\theta_{DextD}=90$ deg while end effector 306 will rotate by 180 degrees in the counterclockwise direction ($\Delta\theta_C=180$ deg) and reach final orientation of $\theta_{CextD}=270$ deg, as shown in FIG. 7H.

Utilizing Equations (7) to (9), the direct kinematics associated with end-effectors 302, 304 (A and B) (i.e., the relationship between the positions of end-effectors 302, 304 and angular orientations of drive shafts T1 and T2) may be summarized as follows (see Table 1 for nomenclature):

$$x_i(t)=1, \cos\theta_1(t)+1, \cos\theta_i(t), i=302, 304 \ (A, B) \quad (12)$$

$$y_i(t)=1, \sin\theta_1(t)+1, \sin\theta_i(t), i=302, 304 \ (A, B) \quad (13)$$

where $$\theta_i(t)=\theta_{10}+(1-n_i)\Delta\theta_1(t)+n_i\Delta\theta_2(t), i=302, 304 \ (A, B) \quad (14)$$

and $$\Delta\theta_1(t)=\theta_1(t)-\theta_{10} \quad (15)$$

$$\Delta\theta_2(t)=\theta_2(t)-\theta_{20} \quad (16)$$

The direct kinematic equations (12) to (16) may be used to determine the coordinates of end-effectors 302, 304 (A, B) based on angular positions of drive shafts T1 and T2.

The direct kinematics associated with end-effectors 306, 308 (C and D) may be summarized as follows (see Table 1 for nomenclature):

$$x_i(t)=l_3 \cos\theta_3(t)+l_i \cos\theta_i(t), i=306, 308 \ (C, D) \quad (17)$$

$$y_i(t)=l_3 \sin\theta_3(t)+l_i \sin\theta_i(t), i=306, 308 \ (C, D) \quad (18)$$

where $$\theta_i(t)=\theta_{i0}+(1-n_i)\Delta\theta_3(t)+n_i\Delta\theta_4(t), i=306, 308 \ (C, D) \quad (19)$$

and $$\Delta\theta_3(t)=\theta_3(t)-\theta_{30} \quad (20)$$

$$\Delta\theta_4(t)=\theta_4(t)-\theta_{40} \quad (21)$$

Note that Equations (9) to (11) have been utilized to obtain the above expressions. The direct kinematic equations (17) to (21) may be used to determine the coordinates of end-effectors 306, 308 (C, D) based on angular positions of drive shafts T3 and T4.

If band drives with variable transmission ratios are employed, equations (14) and (19) need to be replaced by relationships that represent the characteristics of the specific band arrangement(s). As an example, a look-up table for $\Delta\theta_A$ and $\Delta\theta_B$ as a function of ($\Delta\theta_2$-$\Delta\theta_1$) and another look-up table for $\Delta\theta_C$ and $\Delta\theta_D$ as a function of ($\Delta\theta_4$-$\Delta\theta_3$) may be conveniently used.

The inverse kinematic equations for the left linkage can be obtained by solving the direct kinematic equations for orientations of drive shafts T1 and T2 as a function of orientation of end-effector 302 or end-effector 304 (see Table 1 for nomenclature):

$$\theta_1(t)=T_i(t)-\alpha_i(t), i=302 \text{ or } 304 \ (A \text{ or } B) \quad (22)$$

$$\theta_i(t)=T_i(t)+\beta_i(t), i=302 \text{ or } 304 \ (A \text{ or } B) \quad (23)$$

where $$\alpha_i(t)=\text{acos } [R_i^2(t)+l_1^2-l_i^2]/[2 R_i(t)l_1], i=302 \text{ or } 304 \ (A \text{ or } B) \quad (24)$$

$$\beta_i(t)=\text{acos } [(R_i^2(t)-l_1^2+l_i^2]/[2R_i(t)l_i], i=302 \text{ or } 304 \ (A \text{ or } B) \quad (25)$$

and $$R_i(t)=\sqrt{x_i^2(t)+y_i^2(t)}, i=302 \text{ or } 304 \ (A \text{ or } B) \quad (26)$$

$$T_i(t)=\text{atan } [y_i(t)/x_i(t)], i=302 \text{ or } 304 \ (A \text{ or } B) \quad (27)$$

When the position of end-effector 302 is used as the input to the inverse kinematic calculations, the angular orientation of drive shaft T2 can be determined based on the following expression:

$$\theta_2(t)=\theta_{20}+[\theta_A(t)-\theta_{A0}+(n_A-1)(\theta_1(t)-\theta_{10})]/n_A \quad (28)$$

Or, when the position of end-effector 304 is used as the input to the inverse kinematic calculations, the angular orientation of drive shaft T2 can be determined based on the following expression:

$$\theta_2(t)=\theta_{20}+[\theta_B(t)-\theta_{B0}+(n_B-1)(\theta_1(t)-\theta_{10})]/n_B \quad (29)$$

Similarly, the inverse kinematic equations for the right linkage can be obtained by solving the direct kinematic equations for orientations of drive shafts T3 and T4 as a function of orientation of end-effector 306 (C) or end-effector 308 (D) (see Table 1 for nomenclature):

$$\theta_3(t)=T_i(t)-\alpha_i(t), i=306 \text{ or } 308 \ (C \text{ or } D) \quad (30)$$

$$\theta_i(t)=T_i(t)+\beta_i(t), i=306 \text{ or } 308 \ (C \text{ or } D) \quad (31)$$

where $$\alpha_i(t)=\text{acos } [R_i^2(t)+l_3^2-l_i^2]/[2R_i(t)l_3], i=306 \text{ or } 308 \ (C \text{ or } D) \quad (32)$$

$$\beta_i(t)=\text{acos } [(R_i^2(t)-l_3^2+l_i^2]/[2R_i(t)l_i], i=306 \text{ or } 308 \ (C \text{ or } D) \quad (33)$$

and $$R_i(t)=\sqrt{x_i^2(t)+y_i^2(t)}, i=306 \text{ or } 308 \ (C \text{ or } D) \quad (34)$$

$$T_i(t)=\text{atan } [y_i(t)/x_i(t)], i=306 \text{ or } 308 \ (C \text{ or } D) \quad (35)$$

When the position of end-effector 306 is used as the input to the inverse kinematic calculations, the angular orientation of drive shaft T4 can be determined based on the following expression:

$$\theta_4(t) = \theta_{40} + [\theta_C(t) - \theta_{C0} + (n_C - 1)(\theta_3(t) - \theta_{30})]/n_C \quad (36)$$

Or, when the position of end-effector D is used as the input to the inverse kinematic calculations, the angular orientation of drive shaft 4 can be determined based on the following expression:

$$\theta_4(t) = \theta_{40} + [\theta_D(t) - \theta_{D0} + (n_D - 1)(\theta_3(t) - \theta_{30})]/n_D \quad (37)$$

In order for the entire robot arm to rotate, all drive shafts, i.e., T1, T2, T3, and T4, need to move in the desired direction of rotation of the arm by the same amount with respect to a fixed reference frame. This is depicted diagrammatically in FIGS. 7A-7B. In this particular example, the entire robot arm rotates in the clockwise direction by 90 degrees.

In order for the left upper end-effector 302 to extend from the retracted position of FIG. 7A to a left offset station 14a along a predefined path, such as a straight-line path, as depicted diagrammatically in the example of FIG. 7E, shafts T1 and T2 may need to be rotated in a coordinated manner. More specifically, the inverse kinematic equations for the left upper end-effector 302 (Equations (22) to (28)) may be utilized to determine the orientation of the T1 and T2 shafts as a function of the position of the left end-effector 302. As illustrated in the figure, the left lower end-effector 304 may rotate out of the way as the left upper end-effector 302 extends to the station 14a. The left upper end-effector 302 may be retracted by rotating the T1 and T2 shafts backward in a similar manner.

In the above example of moving end-effector 302 between the retracted position of FIG. 7A and the extended position of FIG. 7E, the following orientations of the individual links of the left linkage are shown: in the retracted position, $\theta_{1ret}=225$, $\theta_{Aret}=90$ deg and $\theta_{Bret}=90$ deg; in the extended position, $\theta_{1ext}=135$, $\theta_{AextA}=90$ deg and $\theta_{BextA}=270$ deg. With example transmission ratios of $n_A=1$ and $n_B=-1$, when end-effector 302 extends, drive shaft T1 may be actuated to rotate by 90 degrees in the clockwise direction and drive shaft T2 is actuated to rotate in a coordinated manner so that end-effector A follows the desired path; in this particular example, the total rotation of drive shaft T2 is zero, i.e., the initial and final angular positions of drive shaft T2 are the same. Drive shaft T1 may be actuated to rotate by 90 degrees in the counterclockwise direction and drive shaft T2 is actuated to rotate in an opposite manner when end-effector 302 retracts.

In order for the left lower end-effector 304 to extend from the retracted position of FIG. 7A to the same left offset station 14a along a predefined path, such as a straight-line path, as depicted diagrammatically in the example of FIG. 7G, shafts T1 and T2 may rotate in a coordinated manner in accordance with the inverse kinematic equations for the left lower end-effector 304 (Equations (22) to (27) and (29)). As illustrated in the figure, the left upper end-effector 302 may swing out of the way as the left lower end-effector 304 extends to the station 14a. The left lower end-effector 304 may be retracted by rotating the T1 and T2 shafts backward in a similar manner In the above example of moving end-effector 304 between the retracted position of FIG. 7A and the extended position of FIG. 7G, the following orientations of the individual links of the left linkage are shown: in the retracted position, $\theta_{1ret}=225$, $\theta_{Aret}=90$ deg and $\theta_{Bret}=90$ deg; in the extended position, $\theta_{1ext}=135$, $\theta_{AextB}=270$ deg and $\theta_{BextB}=90$ deg. Again, with the example transmission ratios of $n_A=1$ and $n_B=-1$, when end-effector 304 extends, drive shaft T1 may be actuated to rotate by 90 degrees in the clockwise direction and drive shaft T2 is actuated to rotate by 180 degrees in the same direction. The two drive shafts may be actuated to rotate by the same amounts in the opposite direction when end-effector 304 retracts.

The above operations may be utilized to pick/place a wafer or substrate from/to an offset station 14. A sequence of a pick operation with one end-effector, such as 302 for example, followed by a place operation with the other end-effector, such as 304 for example, may be used to quickly exchange wafers/substrates at the offset station (rapid exchange operation). As an example, the left upper end-effector 302 may be extended to a station, pick a wafer, and retract. The left lower end-effector 304, which may carry another wafer, may then extend to the same station, place the wafer, and retract.

In order for the right upper end-effector 306 to extend from the retracted position of FIG. 7A to a right offset station 14b along a predefined path, such as a straight-line path, as depicted diagrammatically in the example of FIG. 7F, shafts T3 and T4 may need to be rotated in a coordinated manner. More specifically, the inverse kinematic equations for the right upper end-effector 306 (Equations (30) to (36)) may be utilized to determine the orientation of the T3 and T4 shafts as a function of the position of the right upper end-effector 306. As illustrated in the figure, the right lower end-effector 308 may rotate out of the way as the right upper end-effector 306 extends to the station. The right upper end-effector 306 may be retracted by rotating the T3 and T4 shafts backward in a similar manner.

In the above example of moving end-effector 306 between the retracted position of FIG. 7A and the extended position of FIG. 7F, the following orientations of the individual links of the right linkage are shown: in the retracted position, $\theta_{3ret}=315$, $\theta_{Cret}=90$ deg and $\theta_{Dret}=90$ deg; in the extended position, $\theta_{1ext}=45$, $\theta_{CextC}=90$ deg and $\theta_{DextC}=270$ deg. With example transmission ratios of $n_C=1$ and $n_D=-1$, when end-effector 306 extends, drive shaft T3 may be actuated to rotate by 90 degrees in the counterclockwise direction and drive shaft T4 is actuated to rotate in a coordinated manner so that end-effector 306 (C) follows the desired path; in this particular example, the total rotation of drive shaft T4 is zero, i.e., the initial and final angular positions of drive shaft T4 are the same. . . . Drive shaft T3 may be actuated to rotate by 90 degrees in the clockwise direction and drive shaft T4 is actuated to rotate in an opposite manner when end-effector 306 retracts.

In order for the right lower end-effector 308 to extend from the retracted position of FIG. 7A to the same right offset station 14b along a predefined path, such as a straight-line path, as depicted diagrammatically in the example of FIG. 7H, shafts T3 and T4 may rotate in a coordinated manner in accordance with the inverse kinematic equations for the right lower end-effector 308 (Equations (30) to (35) and (37)). As illustrated in the figure, the right upper end-effector 306 may swing out of the way as the right lower end-effector 308 extends to the station 14b. The right lower end-effector 308 may be retracted by rotating the T3 and T4 shafts backward in a similar manner.

In the above example of moving end-effector 308 between the retracted position of FIG. 7A and the extended position of FIG. 7H, the following orientations of the individual links of the left linkage are shown: in the retracted position, $\theta_{1ret}=315$, $\theta_{Cret}=90$ deg and $\theta_{Dret}=90$ deg; in the extended position, $\theta_{1ext}=135$, $\theta_{CextD}=270$ deg and $\theta_{DextD}=90$ deg. Considering again the example transmission ratios of $n_C=1$ and $n_D=-1$, when end-effector 308 extends, drive shaft T3 may be actuated to rotate by 90 degrees in the counterclockwise direction and drive shaft T4 is actuated to rotate by 180 degrees in the same direction. The two drive shafts may be actuated to rotate by the same amounts in the opposite direction when end-effector 308 retracts.

Again, the above operations may be utilized to pick/place a wafer from/to an offset station. A sequence of a pick operation with one end-effector followed by a place operation with the other end-effector may be used to quickly exchange a wafer at an offset station (rapid exchange operation). As an example, the right upper end-effector 306 may be extended to a station, pick a wafer, and retract. The right lower end-effector 308, which may carry another wafer, may then extend to the same station 14b, place the wafer, and retract.

The left upper end-effector 302 and the right upper end-effector 306 may also be extended (retracted) simultaneously to (from) the respective left and right offset stations by performing simultaneously the extension (retraction) operations described above with respect to FIGS. 7E and 7F. This is illustrated in FIG. 7C.

Furthermore, the placement positions for the left upper end-effector 302 and the right upper end-effector 306 may be independently adjusted (see FIG. 1F). As an example, this functionality may be conveniently utilized to compensate for any misalignment of the two wafers on the robot end-effectors and deliver accurately the two wafers to the desired locations in the respective stations.

The left lower end-effector 304 and the right lower end-effector 308 may also be extended (retracted) simultaneously to (from) the respective left and right offset stations 14a, 14b by performing simultaneously the extension (retraction) operations described above with respect to FIGS. 7G and 7H. This is illustrated in FIG. 7D.

Again, the placement positions for the left lower end-effector 304 and the right lower end-effector 308 may be independently adjusted. As explained earlier, this functionality may be used, for instance, to compensate for any misalignment of the two wafers on the robot end-effectors and deliver accurately the two wafers to the desired locations in the respective stations.

A sequence of a pick operation with one pair of end-effectors, for example end-effectors 302 and 306, followed by a place operation with the other pair of end-effectors, in this particular example end-effectors 304 and 308, may be used to quickly exchange a pair of wafers at a pair of side-by-side offset stations, such as 14a and 14b for example (rapid exchange operation in a pair of side-by-side offset stations). In the above example, the left upper end-effector 302 and the right upper end-effector 306 may be extended to a pair of side-by-side offset stations, pick a pair of wafers, and retract from the stations. The left lower end-effector 304 and the right lower end-effector 308, which may carry another pair of wafers, may then extend to the same pair of stations, place a different pair of wafers, respectively, and retract from the stations.

Each of the end-effectors of the robot, namely the left upper end-effector 302, the left lower end-effector 304, the right upper end-effector 306 and the right lower end-effector 308, may also access radially oriented stations (FIG. 1A).

Figure 8E:
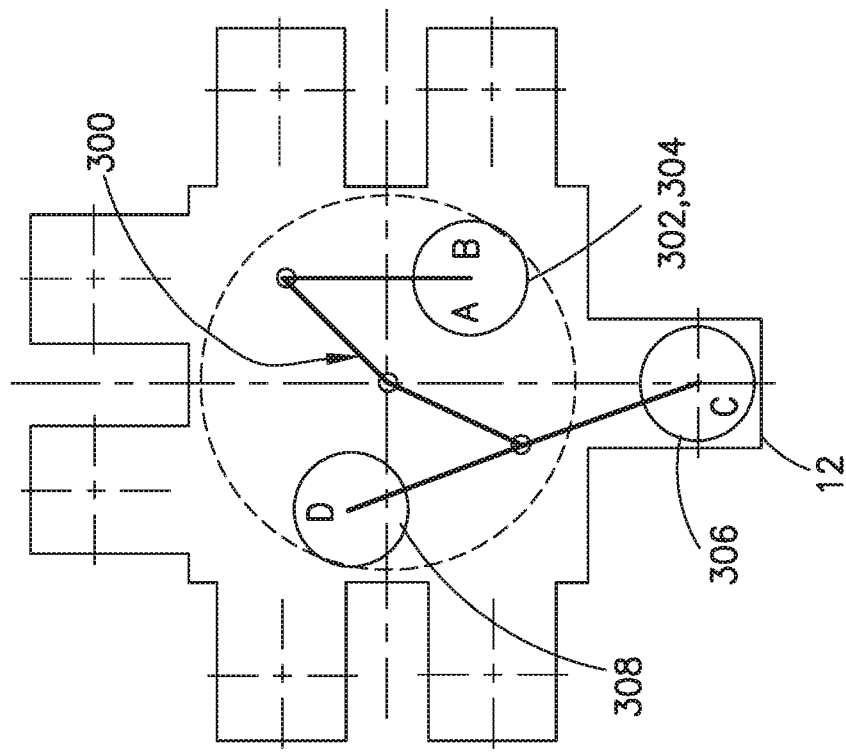
Figure 8D:
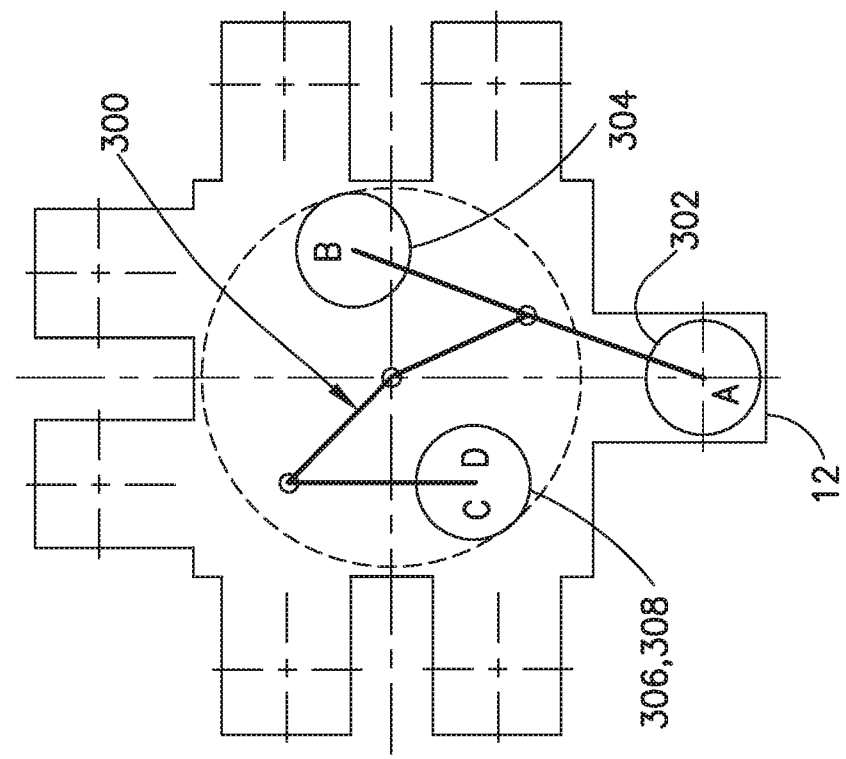

In order for the left upper end-effector 302 to extend to a radial station 12 along a predefined path, such as a radial straight-line path, as depicted diagrammatically in the example of FIG. 8D, shafts T1 and T2 may rotate in a coordinated manner in accordance with the inverse kinematic equations for the left upper end-effector 302. As illustrated in the figure, the left lower end-effector 304 may rotate out of the way as the left upper end-effector 302 extends to the station 12. The left upper end-effector 302 may be retracted by rotating the T1 and T2 shafts backward in a similar manner.

Figure 8G:
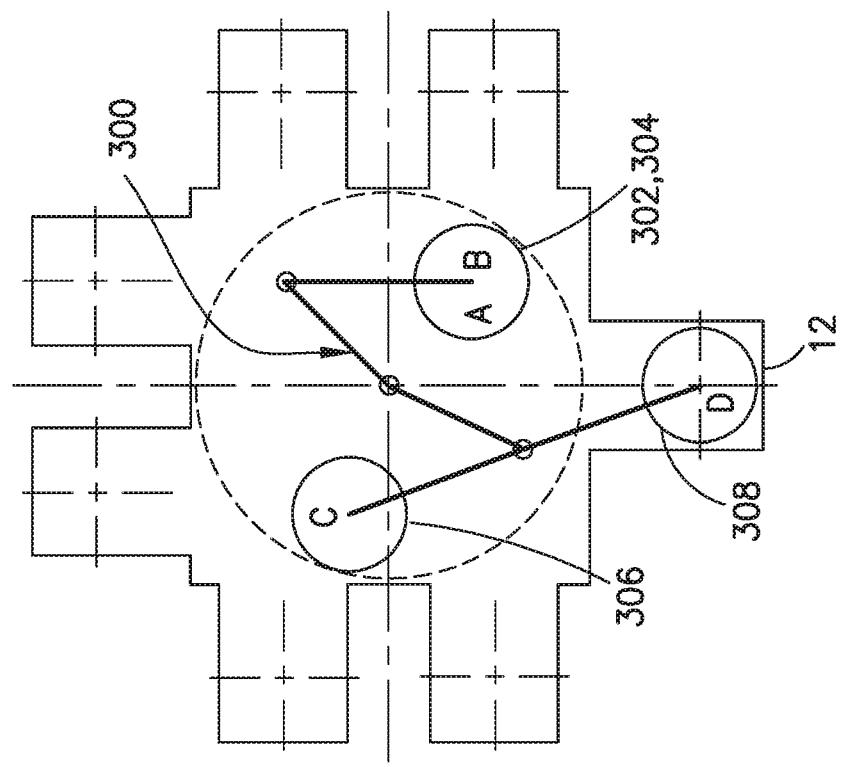
Figure 8F:
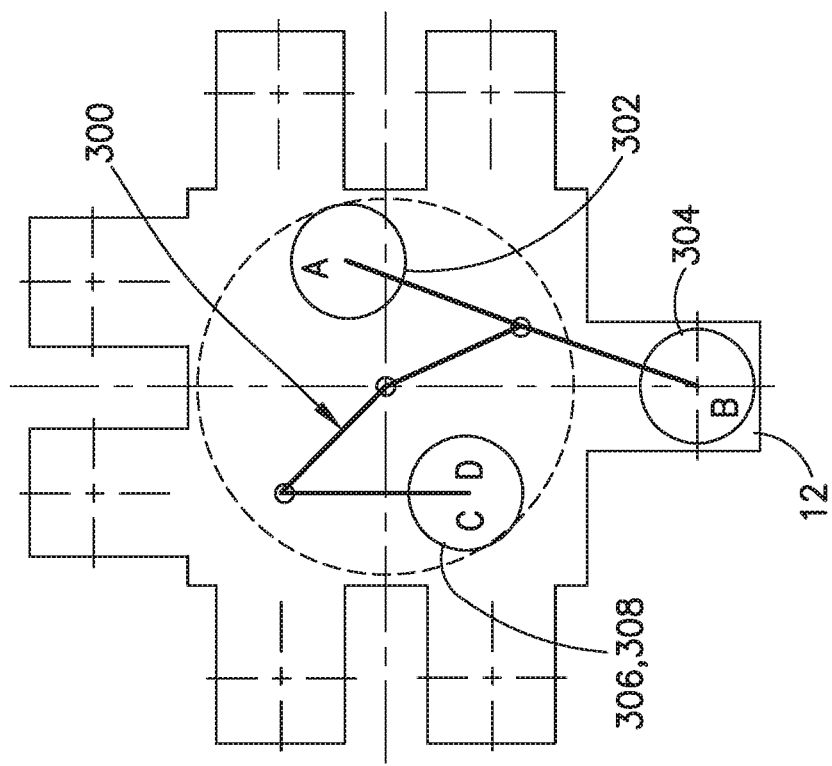

In order for the left lower end-effector 304 to extend to the same radial station 12 along a predefined path, such as a radial straight-line path, as depicted diagrammatically in the example of FIG. 8F, shafts T1 and T2 may rotate in a coordinated manner in accordance with the inverse kinematic equations for the left lower end-effector 304. As illustrated in the figure, the left upper end-effector 302 may swing out of the way as the left lower end-effector 304 extends to the station 12. The left lower end-effector 304 may be retracted by rotating the T1 and T2 shafts backward in a similar manner.

The above operations may be utilized to pick/place a wafer from/to a radial station 12. Again, a sequence of a pick operation with one end-effector followed by a place operation with the other end-effector may be used to quickly exchange a wafer at a radial station (rapid exchange operation).

In order for the right upper end-effector 306 to extend to a radial station 12 along a predefined path, such as a radial straight-line path, as depicted diagrammatically in the example of FIG. 8E, shafts T3 and T4 may rotate in a coordinated manner in accordance with the inverse kinematic equations for the right upper end-effector 306. As illustrated in the figure, the right lower end-effector 308 may rotate out of the way as the right upper end-effector 306 extends to the station 12. The right upper end-effector 306 may be retracted by rotating the T3 and T4 shafts backward in a similar manner.

In order for the right lower end-effector 308 to extend to the same radial station along a predefined path, such as a radial straight-line path, as depicted diagrammatically in the example of FIG. 8G, shafts T3 and T4 may rotate in a coordinated manner in accordance with the inverse kinematic equations for the right lower end-effector 308. As illustrated in the figure, the right upper end-effector 306 may swing out of the way as the right lower end-effector 308 extends to the station 12. The right lower end-effector 308 may be retracted by rotating the T3 and T4 shafts backward in a similar manner.

The above operations may be utilized to pick/place a wafer from/to a radial station 12. A sequence of a pick operation with one end-effector followed by a place operation with the other end-effector may be used to quickly exchange a wafer at an offset station (rapid exchange operation).

The left upper end-effector 302 and the right upper end-effector 306 may also be extended (retracted) simultaneously to (from) a pair of vertically stacked radial stations 12 by performing simultaneously the extension (retraction) operations described above with respect to FIGS. 8D and 8E. This is illustrated in FIG. 8B.

The placement positions for the left upper end-effector 302 and the right upper end-effector 306 may be independently adjusted. As an example, this functionality may be conveniently utilized to compensate for any misalignment of the two wafers on the robot end-effectors and deliver accurately the two wafers to the desired locations in the respective radial stations.

The left lower end-effector 304 and the right lower end-effector 308 may also be extended (retracted) simultaneously to (from) a pair of vertically stacked radial stations by performing simultaneously the extension (retraction) operations described above with respect to FIGS. 8F and 8G. This is illustrated in FIG. 8C.

Again, the placement positions for the left lower end-effector 304 and the right lower end-effector 308 may be independently adjusted. As explained earlier, this functionality may be used, for instance, to compensate for any misalignment of the two wafers on the robot end-effectors and deliver accurately the two wafers to the desired locations in the respective radial stations.

A sequence of a pick operation with one pair of end-effectors, for example end-effectors 302 and 306, followed by a place operation with the other pair of end-effectors, in this particular example end-effectors 304 and 308, may be used to quickly exchange a pair of wafers at a pair of vertically stacked radial stations (rapid exchange operation in a pair of stacked radial stations).

Figure 10A:
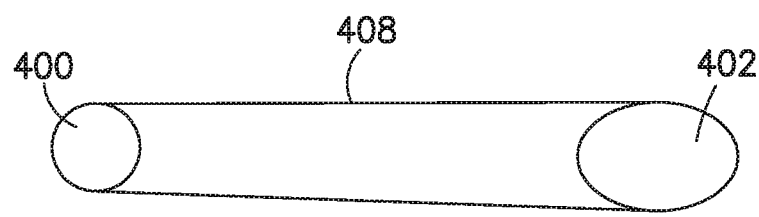
FIGS. 10A-10B show examples of belt arrangements.
Figure 10B:
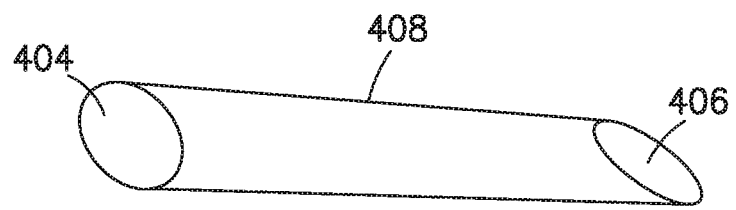

As illustrated in the above examples of operation of the robot, the left (right) lower end-effector may rotate out of the way as the left (right) upper end-effector extends to a station and, similarly, the left (right) upper end-effector may rotate out of the way as the left (right) lower end-effector extends to a station. The range of the rotation may be desirably reduced by utilizing band arrangements with variable transmission ratios between the shoulder pulleys and the elbow pulleys of the robot arm. As noted above, any of the belt arrangement may feature a constant or variable transmission ratio, for example, implemented through the use of circular and/or non-circular pulleys. FIGS. 10A-10B show some examples of a circular pulley 400 and non-circular pulleys 402, 404, 406 connected by bands/belts 408. These are merely examples and should not be considered as limiting. Other suitably sized and shaped non-circular pulleys could be provided. As an example, one or two non-circular pulleys may be employed for this purpose such as described in U.S. Pat. No. 9,149,936 which is hereby incorporated by reference in its entirety.

As explained earlier, the variable transmission ratios may be selected to control the orientations of the left (right) end-effectors as a function of the relative position of the left (right) upper arm and the shoulder pulley that drives the left (right) end-effectors. For example, the variable transmission ratios may be selected so that the left lower end-effector 304 rotates quickly out of the way and then slows down as the left upper 302 end-effector extends out toward a station. This is illustrated in the example of FIGS. 12A-12B. FIG. 12A and 12B shows a series of snap-shots in time of the motion of the robot arm 108 and end effectors similar to the positions shown in FIG. 11C. This description is made with reference to the robot shown in FIG. 2A-2D, but is equally applicable to at least a portion of at least some of the other robots described herein. In the example shown in FIG. 12A the first end effector A is moved from its retracted position to its extended position where the movement segment is a straight line into one of the offset stations. In this example, the joint of the forearms with the upper arm merely follows a circular path about the center axis of the robot drive, and the payload center of the second end effector (and a substrate on the second end effector) has a curved path but remains retracted while the first end effector is extended. FIG. 12B shows a similar movement to FIG. 12A, but with a different transmission ratio. In FIG. 12A constant transmission ratio $n_{B\ of}\ _{-}1$ is utilized, resulting in 180-degree rotation of end-effector B. In FIG. 12B the transmission ratio changes gradually from −1 to −0.25, reducing the rotation of end-effector B to approximately 145 degrees.

Figure 13A:
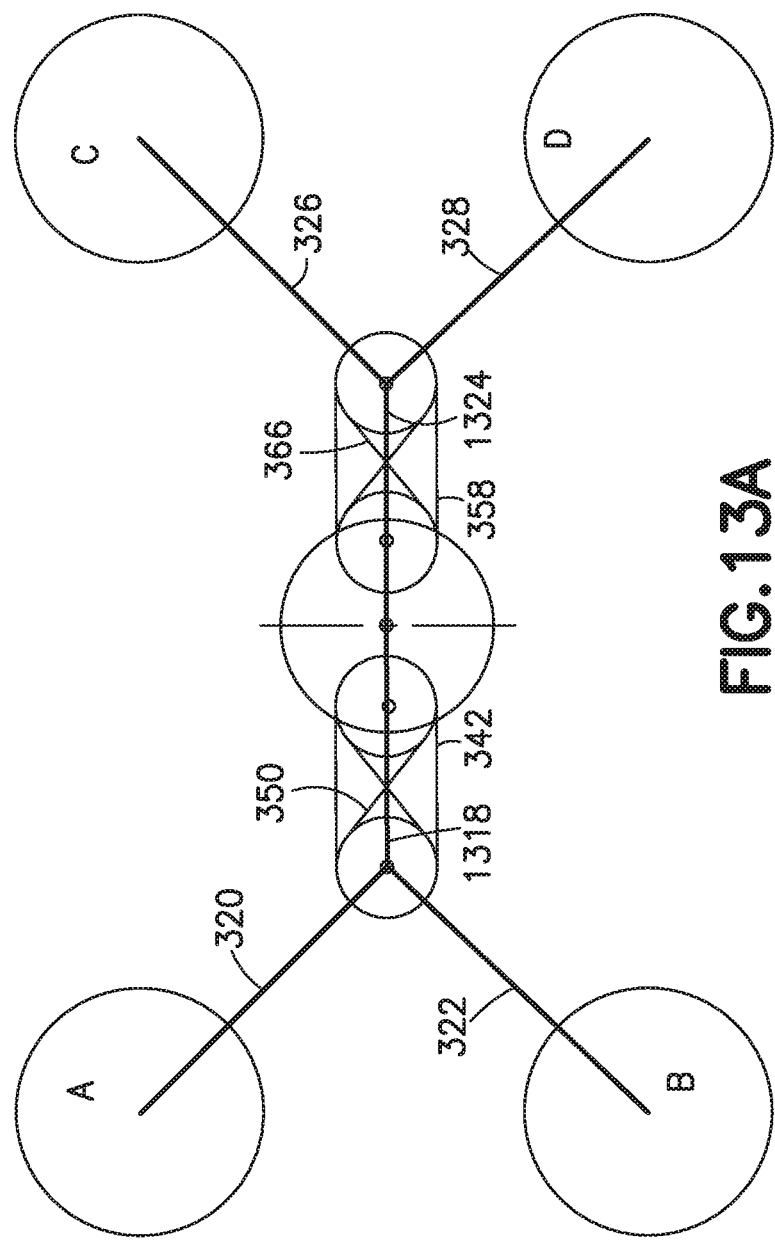
Figure 13B:
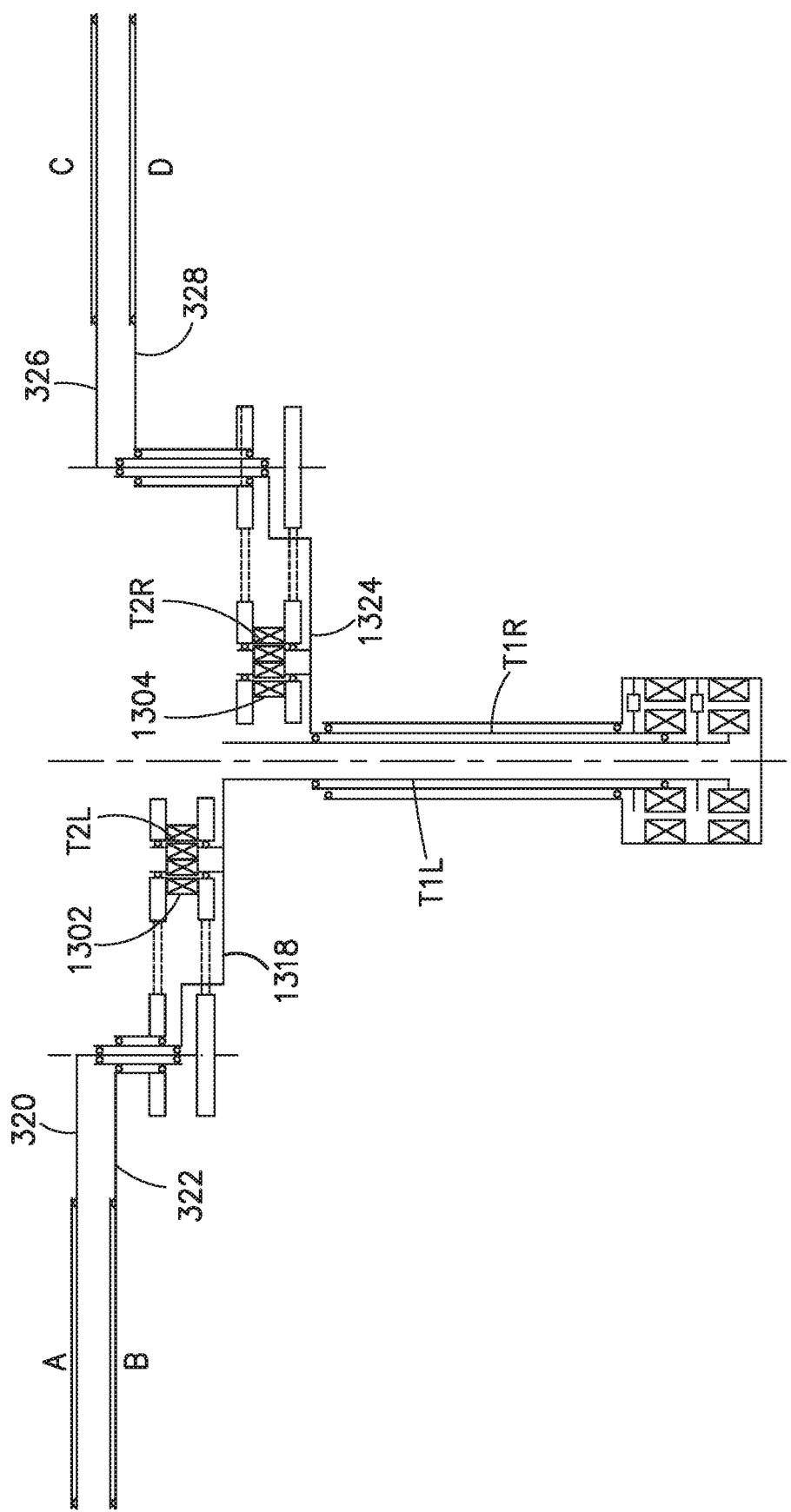

In another example embodiment, the upper arms of the robot arm may be driven by a robot drive unit with a two-axis spindle, and the forearms of the robot arm may be driven by actuators attached to the upper arms. An example of such an arrangement is depicted diagrammatically in FIGS. 13A-13B. In the example of FIGS. 13A-13B, the left upper arm 1318 of the robot arm may be connected to a shaft T1L of the robot drive unit, and the left forearms 320, 322 may be coupled to a shaft T2L driven by an actuator, for example a motor 1302, which may be attached to the left upper arm. Similarly, the right upper arm 1324 of the robot arm may be connected to a shaft T1R of the robot drive unit, and the right forearms 326, 328 may be coupled to a shaft T2R driven by an actuator, for example a motor 1304, which may be attached to the right upper arm.

Figure 14A:
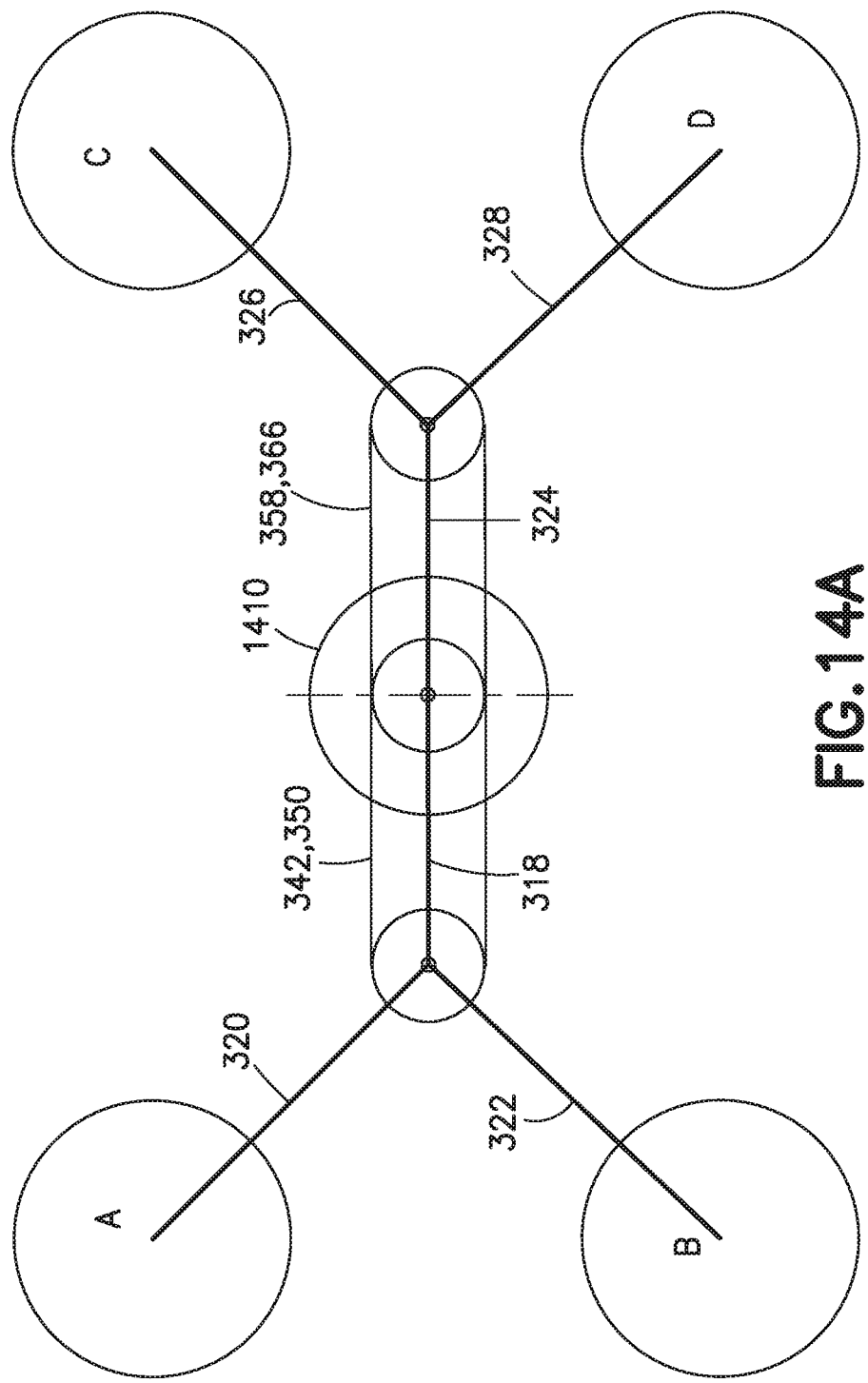
Figure 14B:
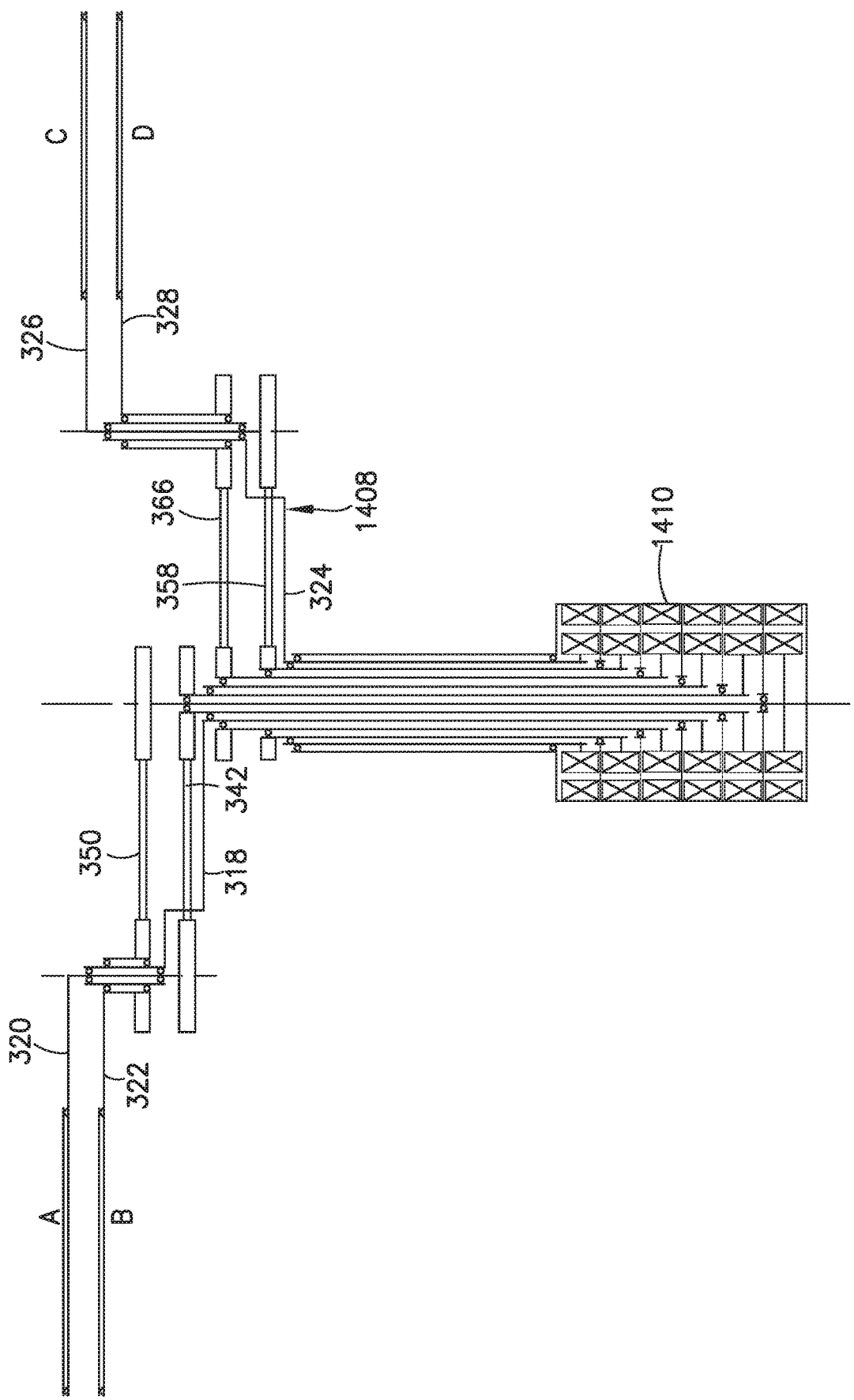

In another example embodiment, the upper arms and forearms of the robot arm may be actuated independently by a robot drive unit with a six-axis spindle featuring six independently driven shafts. An example of this is shown in FIGS. 14A-14B. This may allow the robot to extend end-effectors carried by the same upper arm simultaneously, e.g., to pick/place two wafers from/to the same station in one operation. A robot drive 1410 is provided comprising a six-axis spindle featuring six independently driven shafts. The robot arm 1408 has upper arms 318, 324, forearms 320, 322, 326, 328, belt arrangements 342, 350, 358, 366 and end effectors A-D similar to that shown in FIGS. 6C-6D.

Figure 15A:
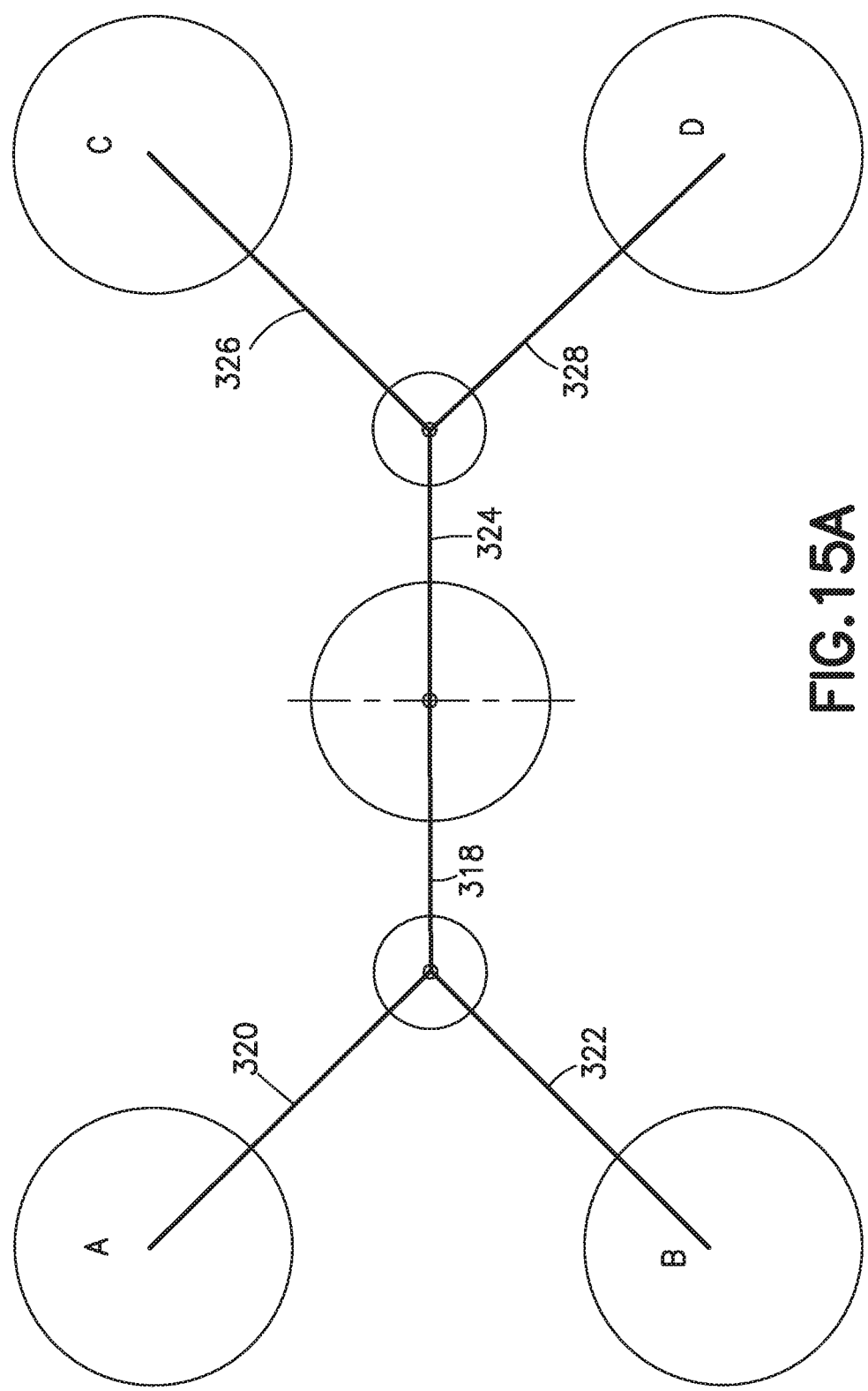
Figure 15B:
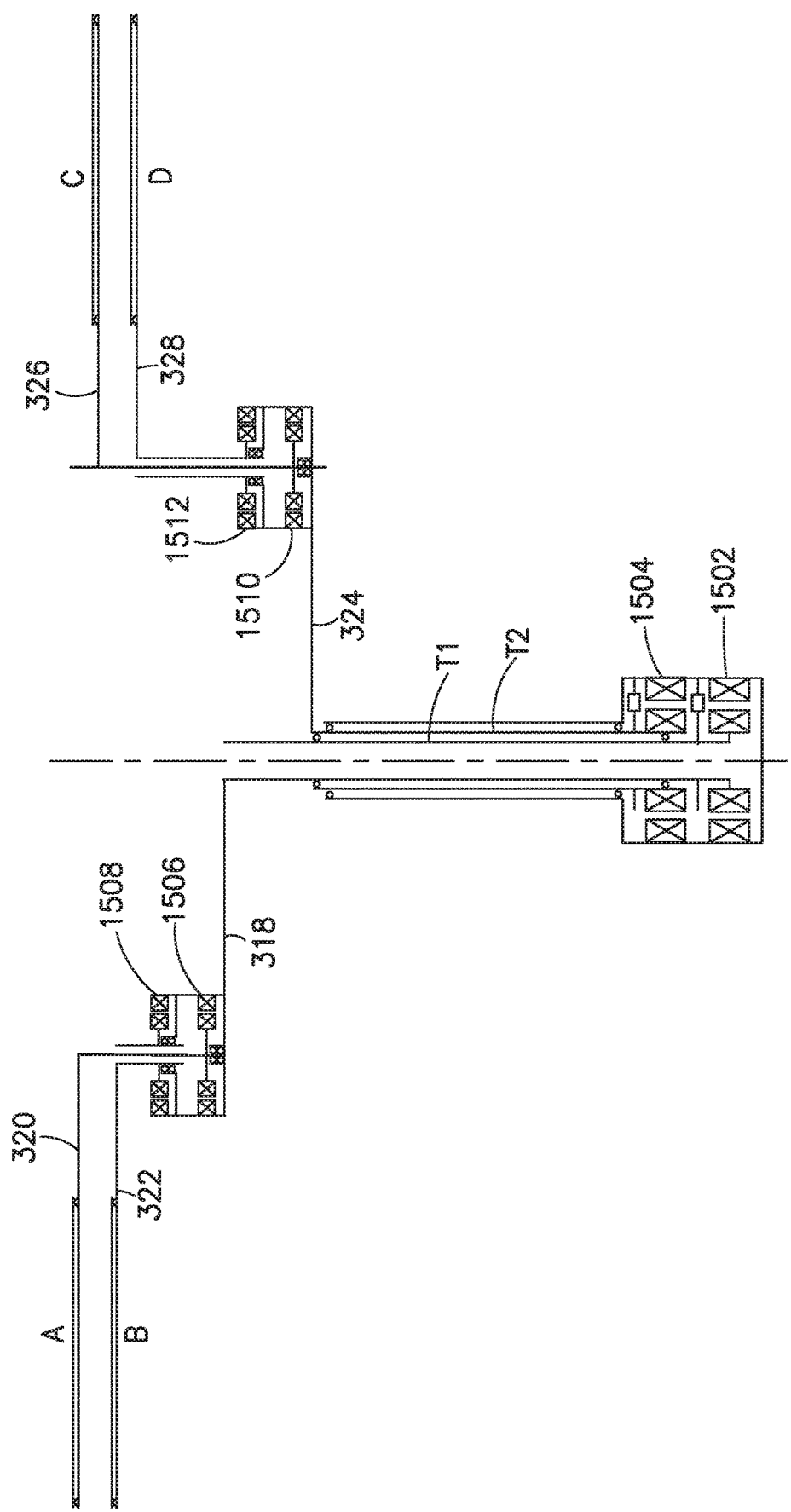
Figure 16A:
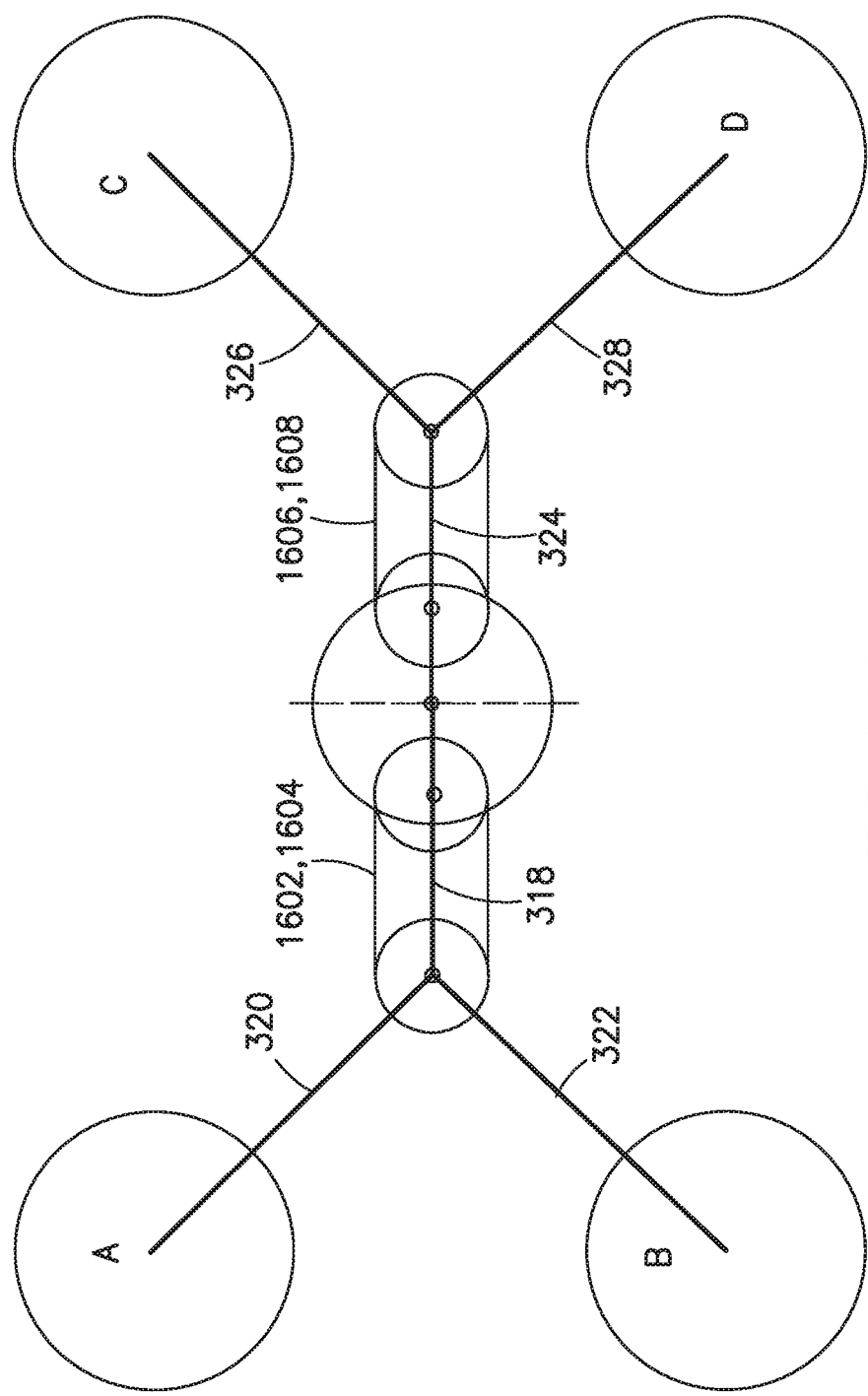
Figure 16B:
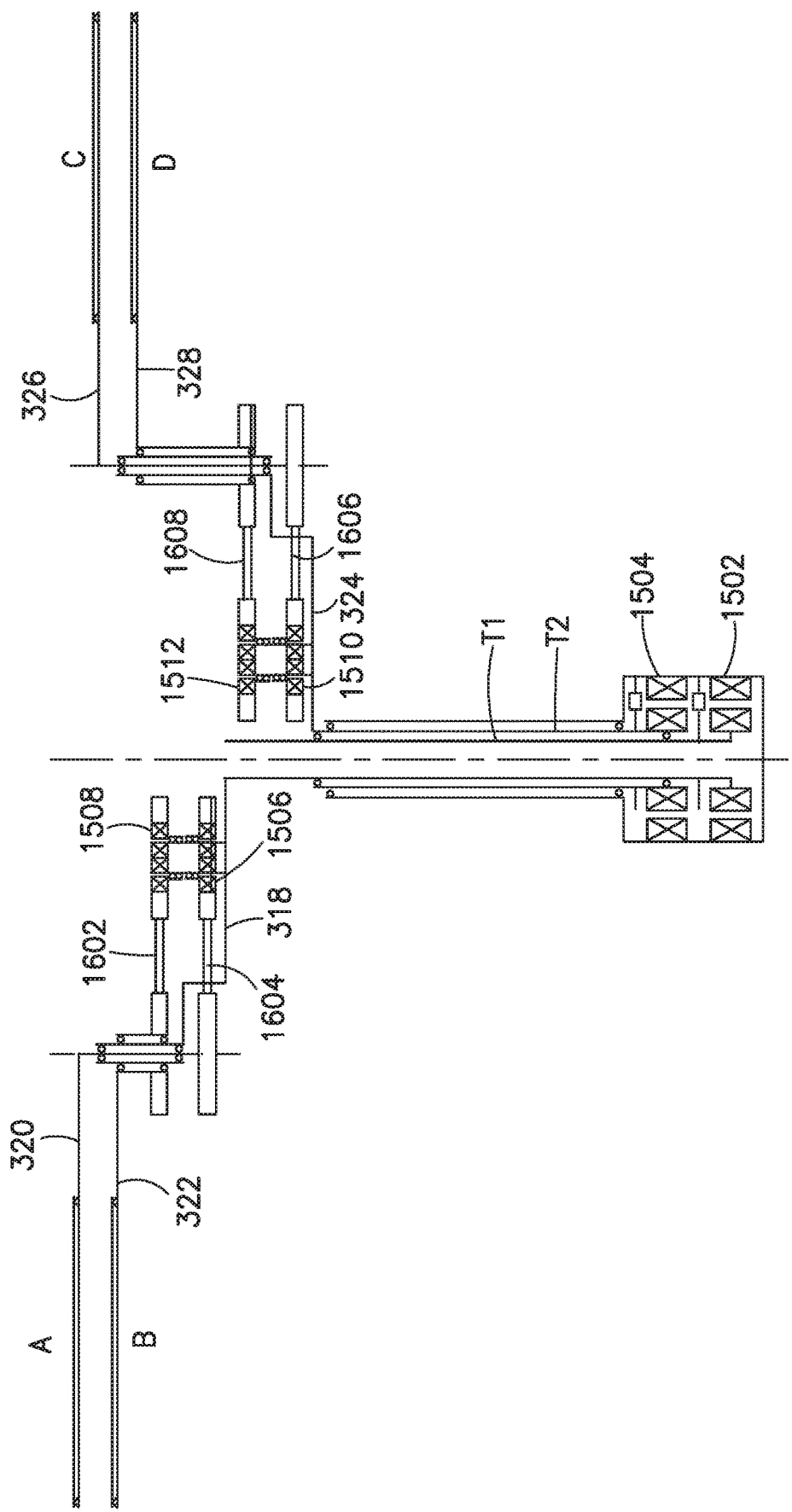

Alternatively, the upper arms of the robot arm may be driven by a robot drive unit with a two-axis spindle, and the forearms may be driven by two pairs of actuators, one pair attached to each of the two upper arms of the robot arm. In particular, one pair of actuators may be attached to the left upper arm and drive the left forearms, and the other pair of actuators may be attached to the right upper arm and drive the right forearms. The actuators may by connected to the forearms directly, as depicted diagrammatically in FIGS. 15A-15B, or they may be coupled to the forearms via a band, belt or cable arrangement, as illustrated diagrammatically in FIGS. 16A-16B. For vacuum-environment applications, the actuators (and sensors, controllers and other components associated with them) may be sealed, powered, cooled and communicated with utilizing the approach described in U.S. Patent Application Publication No. 2016/0064263 which is hereby incorporated by reference in its entirety. FIGS. 15A-15B show an example of a robot drive having a first section with two motors 1502, 1503 and two coaxial drive shafts T1, T2 connected to two upper arms 318, 324, first and second forearms 320, 322 rotatably connected to the first upper arm 318 with motors 1506, 1508 to rotate the first and second forearms 320, 322 on the first upper arm 318, and third and fourth forearms 326, 328 rotatably connected to the second upper arm 324 with motors 1510, 1512 to rotate the third and fourth forearms 326, 328 on the second upper arm 324. FIGS. 16A-16B show an example of a robot drive having a first section with two motors 1502, 1503 and two coaxial drive shafts T1, T2 connected to two upper arms 318, 324, first and second forearms 320, 322 rotatably connected to the first upper arm 318 with motors 1506, 1508 connected to the band drive arrangements 1602, 1604 to rotate the first and second forearms 320, 322 on the first upper arm 318, and third and fourth forearms 326, 328 rotatably connected to the second upper arm 324 with motors 1510, 1512 connected to the band drive arrangements 1606, 1608 to rotate the third and fourth forearms 326, 328 on the second upper arm 324.

Figure 17A:
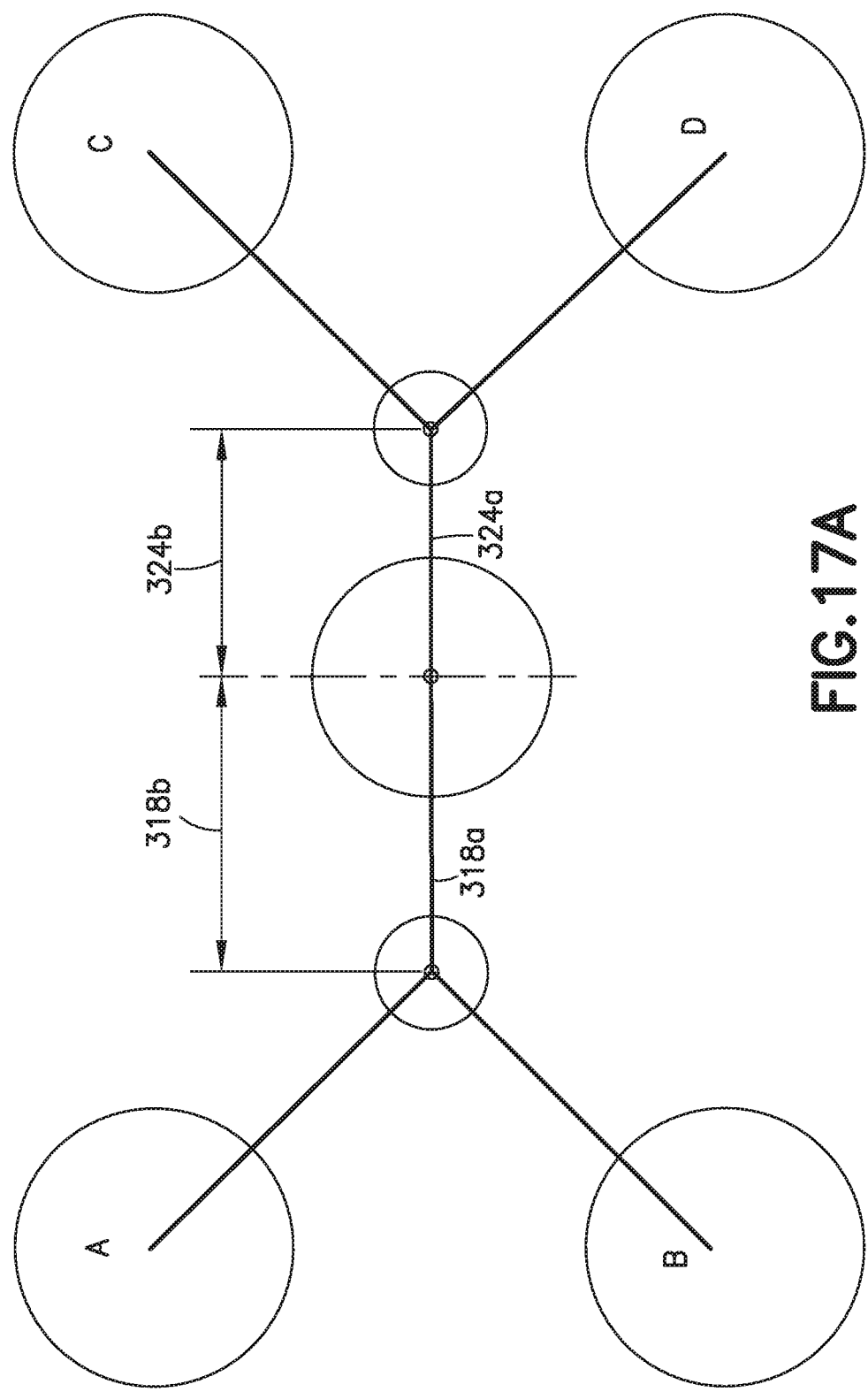
FIGS. 17A-17B are schematic illustrations similar to FIGS. 6C-6D of an alternate example embodiment of a robot.
Figure 17B:
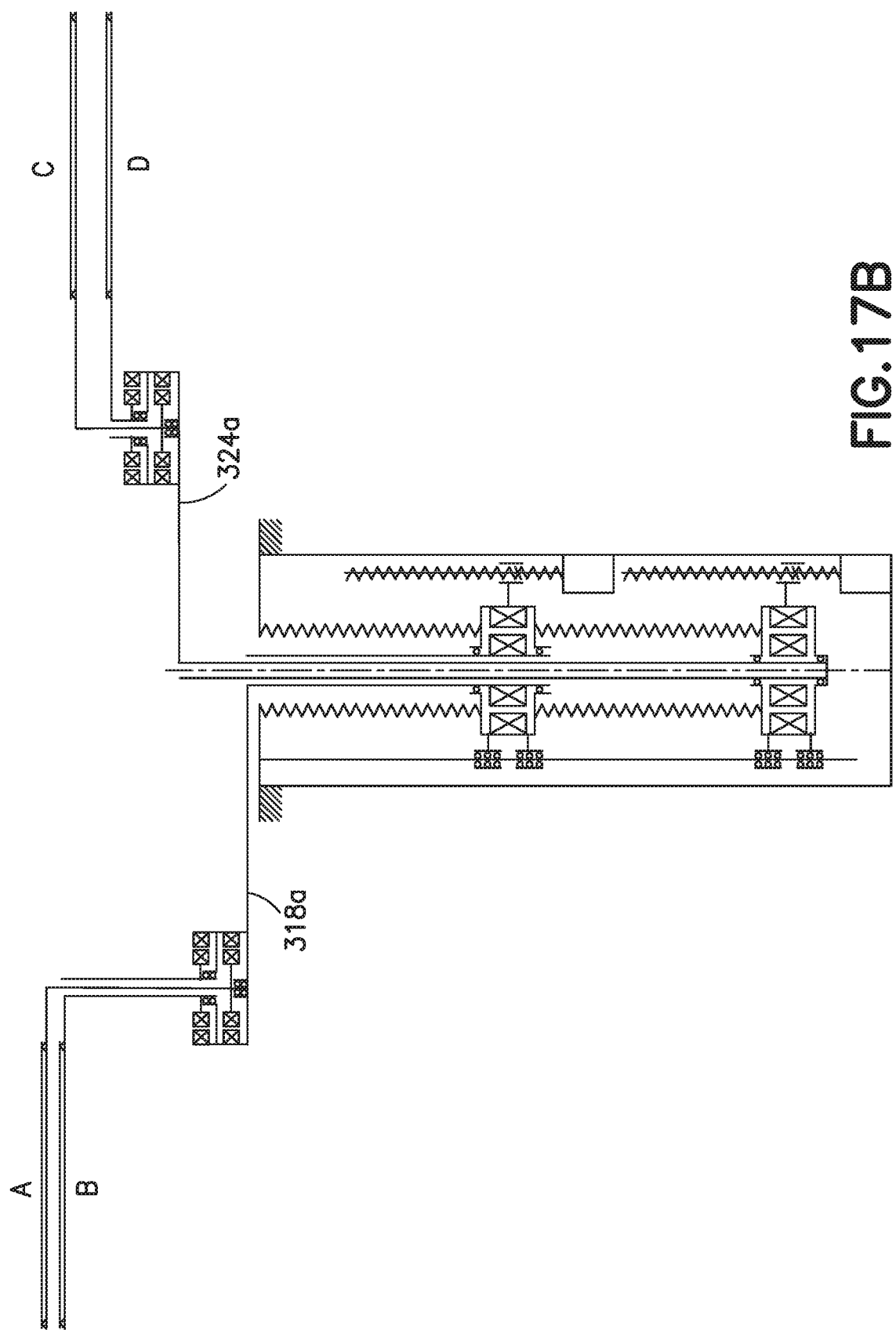
Figure 18B:
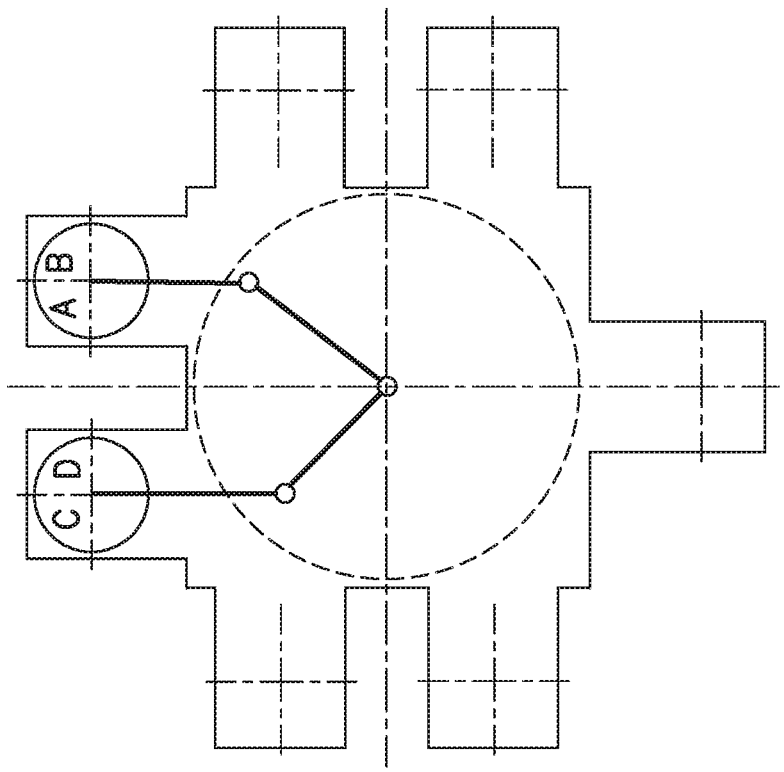
FIGS. 18A-18T illustrate examples of substrate movements in a substrate processing apparatus comprising the robot shown in FIGS. 17A-17B, and FIGS. 19A and 19B are side views illustrating examples of robots having pass-through supports.
Figure 18A:
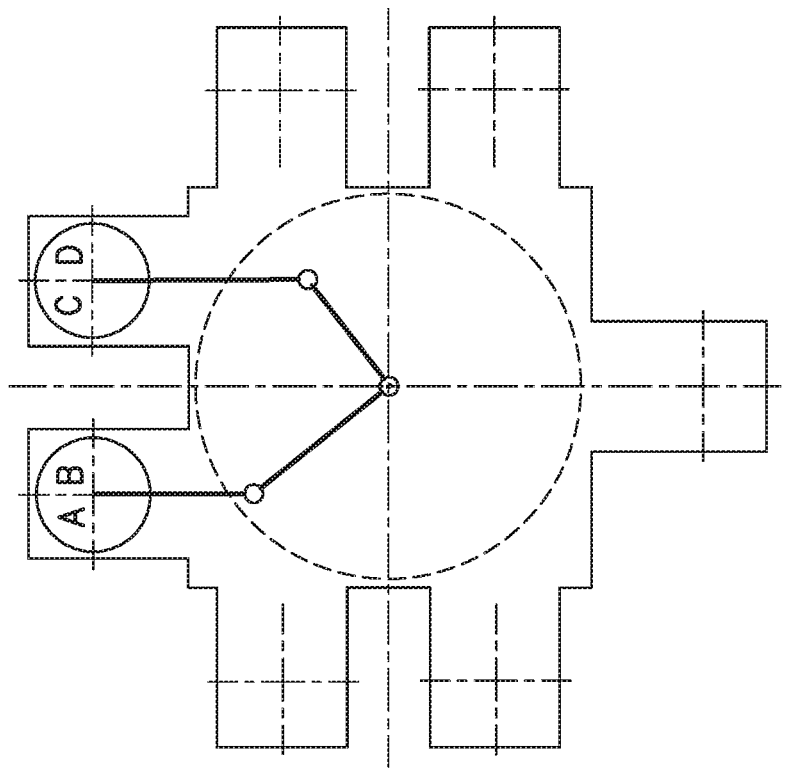
Figure 18D:
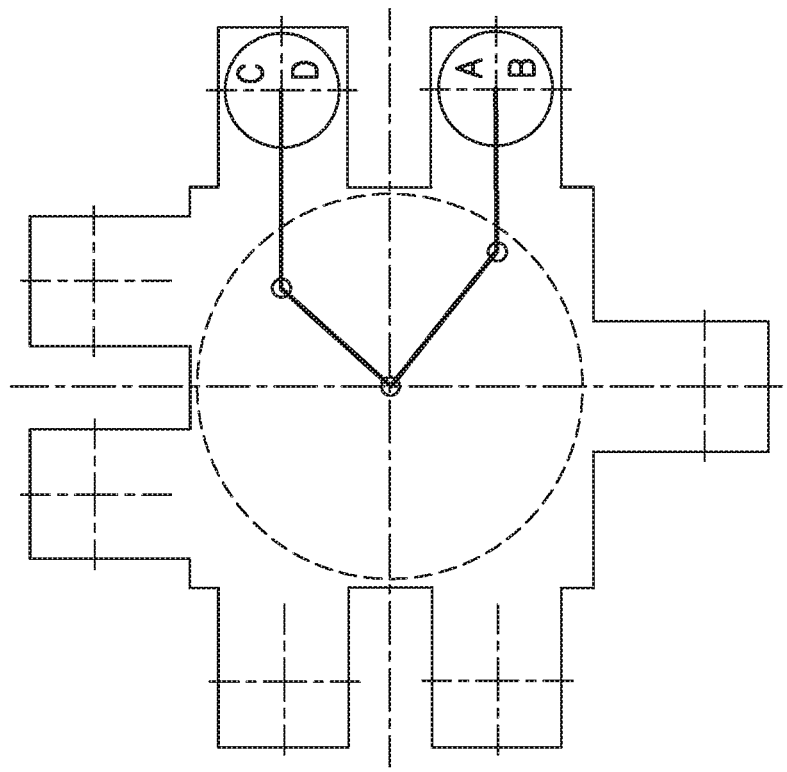
Figure 18C:
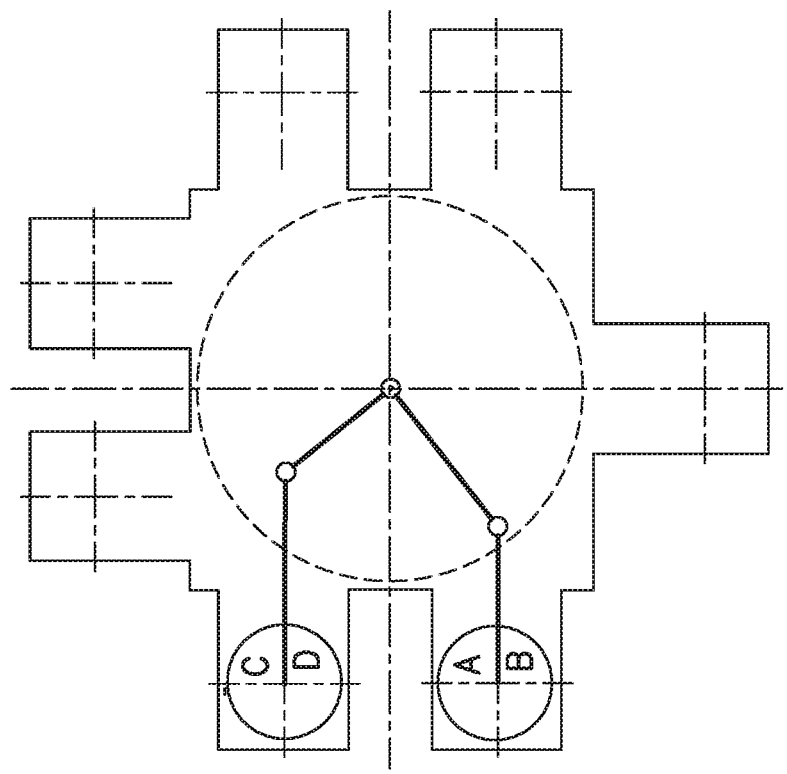
Figure 18F:
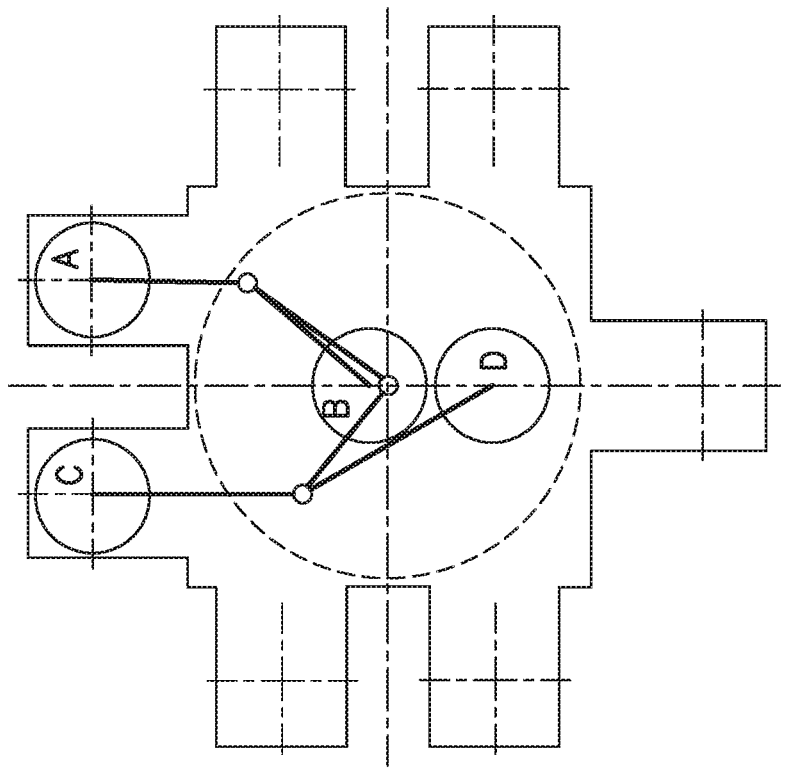
Figure 18E:
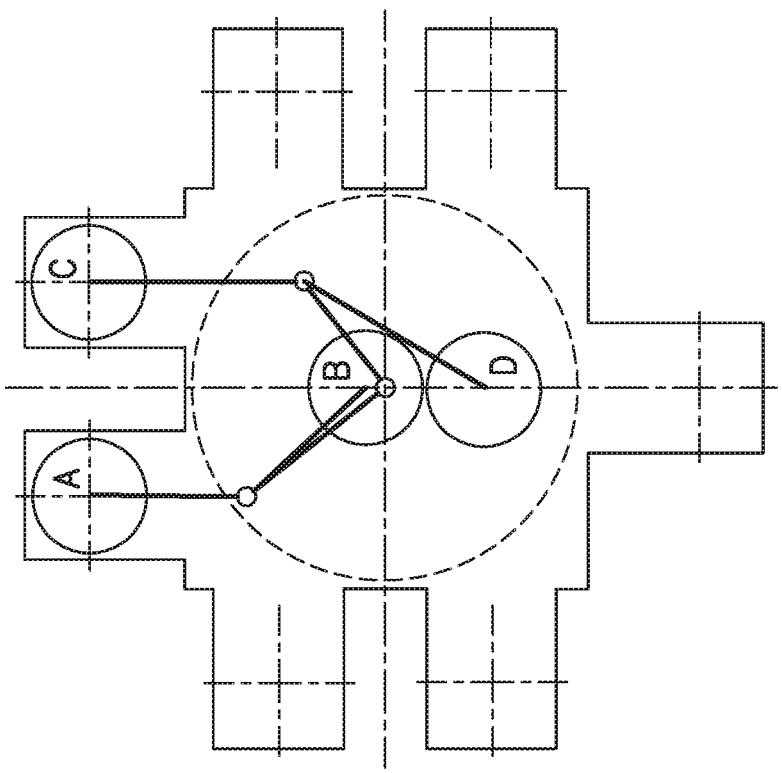
Figure 18H:
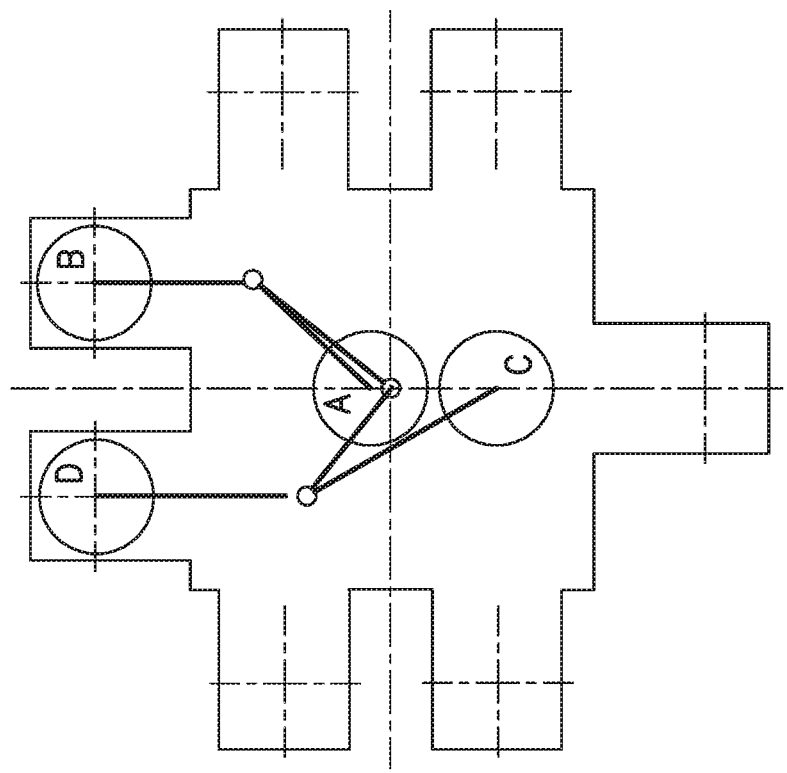
Figure 18G:
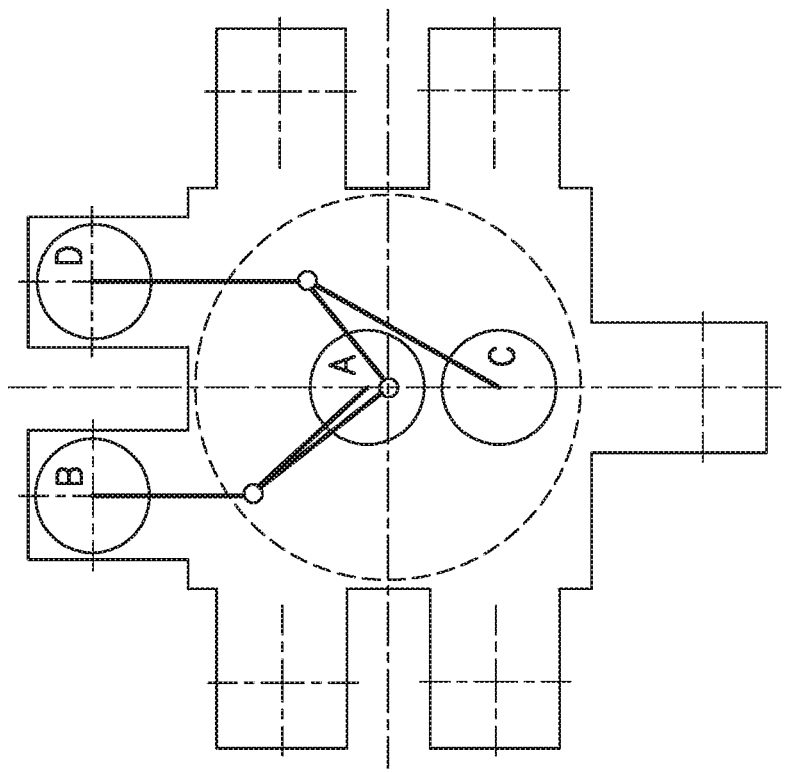
Figure 18J:
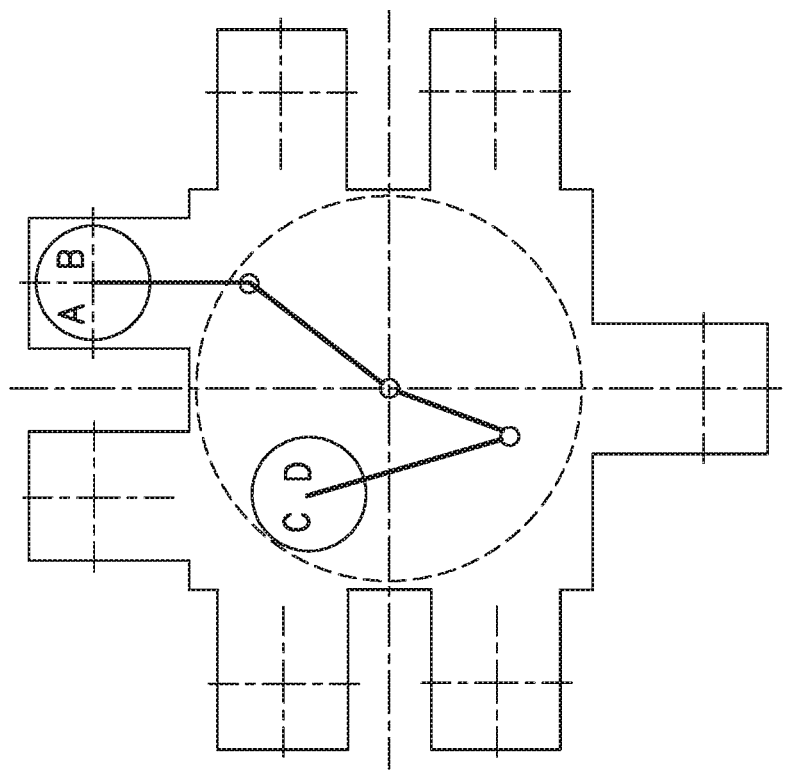
Figure 18I:
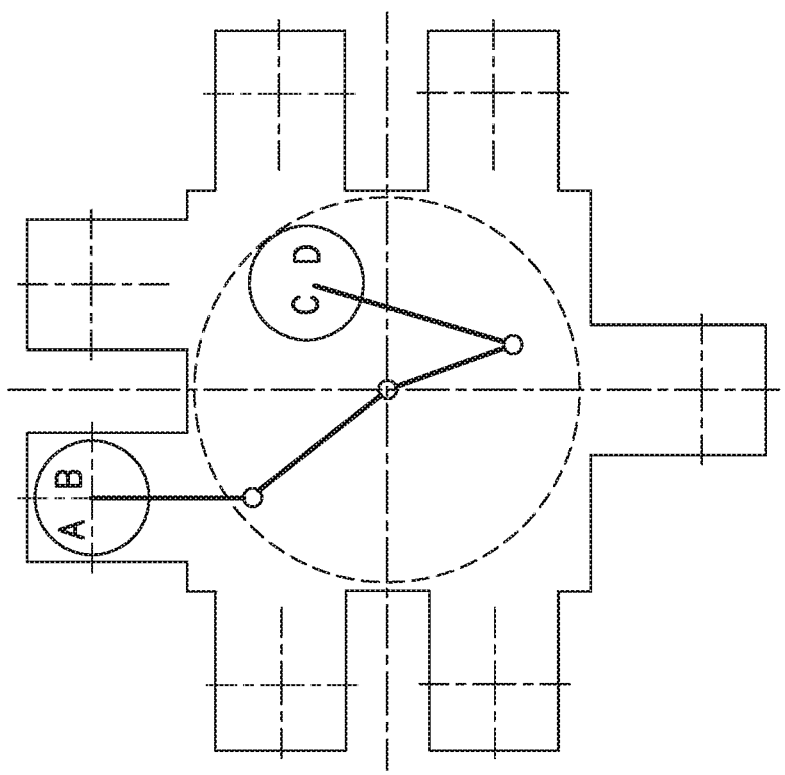
Figure 18L:
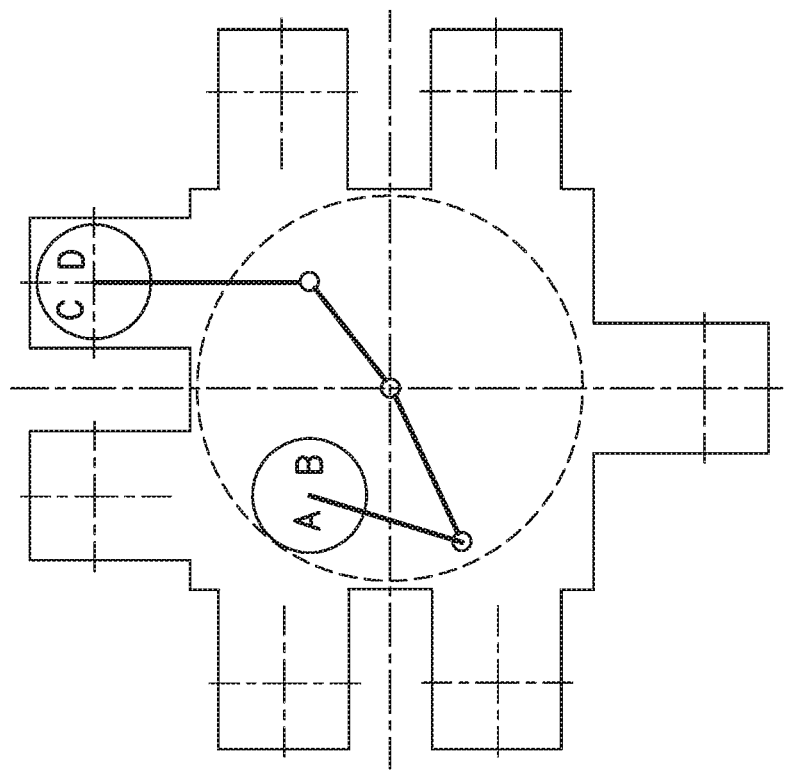
Figure 18K:
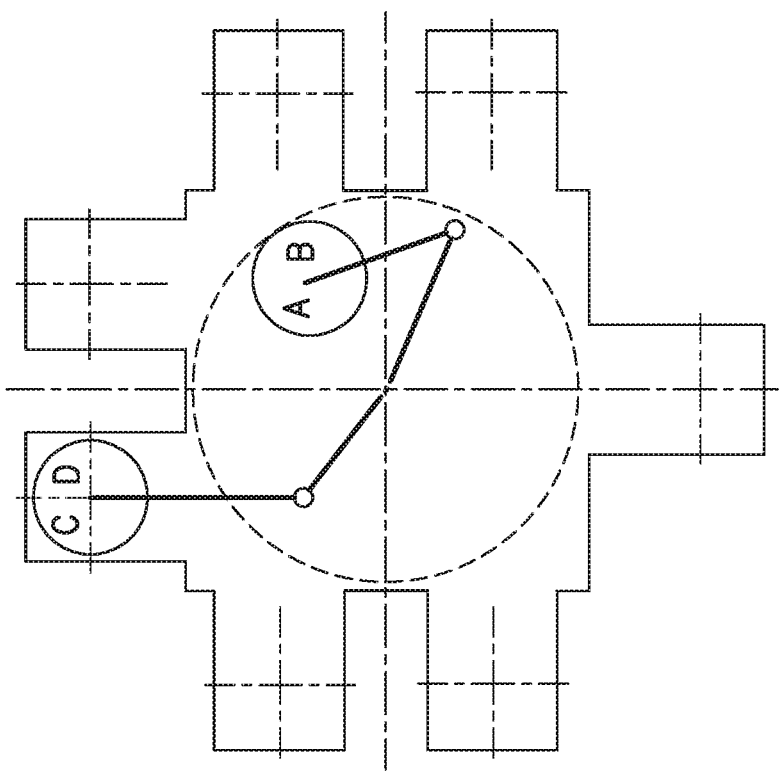
Figure 18N:
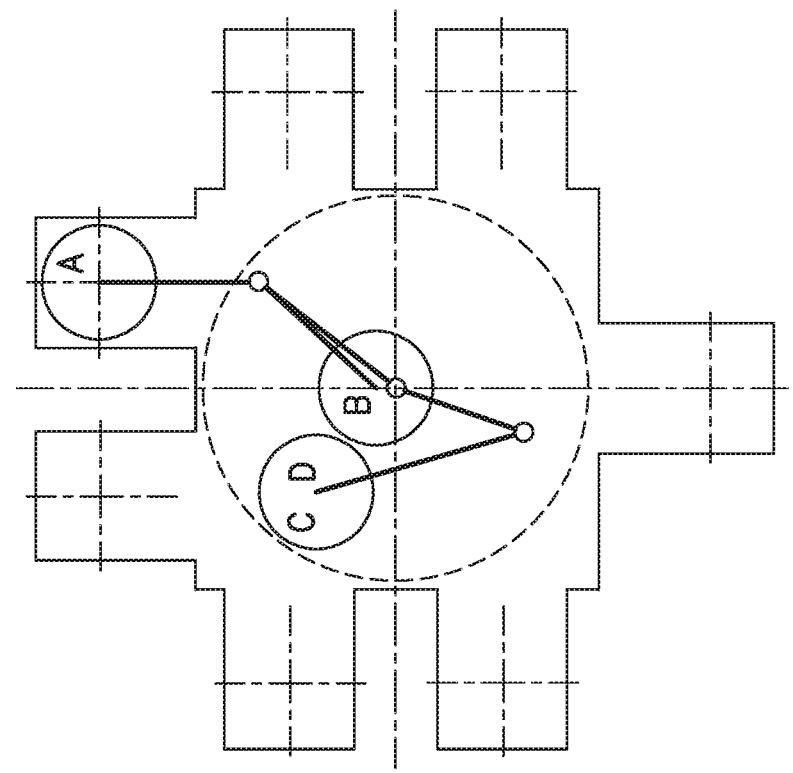
Figure 18M:
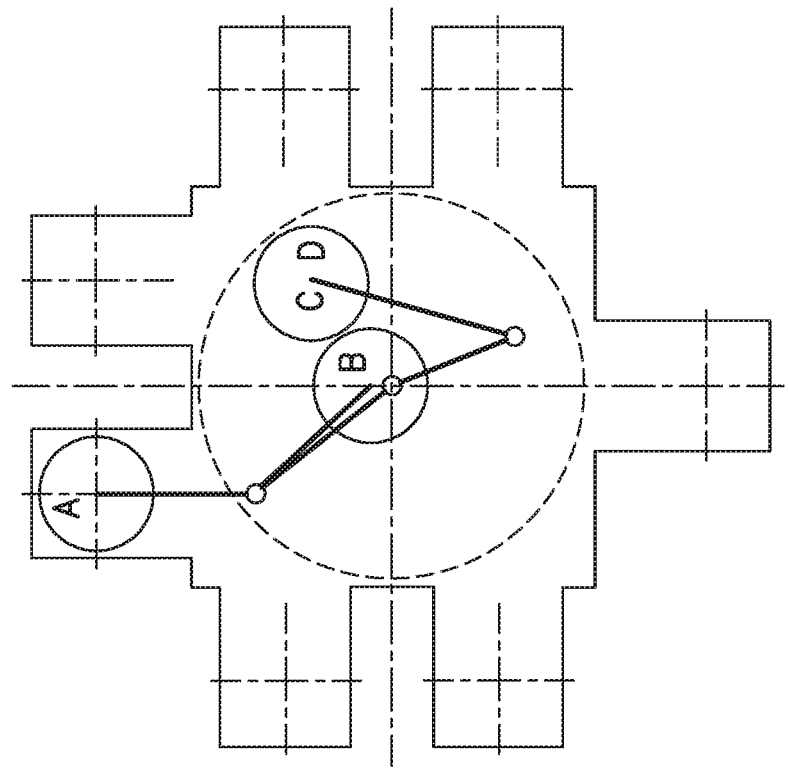
Figure 18R:
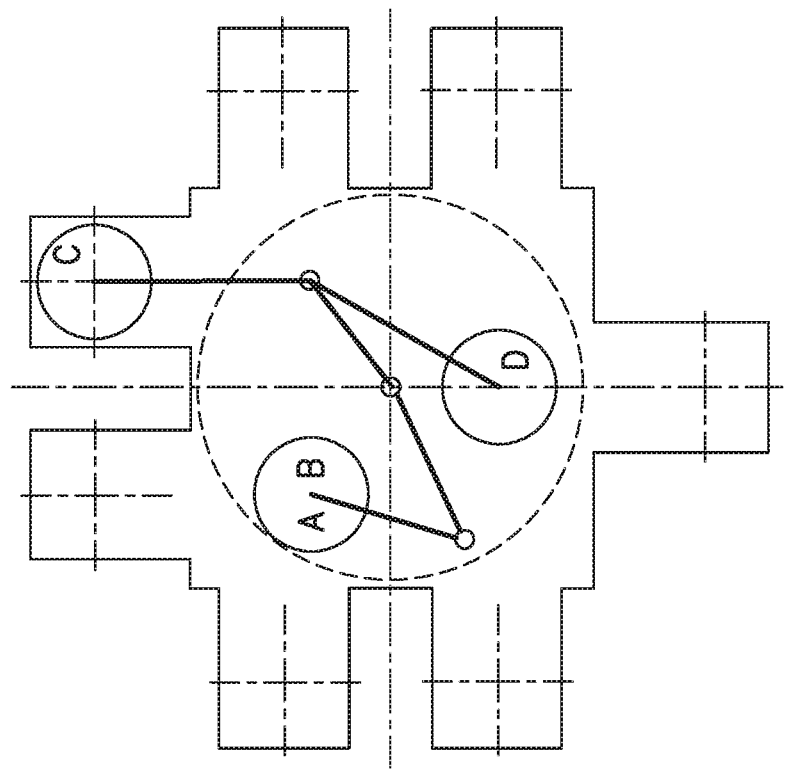
Figure 18Q:
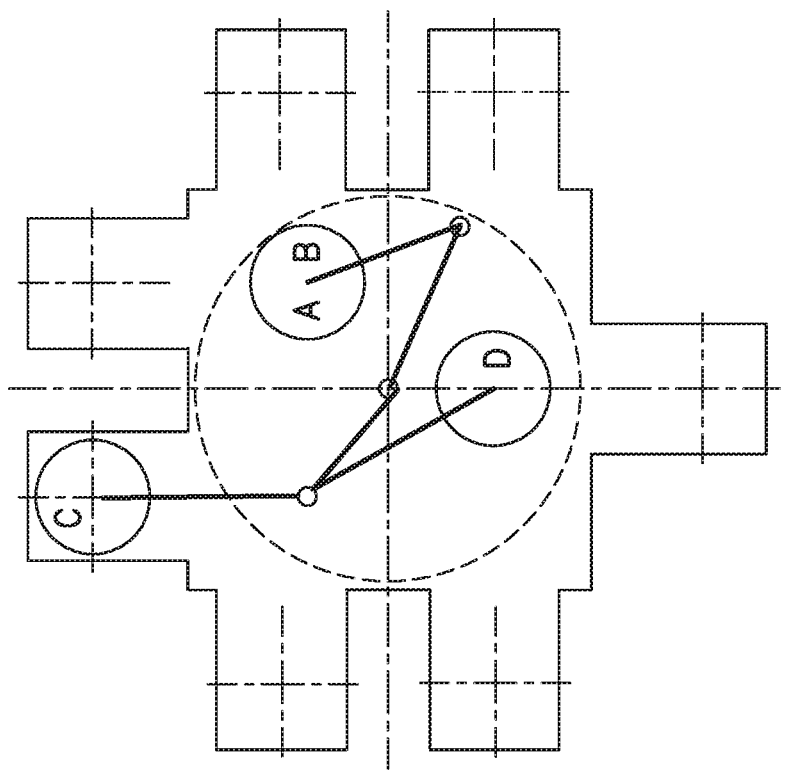
Figure 18T:
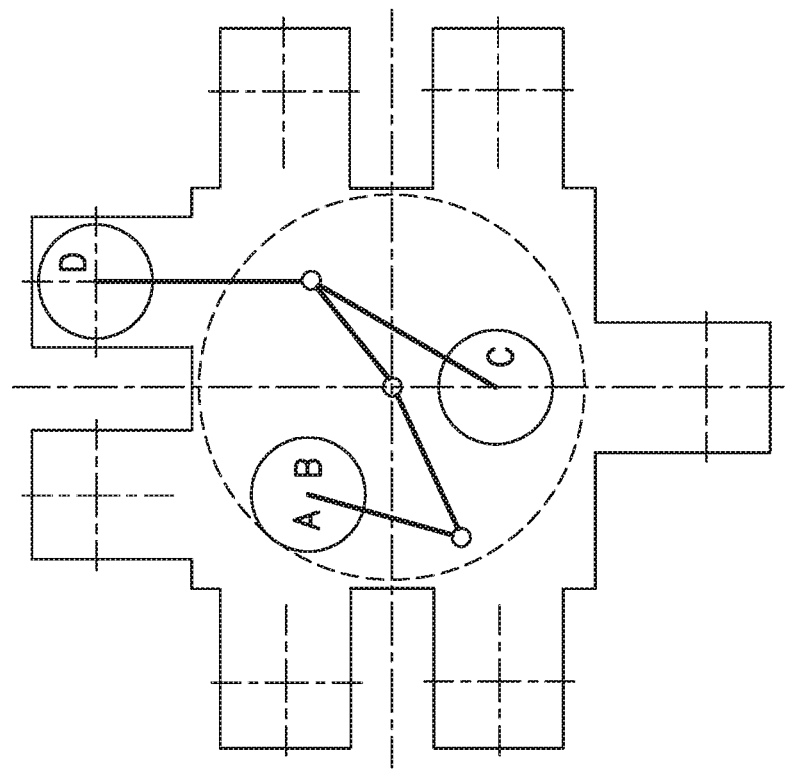
Figure 18S:
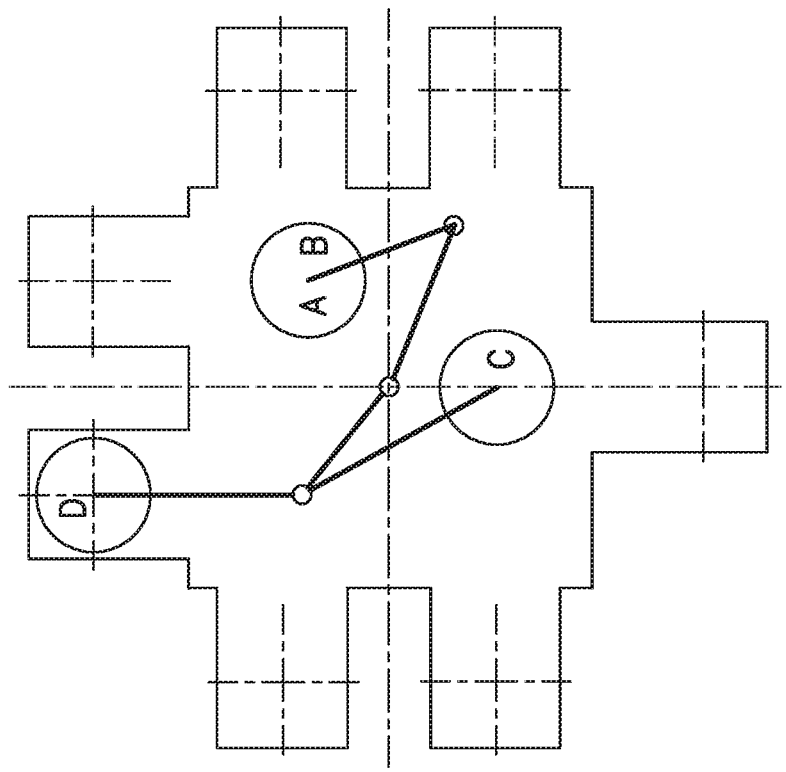

Although the illustrations of the example embodiments show the upper arms of the robot having a same joint-tojoint length, the upper arms 318*a*, 324*a* may have different joint-to-joint lengths 318*b*, 324*b*, as depicted diagrammatically in the example of FIGS. 17A-17B. The joint-to-joint lengths of the upper arms may be selected so that one upper arm can cross over the other upper arm, e.g., from the left-hand side to the right-hand-side or from the right-hand side to the left-hand side. This may allow the robot to pick/place wafers from/to left and right stations, as depicted diagrammatically in FIGS. 18A-18T, which shows various examples of the robot accessing stations in a semiconductor wafer processing system. If desired, the two pairs of end-effectors may have different vertical spacing, which may allow the robot to extend two end-effectors simultaneously in the same plane (at the same vertical elevation) while the other two end-effectors may rotate out of the way, clearing each other in different planes (at different vertical elevations).

Figure 19B:
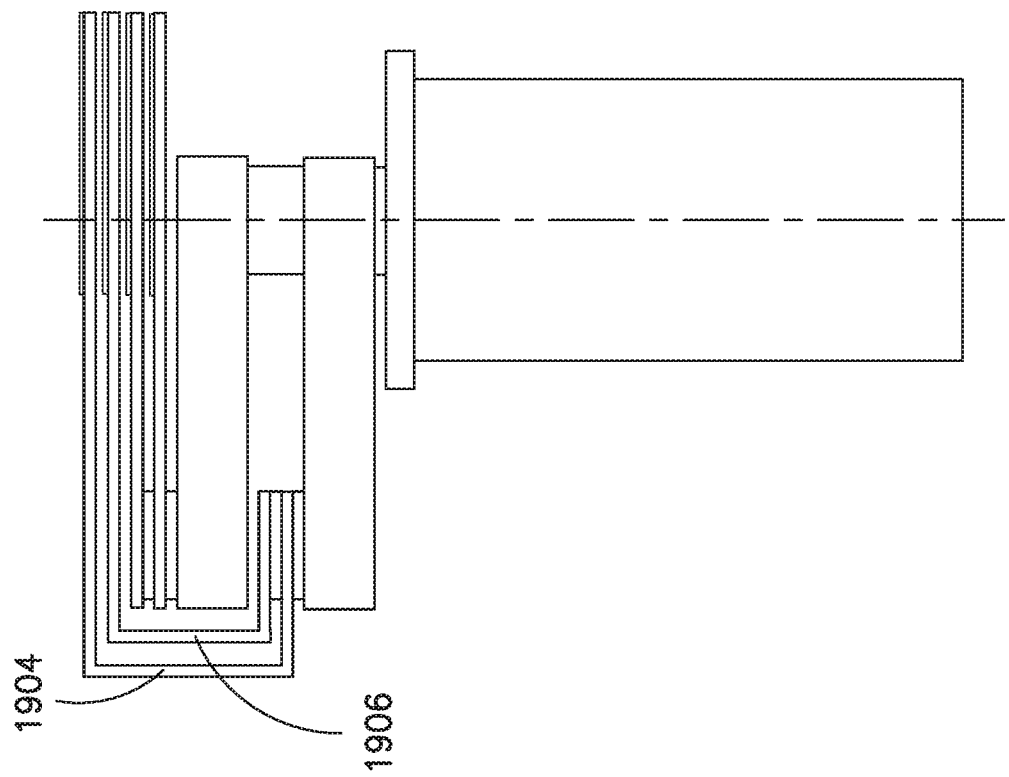
Figure 19A:
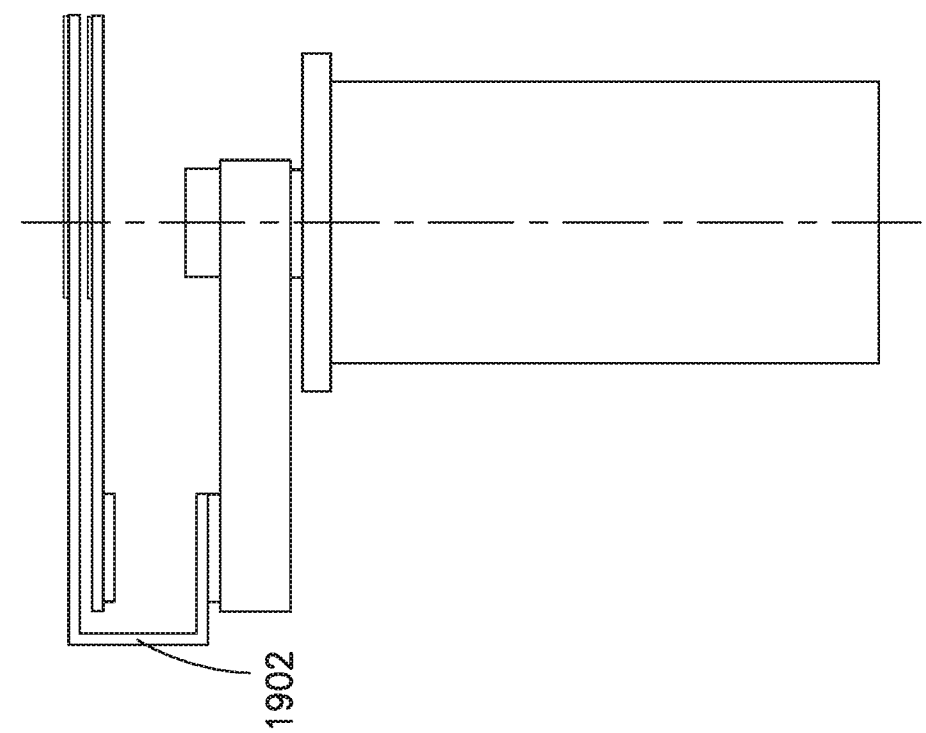

Alternatively, the upper arms may feature the same joint-to-joint length and the end-effector(s) carried by one upper arm may be elevated on a structural support configured so that the other upper arm and the end-effector(s) associated with it may pass through. An example of such an embodiment is illustrated in FIGS. 19A-19B where FIG. 19A shows a robot with two end-effectors and a pass-through support 1902 and FIG. 19B depicts a robot with four end-effectors and pass-through supports 1904, 1906.

The robot drive unit may include one or more vertical lift mechanisms to control the vertical elevation of the robot arm, which may be used to access stations at different elevations, compensate for the vertical distance between the end-effectors of the robot arm, and facilitate material pick/place operations. As an example, considering the examples shown in FIGS. 4C and 6C, the robot drive unit 206, 310 may include a single vertical lift mechanism to control the elevation of the T1, T2, T3 and T4 shafts. As an another example, the robot drive unit may include one vertical mechanism to control the elevation of the T1 and T2 shafts, thus controlling independently the elevation of the left linkage of the robot arm, and another vertical mechanism to control the elevation of the T3 and T4 shafts at least partially separately from the elevation of the T1 and T2 shafts, thus controlling independently the elevation of the right linkage of the robot arm. An example of such an arrangement is shown diagrammatically in FIG. 17B.

The vertical mechanisms may be implemented using two motors, each driving a ball-screw, as illustrated in the example of FIG. 17B. Alternatively, a single stationary ball screw may be attached to the frame of the robot drive unit and two motors, one attached to the T1 and T2 shaft spindle and the other attached to the T3 and T4 shaft spindle, may drive ball screw nuts riding on the stationary ball screw. As yet another alternative, one of the two spindles may be driven with respect to the frame of the robot drive unit, and the other spindle may be driven with respect to the first spindle; for instance, the T1 and T2 shaft spindle may be driven with respect to the T3 and T4 shaft spindle, and the T3 and T4 shaft spindle may be driven with respect to the robot frame. While the above example is described utilizing motor-driven ball screws, any other suitable actuation mechanism may be used, including, but not limited to, lead screws, linear motors, linkage mechanisms, scissor mechanisms, hydraulic actuators, pneumatic actuators and their combinations.

Although most of the illustrations of the example embodiments show the robot with the left upper arm above the right upper arm, the left upper end-effector and the left lower end-effector above the left upper arm, the right upper end-effector and the right lower end-effector above the right upper arm, the left upper end-effector above the right upper end-effector and the left lower end-effector above the right lower end-effector, the upper arms and end-effectors may be arranged in various configurations.

For instance, the robot may feature the following example configurations and their combinations:

The left upper arm may be located below the right upper arm.

The left upper end-effector may be located above the left upper arm while the left lower end-effector may be located below the left upper arm.

The left upper end-effector and the left lower end-effector may be located below the left upper arm.

The right upper end-effector may be located above the right upper arm while the right lower end-effector may be located below the right upper arm.

The right upper end-effector and the right lower end-effector may be located below the left upper arm.

The left upper end-effector may be located in a substantially the same plane as the right upper end-effector.

The left upper end-effector may be located below the right upper end-effector.

The left lower end-effector may be located in a substantially the same plane as the right lower end-effector.

The left lower end-effector may be located below the right lower end-effector.

Alternatively, any suitable configuration of the upper arms and end-effectors may be used.

An example embodiment may be provided in an apparatus comprising: a robot drive comprising motors and coaxial drive shafts connected to the motors; a robot arm connected to the robot drive, where the robot arm comprises two upper arms, a first set of forearms connected to a first one of the upper arms, a second set of forearms connected to a second one of the upper arms and end effectors connected to respective ones of the forearms, where the first and second upper arms are connected to respective first and second ones of the coaxial drive shafts, where the first set of the forearms is mounted on the first upper arm and connected to a third one of the coaxial drive shafts by respective first and second drive belt assemblies, where the second set of the forearms is mounted to the second upper arm and connected to a fourth one of the coaxial drive shafts by respective third and fourth drive belt assemblies.

The first set of forearms may be connected to the first upper arm at a common axis or rotation. The first and second drive belt assemblies may each comprise at least one set of pulleys and a drive belt between the pulleys, and where at least one of the pulleys is a non-circular pulley. The first and second drive belt assemblies, including the at least one non-circular pulley, may be configured to move the first set of forearms without relative rotation therebetween when the first upper arm is rotated in a first direction, and where the first and second drive belt assemblies, including the at least one non-circular pulley, are configured to move the first set of forearms with relative rotation therebetween when the first upper arm is rotated in a second direction opposite the first direction. The apparatus may further comprise a controller connected to the robot drive, where the controller comprises at least one processor and at least one memory comprising computer code for controlling the motors. The apparatus may further comprise a substrate transport chamber having the robot drive connected thereto, where the robot arm is located inside the substrate transport chamber, and a plurality of substrate stations connected to the substrate transport chamber, where the plurality of substrate stations comprise stations offset relative to a radial direction from an axis of connection of the robot drive to the substrate transport chamber and at least one station which is not offset relative to the radial direction from the axis of connection of the robot drive to the substrate transport chamber, where the robot drive and the robot arm are configured to move the end effectors to insert and remove substrates with the stations. The robot drive and the robot arm may be configured to move a first one of the end effector on the first set of forearms and a second one of the end effectors on the second set of forearms at a same time into the at least one station which is not offset relative to the radial direction from the axis of connection of the robot drive to the substrate transport chamber. The apparatus may comprise two of the offset substrate stations on a same side of the substrate transport chamber, the robot drive and the robot arm are configured to respectively move a first one of the end effector on the first set of forearms and a second one of the end effectors on the second set of forearms at a same time into the two offset station. The apparatus may comprise two of the offset substrate stations on a same side of the substrate transport chamber, where the robot drive and the robot arm are configured to move the first end effector into a first one of the two offset substrate stations while the second upper arm and second set of forearms do not move, and where the robot drive and the robot arm are configured to move the second end effector into a second one of the two offset substrate stations while the first upper arm and first set of forearms do not move.

An example method may comprise connecting a first upper arm to a first coaxial drive shaft of a robot drive; connecting a second upper arm to a second coaxial drive shaft of the robot drive; connecting a first set of forearms to the first upper arm, where a first drive belt arrangement connects a first one of the forearms of the first set of forearms to a third coaxial drive shaft of the robot drive, and where a second drive belt arrangement connects a second one of the forearms of the first set of forearms to the third coaxial drive shaft of the robot drive; connecting a second set of forearms to the second upper arm, where a third drive belt arrangement connects a first one of the forearms of the second set of forearms to a fourth coaxial drive shaft of the robot drive, and where a fourth drive belt arrangement connects a second one of the forearms of the second set of forearms to the fourth coaxial drive shaft of the robot drive; and connecting respective end effectors to the forearms.

The first set of forearms may be connected to the first upper arm at a common axis or rotation. The first drive belt arrangement may comprise at least one non-circular pulley to move a drive belt of the first drive belt arrangement at a variable rate relative to rotation of the third coaxial drive shaft. The first and second drive belt assemblies, including at least one non-circular pulley of the first and second drive belt assemblies, may be connected to be able to move the first set of forearms without relative rotation therebetween when the first upper arm is rotated in a first direction, and to move the first set of forearms with relative rotation therebetween when the first upper arm is rotated in a second direction opposite the first direction. The method may further comprise coupling a controller to the robot drive, where the controller comprises at least one processor and at least one memory comprising computer code for controlling motors of the robot drive. The method may further comprise connecting the robot drive to a substrate transport chamber, where the robot arm is located inside the substrate transport chamber, and connecting a plurality of substrate stations to the substrate transport chamber, where the plurality of substrate stations comprise stations offset relative to a radial direction from an axis of connection of the robot drive to the substrate transport chamber and at least one station which is not offset relative to the radial direction from the axis of connection of the robot drive to the substrate transport chamber, where the robot drive and the robot aim are configured to move the end effectors to insert and remove substrates with the stations. The robot drive and the robot arm may be assembled to be able to move a first one of the end effector on the first set of forearms and a second one of the end effectors on the second set of forearms at a same time into the at least one station which is not offset relative to the radial direction from the axis of connection of the robot drive to the substrate transport chamber. The apparatus may comprise two of the offset substrate stations on a same side of the substrate transport chamber, where the robot drive and the robot arm are assembled to be able to respectively move a first one of the end effector on the first set of forearms and a second one of the end effectors on the second set of forearms at a same time into the two offset station. The method may further comprise the apparatus comprising two of the offset substrate stations on a same side of the substrate, transport chamber, where the robot drive and the robot arm are assembled to be able to move the first end effector into a first one of the two offset substrate stations while the second upper arm and second set of forearms do not move, and where the robot drive and the robot arm are configured to move the second end effector into a second one of the two offset substrate stations while the first upper arm and first set of forearms do not move.

An example method may comprise rotating a first coaxial drive shaft of a robot drive about a first axis in a first direction to rotate a first upper arm of a robot arm about the first axis; rotating a second coaxial drive shaft of the robot drive about the first axis, while the first coaxial drive shaft is being rotated, to move a first drive belt arrangement and a second drive belt arrangement and thereby rotate first and second forearms on the first upper arm; rotating a third coaxial drive shaft of the robot drive about the first axis in a second direction to rotate a second upper arm of a robot arm about the first axis; and rotating a forth coaxial drive shaft of the robot drive about the first axis to move a third drive belt arrangement and a fourth drive belt arrangement and thereby rotate third and fourth forearms on the second upper arm. The rotating of the forth coaxial drive shaft of the robot drive about the first axis may occur while the first and second coaxial drive shafts are being rotated.

An example method may comprise rotating a first coaxial drive shaft of a robot drive about a first axis in a first direction to rotate at least one upper arm of a robot arm about the first axis; rotating a second coaxial drive shaft of the robot drive about the first axis, while the first coaxial drive shaft is being rotated, to move at least a first drive belt arrangement to rotate a first forearm on the at least one upper arm and extend a first end effector on the first forearm from a retracted position towards an extended position; and rotating a third coaxial drive shaft of the robot drive about the first axis in a second direction to move at least a second drive belt arrangement to rotate a second forearm on the at least one upper arm and retain a second end effector on the second forearm at a retracted position while the first end effector is moved from the retracted position towards the extended position.

An example apparatus may comprise a robot drive comprising motors and coaxial drive shafts connected to the motors; a robot arm connected to the robot drive, where the robot arm comprises a first upper arm, a first forearm connected to the first upper arm, a second forearm connected to the first upper arm and end effectors connected to respective ones of the forearms, where the first upper arm is connected to a first one of the coaxial drive shafts, where the first forearm is mounted on the first upper arm and connected to a second one of the coaxial drive shafts by a first drive belt assembly, where the second forearm is mounted to the first upper arm and connected to the second coaxial drive shaft by a second drive belt assembly, and where the first drive belt assembly comprises a straight belt drive connected to the first forearm and the second drive belt assembly comprises a crossover belt drive connected to the second forearm.

An example method may comprise calculating a one dimensional joint space trajectory profile in a normalized path variable for a robot arm and applying the joint space trajectory profile to a desired path expressed in terms of included angle from a start point of an end effector (or substrate on the end effector) on the robot arm to an end point of the end effector (or substrate on the end effector); calculating a corresponding trajectory in radial coordinate based upon the joint space trajectory profile in the included angle;, calculating a corresponding angular coordinate of the payload center, based on the calculated radial coordinate, so that a path of a payload center follows a straight line in Cartesian space between the start point and end point; and using a modified formulation of inverse kinematics, converting the desired payload center expressed in cylindrical coordinates supplemented with the desired included angle and its corresponding angular velocity and acceleration into the desired joint positions, velocities, and accelerations to form motion setpoints for the robot arm, and then controlling motors of the robot drive to move the robot arm based upon the setpoints.

The method may check that the straight line path between the end points does not intersect the singularity. If an intersection is predicted, then the method may abort or not execute the move. The method may check if the straight line path between the end points passes within some threshold distance from the singularity. If the move does not approach near the singularity at any point, then the method may employ a standard Cartesian trajectory generation scheme. If the planned path is close to the singularity, the method may calculate the start and end positions of the move in terms of joint coordinates as noted above, specifically the included angle $\theta_1(t)-\theta_2(t)$ depending on which end effector is being commanded.

The joint space trajectory may be evaluated in a selected grid of points to determine if it violates any of the motion constraints expressed in Cartesian coordinates (i.e. the maximum linear velocity and acceleration of the payload). This test may employ direct (forward) kinematics formulae only, so it works regardless of the proximity of the singularity. In the case where a Cartesian motion constraint is violated, the method may calculate a time scale factor to slow the motion enough to meet all constraints.

In accordance with an example embodiment, an apparatus may be provided comprising at least one processor and at least one non-transitory memory including computer program code, the at least one memory and the computer program code configured to, with the at least one processor, cause the apparatus to: calculate a one dimensional joint space trajectory profile in a normalized path variable for a robot arm and applying the joint space trajectory profile to a desired path expressed in terms of included angle from a start point of an end effector (or substrate on the end effector) on the robot arm to an end point of the end effector (or substrate on the end effector); calculate a corresponding trajectory in radial coordinate based upon the joint space trajectory profile in the included angle; calculate a corresponding angular coordinate of the payload center, based on the calculated radial coordinate, so that a path of a payload center follows a straight line in Cartesian space between the start point and end point; and using a modified formulation of inverse kinematics, convert the desired payload center expressed in cylindrical coordinates supplemented with the desired included angle and its corresponding angular velocity and acceleration into the desired joint positions, velocities, and accelerations to form motion setpoints for the robot arm.

In accordance with an example embodiment a non-transitory program storage device readable by a machine may be provided, such as memory 19 shown in FIG. 1A for example, tangibly embodying a program of instructions executable by the machine for performing operations, the operations comprising: calculating a one dimensional joint space trajectory profile in a normalized path variable for a robot arm and applying the joint space trajectory profile to a desired path expressed in terms of included angle from a start point of an end effector (or substrate on the end effector) on the robot arm to an end point of the end effector (or substrate on the end effector); calculating a corresponding trajectory in radial coordinate based upon the joint space trajectory profile in the included angle;, calculating a corresponding angular coordinate of the payload center, based on the calculated radial coordinate, so that a path of a payload center follows a straight line in Cartesian space between the start point and end point; and using a modified formulation of inverse kinematics, converting the desired payload center expressed in cylindrical coordinates supplemented with the desired included angle and its corresponding angular velocity and acceleration into the desired joint positions, velocities, and accelerations to form motion setpoints for the robot arm.

Any combination of one or more computer readable medium(s) may be utilized as the memory. The computer readable medium may be a computer readable signal medium or a non-transitory computer readable storage medium. A non-transitory computer readable storage medium does not include propagating signals and may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Another example method may comprise rotating a first coaxial drive shaft of a robot drive about a first axis in a first direction to rotate at least one upper arm of a robot arm about the first axis; rotating a second coaxial drive shaft of the robot drive about the first axis, while the first coaxial drive shaft is being rotated, to move at least a first drive belt arrangement to rotate a first forearm on the at least one upper arm and extend a first end effector on the first forearm from a retracted position towards an extended position; and rotating a third coaxial drive shaft of the robot drive about the first axis in a second direction to move at least a second drive belt arrangement to rotate a second forearm on the at least one upper arm and retain a second end effector on the second forearm at a retracted position while the first end effector is moved from the retracted position towards the extended position.

An example method may comprise, based upon a desired path of a reference point from a start position of the reference point to an end position of the reference point, where the reference point is on an end effector on a robot arm, determine an included angle that corresponds to the start position and that corresponds to the end position, where the robot arm is connected to a robot drive having motors for moving the robot arm; calculating a trajectory in radial coordinates of the reference point on the end effector at least partially based upon the included angles; calculating corresponding angular coordinates of the reference point on the end effector, based on the calculated radial coordinates, so that the reference point on the end effector follows the desired path between the start position and the end position; using a modified formulation of inverse kinematics, converting the radial and angular coordinates of the reference point on the end effector supplemented with the included angles of the trajectory and corresponding angular velocity and acceleration of the end effector into desired joint positions, velocities, and accelerations to form motion setpoints for the robot arm; and controlling the motors of the robot drive to move the robot arm based upon the motion setpoints.

The method may further comprise determining that the desired path between the start position and the end position intersects a kinematic singularity of the robot arm, and not executing the move of the robot arm. The method may further comprise determining if the desired path between the start position and the end position passes within a predetermined threshold distance from a kinematic singularity of the robot arm and: when the move does not pass within the predetermined threshold distance from the kinematic singularity, using a Cartesian trajectory generation scheme to move the robot arm, and when the move does pass within the predetermined threshold distance from the kinematic singularity, not using the Cartesian trajectory generation scheme to move the robot arm. The method may further comprise evaluating the trajectory in a selected grid of points to determine if the trajectory violates at least one motion constraint expressed in Cartesian coordinates. The at least one motion constraint may comprise a maximum linear velocity and a maximum acceleration of the end effector. When the at least one motion constraint is determined to be violated, the method may further comprise calculating a time scale factor for moving at least one of the motors and slowing down the move of the robot arm to meet the at least one motion constraint. The reference point on the end effector may comprise a payload center of a substrate payload on the end effector. The method may further comprise calculating a one-dimensional trajectory profile in a normalized path variable for the end effector, and applying the one-dimensional trajectory profile to the desired path expressed in terms of the included angles from the start position of the reference point to the end position of the reference point on the end effector. A non-transitory program storage device readable by a machine, tangibly embodying a program of instructions executable by the machine for performing operations, the operations comprising the method as described above.

An example method may comprise determining by a controller a path of a reference point on an end effector of a robot arm between a start position and an end position of the reference point, where the robot arm is connected to a robot drive having motors for moving the robot arm, and where the controller comprises at least one processor and at least one non-transitory memory having computer code; the controller selecting a movement control mode from a plurality of different movement control modes, where the different movement control modes comprise: determining that the path between the start position and the end position intersects a kinematic singularity of the robot arm, and not executing a move of the robot arm with the path, determining that the path between the start position and the end position passes outside a predetermined threshold distance from the kinematic singularity of the robot arm, and using a Cartesian trajectory generation scheme to move the robot arm, and determining that the path between the start position and the end position passes within the predetermined threshold distance from the kinematic singularity of the robot arm, determine an included angle that corresponds to the start position and that corresponds to the end position, calculate the start position and the end position in terms of joint coordinates, calculate a trajectory from the start position to the end position in radial coordinates at least partially based upon the included angles, calculate a corresponding angular coordinate of the reference point so that the reference point follows the path in Cartesian space between the start position and the end position; and the controller controlling movement of the motors of the robot arm based upon the selected control mode.

The method may further comprise using a modified formulation of inverse kinematics, converting the radial and angular coordinates of the reference point, supplemented with the included angles and corresponding angular velocity and acceleration of the reference point, into the joint coordinates, the angular velocities, and the accelerations to form motion setpoints for the robot arm; and controlling the motors of the robot drive to move the robot arm based upon the motion setpoints. The method may further comprise evaluating the trajectory in a selected grid of points to determine if the trajectory violates at least one motion constraint expressed in Cartesian coordinates. The at least one motion constraint may comprise a maximum linear velocity and a maximum acceleration of the reference point. When the at least one motion constraint is determined to be violated, the method may further comprise calculating a time scale factor for moving at least one of the motors and slowing down the movement of the robot arm to meet the at least one motion constraint. A non-transitory program storage device readable by a machine, tangibly embodying a program of instructions executable by the machine for performing operations, the operations comprising the method as described above.

An example embodiment may be provided in an apparatus comprising at least one processor; and at least one non-transitory memory including computer program code, the at least one memory and the computer program code configured to, with the at least one processor, cause the apparatus to: determine by the at least one processor and the computer program code a path of a reference point on an end effector of a robot arm between a start position of the reference point and an end position of the reference point with trajectory, where the robot arm is connected to a robot drive having motors for moving the robot arm; select by the at least one processor and the computer program code a movement control mode from a plurality of different movement control modes, where the plurality of different movement control modes comprises: determining that the path between the start position and the end position intersects a kinematic singularity of the robot arm and not executing a move of the robot arm with the path, determining that the path between the start position and the end position passes outside a predetermined threshold distance from the kinematic singularity of the robot arm, and using a Cartesian trajectory generation scheme to move the robot arm, and determining that the path between the start position and the end position passes within the predetermined threshold distance from the kinematic singularity of the robot arm, determine an included angle that corresponds to the start position and that corresponds to the end position, and calculate the start position and the end position in terms of joint coordinates, calculate the trajectory of the reference point in radial coordinates at least partially based upon the included angles, calculate a corresponding angular coordinates of the reference point on the end effector so that the reference point follows the path in Cartesian space between the start position and the end position of the move.

The at least one processor and the computer program code may be configured to evaluate the trajectory in a selected grid of points to determine if the trajectory violates at least one motion constraint expressed in Cartesian coordinates. The at least one motion constraint may comprise a maximum linear velocity and a maximum acceleration of the reference point. When the at least one motion constraint is determined to be violated, the at least one processor and the computer program code may be configured to calculate a time scale factor for moving at least one of the motors and slowing down the movement of the robot arm to meet the at least one motion constraint.

In the above description, a straight line path is mentioned between the start position and the end position. However, this is merely an example. In alternate examples, the path may not be a straight line, or may only partially be a straight line. In addition, the above description mentions calculating a one-dimensional trajectory profile in a normalized path variable for an end effector on a robot arm. However, this is also merely an example. In alternate examples the one-dimensional motion profile, calculated in terms of the included angle from the included angle that corresponds to the start position to the included angle that corresponds to the end position, may be calculated using any suitable type of method; not limited to calculating a one-dimensional trajectory profile in a normalized path variable.

In one type of example method, the method may comprises the following steps:

1. This is what is given: the start position of the reference point on the robot end-effector, and the end position of the reference point on the robot end-effector. This defines where the robot starts (from a retracted position) and where the robot ends (for a substrate place/pick operation).
2. In addition, there are constraints that limit the speed, acceleration and jerk of the motion of the reference point on the robot end-effector, and constraints that limit the speed, acceleration and jerk of the included angle.
3. Connect the start position of the reference point on the robot end-effector and the end position of the reference point on the robot end-effector in a path, such as by a straight line for example.
4. If the straight line calculated in step 3 goes through a cylinder of kinematic singularity, do not execute the move, and stop here.
5. If the straight line calculated in step 3 is outside of the cylinder of kinematic singularity, and does not get closer to the cylinder of kinematic singularity than a predefined distance, calculate the trajectory of the reference point in Cartesian space, and ignore the steps below.
6. If the conditions described in steps 4 and 5 are not met, proceed along the following steps:
7. Using inverse kinematic equations, determine the included angle that corresponds to the starting position and the included angle that corresponds to the end position.
8. Calculate one-dimensional motion profile in terms of the included angle from the included angle that corresponds to the start position to the included angle that corresponds to the end position, which were determined in step 3. This calculation utilizes the constraints on the speed, acceleration and jerk of the included angle introduced in step 2.
9. Convert the profile expressed in terms of the included angle from step 8 to motion profile in terms of the radial coordinate (this is the radial distance to the reference point on the robot end-effector as typically used in a polar or cylindrical coordinate system).
10. Utilizing the straight line calculated in step 3 and the profile expressed in terms of the radial coordinate from step 9, calculate motion profile in terms of the angular coordinate (this is the angle of a radial line to the reference point on the robot end-effector as typically used in a polar or cylindrical coordinate system).
11. Convert the motion profiles in terms of the radial and angular coordinates to a motion profile expressed in terms of Cartesian coordinates. This may merely comprise use of a well-known conversion of position, speed and acceleration from a polar (or cylindrical) coordinate system to Cartesian coordinate system.
12. Check whether the motion profile calculated in step 11 violates any constraints that limit the speed, acceleration and jerk of the motion of the reference point on the robot end-effector, which were introduced in step 2. If it does not, execute the move and ignore step 13.
13. If the check in step 12 indicates violation, scale the motion profile in terms of Cartesian coordinates so that none of the constraints that limit the speed, acceleration and jerk of the motion of the reference point on the robot end-effector are violated. This can be conveniently done by stretching the time of the robot movement/move.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
a robot drive comprising motors and coaxial drive shafts connected to the motors;
a robot arm connected to the robot drive, where the robot arm comprises two upper arms, a first set of forearms connected to a first one of the upper arms, a second set of forearms connected to a second one of the upper arms and end effectors connected to respective ones of the forearms, where the first and second upper arms are connected to respective first and second ones of the coaxial drive shafts, where the first set of the forearms is mounted on the first upper arm and connected to a third one of the coaxial drive shafts by respective first and second drive belt assemblies, where the second set of the forearms is mounted to the second upper arm and connected to a fourth one of the coaxial drive shafts by respective third and fourth drive belt assemblies.

2. An apparatus as in claim 1 where the first drive belt assembly comprises a straight belt drive connected to a first one of the first set of forearms and the second drive belt assembly comprises a crossover belt drive connected to a second one of the first set of forearms.

3. An apparatus as in claim 1 where the first set of forearms are connected to the first upper arm at a common axis or rotation.

4. An apparatus as in claim 1 where the first and second drive belt assemblies each comprises at least one set of pulleys and a drive belt between the pulleys, and where at least one of the pulleys is a non-circular pulley.

5. An apparatus as in claim 1 further comprising a controller connected to the robot drive, where the controller comprises at least one processor and at least one memory comprising computer code for controlling the motors.

6. An apparatus as in claim 1 further comprising a substrate transport chamber having the robot drive connected thereto, where the robot arm is located inside the substrate transport chamber, and a plurality of substrate stations connected to the substrate transport chamber, where the plurality of substrate stations comprise stations offset relative to a radial direction from an axis of connection of the robot drive to the substrate transport chamber and at least one station which is not offset relative to the radial direction from the axis of connection of the robot drive to the substrate transport chamber, where the robot drive and the robot arm are configured to move the end effectors to insert and remove substrates with the stations.

7. An apparatus as in claim 6 where the robot drive and the robot arm are configured to move a first one of the end effector on the first set of forearms and a second one of the end effectors on the second set of forearms at a same time into the at least one station which is not offset relative to the radial direction from the axis of connection of the robot drive to the substrate transport chamber.

8. An apparatus as in claim 6 where the apparatus comprises two of the offset substrate stations on a same side of the substrate transport chamber, the robot drive and the robot arm are configured to respectively move a first one of the end effector on the first set of forearms and a second one of the end effectors on the second set of forearms at a same time into the two offset station.

9. An apparatus as in claim 6 where the apparatus comprises two of the offset substrate stations on a same side of the substrate transport chamber, where the robot drive and the robot arm are configured to move the first end effector into a first one of the two offset substrate stations while the second upper arm and second set of forearms do not move, and where the robot drive and the robot arm are configured to move the second end effector into a second one of the two offset substrate stations while the first upper arm and first set of forearms do not move.

10. A method comprising:
connecting a first upper arm to a first coaxial drive shaft of a robot drive;
connecting a second upper arm to a second coaxial drive shaft of the robot drive;
connecting a first set of forearms to the first upper arm, where a first drive belt arrangement connects a first one of the forearms of the first set of forearms to a third coaxial drive shaft of the robot drive, and where a second drive belt arrangement connects a second one of the forearms of the first set of forearms to the third coaxial drive shaft of the robot drive;
connecting a second set of forearms to the second upper arm, where a third drive belt arrangement connects a first one of the forearms of the second set of forearms to a fourth coaxial drive shaft of the robot drive, and where a fourth drive belt arrangement connects a second one of the forearms of the second set of forearms to the fourth coaxial drive shaft of the robot drive; and
connecting respective end effectors to the forearms.

11. A method as in claim 10 where the first set of forearms are connected to the first upper arm at a common axis or rotation.

12. A method as in claim 10 where the first drive belt arrangement comprises at least one non-circular pulley to move a drive belt of the first drive belt arrangement at a variable rate relative to rotation of the third coaxial drive shaft. . . .

13. A method as in claim 10 where the first and second drive belt assemblies, including at least one non-circular pulley of the first and second drive belt assemblies, are connected to be able to move the first set of forearms without relative rotation therebetween when the first upper arm is rotated in a first direction, and to move the first set of forearms with relative rotation therebetween when the first upper arm is rotated in a second direction opposite the first direction.

14. A method as in claim 10 further comprising coupling a controller to the robot drive, where the controller comprises at least one processor and at least one memory comprising computer code for controlling motors of the robot drive.

15. A method as in claim 10 further comprising connecting the robot drive to a substrate transport chamber, where the robot arm is located inside the substrate transport chamber, and connecting a plurality of substrate stations to the substrate transport chamber, where the plurality of substrate stations comprise stations offset relative to a radial direction from an axis of connection of the robot drive to the substrate transport chamber and at least one station which is not offset relative to the radial direction from the axis of connection of the robot drive to the substrate transport chamber, where the robot drive and the robot arm are configured to move the end effectors to insert and remove substrates with the stations.

16. A method as in claim 15 where the robot drive and the robot arm are assembled to be able to move a first one of the end effector on the first set of forearms and a second one of the end effectors on the second set of forearms at a same time into the at least one station which is not offset relative to the radial direction from the axis of connection of the robot drive to the substrate transport chamber.

17. A method as in claim 15 where the apparatus comprises two of the offset substrate stations on a same side of the substrate transport chamber, where the robot drive and the robot arm are assembled to be able to respectively move a first one of the end effector on the first set of forearms and a second one of the end effectors on the second set of forearms at a same time into the two offset station.

18. A method as in claim 15 where the apparatus comprises two of the offset substrate stations on a same side of the substrate transport chamber, where the robot drive and the robot arm are assembled to be able to move the first end effector into a first one of the two offset substrate stations while the second upper arm and second set of forearms do not move, and where the robot drive and the robot arm are configured to move the second end effector into a second one of the two offset substrate stations while the first upper arm and first set of forearms do not move.

19. A method comprising:
rotating a first coaxial drive shaft of a robot drive about a first axis in a first direction to rotate a first upper arm of a robot arm about the first axis;
rotating a second coaxial drive shaft of the robot drive about the first axis, while the first coaxial drive shaft is being rotated, to move a first drive belt arrangement and a second drive belt arrangement and thereby rotate first and second forearms on the first upper arm;
rotating a third coaxial drive shaft of the robot drive about the first axis in a second direction to rotate a second upper arm of the robot arm about the first axis; and
rotating a forth coaxial drive shaft of the robot drive about the first axis to move a third drive belt arrangement and a fourth drive belt arrangement and thereby rotate third and fourth forearms on the second upper arm.

20. A method as in claim 19 where the rotating of the forth coaxial drive shaft of the robot drive about the first axis occurs while the first and second coaxial drive shafts are being rotated.

* * * * *